United States Patent
Ichikawa et al.

(10) Patent No.: US 8,456,908 B2
(45) Date of Patent: Jun. 4, 2013

(54) MULTI-DOT FLASH MEMORY AND METHOD OF MANUFACTURING THE SAME

(75) Inventors: Takashi Ichikawa, Saitama (JP);
Hiroshi Watanabe, Yokohama (JP);
Kenji Kawabata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 859 days.

(21) Appl. No.: 12/563,729

(22) Filed: Sep. 21, 2009

(65) Prior Publication Data

US 2010/0214840 A1 Aug. 26, 2010

(30) Foreign Application Priority Data

Feb. 25, 2009 (JP) .................................. 2009-042548

(51) Int. Cl.
*G11C 5/02* (2006.01)
*G11C 5/06* (2006.01)
*G11C 16/04* (2006.01)
*G11C 16/06* (2006.01)
*G11C 16/10* (2006.01)
*G11C 16/08* (2006.01)
*G11C 16/24* (2006.01)
*H01L 29/788* (2006.01)

(52) U.S. Cl.
USPC ............ 365/185.05; 365/185.16; 365/185.17; 365/185.18; 365/51; 365/63; 365/72; 438/257; 257/E21.409; 257/315; 257/316; 257/317; 257/320

(58) Field of Classification Search
USPC ............. 365/185.17, 185.18, 185.05, 185.16, 365/51, 63, 72; 257/E21.409, 315, 316, 317, 257/320; 438/257
See application file for complete search history.

(56) References Cited

U.S. PATENT DOCUMENTS

| 6,541,815 B1* | 4/2003 | Mandelman et al. ......... 257/315 |
| 6,693,009 B1* | 2/2004 | Kim et al. ..................... 438/257 |
| 2003/0156460 A1* | 8/2003 | Wu ........................... 365/185.33 |
| 2006/0003528 A1* | 1/2006 | Forbes .......................... 438/257 |

(Continued)

FOREIGN PATENT DOCUMENTS

| JP | 2-218158 | 8/1990 |
| JP | 7-30110 | 1/1995 |

(Continued)

OTHER PUBLICATIONS

Office Action issued Aug. 2, 2011 in Japan Application No. 2009-042548 (With English Translation).

(Continued)

*Primary Examiner* — J. H. Hur
(74) *Attorney, Agent, or Firm* — Oblon, Spivak, McClelland, Maier & Neustadt, L.L.P.

(57) ABSTRACT

A multi-dot flash memory includes active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, and bit lines provided between the floating gates, which extend to the second direction. Each of the floating gates has two side surfaces in the first direction, shapes of the two side surfaces are different from each other, and shapes of the facing surfaces of the floating gates which are adjacent to each other in the first direction are symmetrical.

18 Claims, 58 Drawing Sheets

U.S. PATENT DOCUMENTS

| | | |
|---|---|---|
| 2008/0272425 A1 | 11/2008 | Kawabata |
| 2009/0096004 A1 | 4/2009 | Kawabata et al. |
| 2011/0032762 A1 | 2/2011 | Watanabe et al. |

FOREIGN PATENT DOCUMENTS

| | | |
|---|---|---|
| JP | 8-78544 | 3/1996 |
| JP | 9-17890 | 1/1997 |
| JP | 2003-243615 | 8/2003 |
| JP | 2004-31448 | 1/2004 |
| JP | 2004-158520 | 6/2004 |
| JP | 2004-241781 | 8/2004 |
| JP | 2005-175224 | 6/2005 |
| JP | 2005-252266 | 9/2005 |
| JP | 2006-32970 | 2/2006 |
| JP | 2006-140482 | 6/2006 |
| JP | 2006-269660 | 10/2006 |
| JP | 2007-12931 | 1/2007 |
| JP | 2007-67653 | 3/2007 |
| JP | 2007-73957 | 3/2007 |
| JP | 2008-160099 | 7/2008 |
| JP | 2010-501119 | 1/2010 |
| WO | WO 2009/107241 A1 | 9/2009 |

OTHER PUBLICATIONS

Japanese Office Action issued Apr. 5, 2011, in Patent Application No. 2006-053414 (with English-language translation).

Ryuji Ohba, et al., "Silicon Nitride Trap Memory with Double Tunnel Junction", Symposium on VLSI Technology Digest of Technical Papers, IEEE Xplore, 2003, 35-36.

Katsuhiko Nishiguchi, et al., "Multilevel memory using an electrically formed single-electron box", Applied Physics Letters, vol. 85, No. 7, Aug. 16, 2004, pp. 1277-1279.

Touichiro Goto, et al., "Molecular-Mediated Single-Electron Devices Operating at Room Temperature", Japanese Journal of Applied Physics, vol. 45, No. 5A, 2006, pp. 4285-4289.

U.S. Appl. No. 12/765,478, filed Apr. 22, 2010, Ichikawa, et al.

Fujio Masuoka, et al. "Flash Memory Technology Handbook", Science Forum, Publish on Demand, Aug. 1993, pp. 2-7 and 199-205.

Andrea Ghetti, et al., "3D Simulation Study of gate Coupling and Gate Cross-Interference in Advanced Floating Gate Non-Volatile Memories", Solid-State Electronics, vol. 49, Nov. 2005, pp. 1805-1812.

Robert H. Dennard, et al., "Design of Ion-Implanted MOSFET's With Very Small Physical Dimensions", IEEE Journal of Solid-State Circuits, vol. sc-9, No. 5, Oct. 1974, pp. 256-268.

Sony CX-PAL, "Device Having Traveled in Space, Low-Cost Embedded Non-Volatile Memory Device Technology "MONOS" (metal-Oxide—Nitride-Oxide Semiconductor)", vol. 52, 4 pages.

M. Shima, et al., "Tetrahedral Shaped Recess Channel HEMT with a Floating Quantum Dot Gate", IEDM Teach. Dig., Dec. 1998, pp. 437-440.

\* cited by examiner

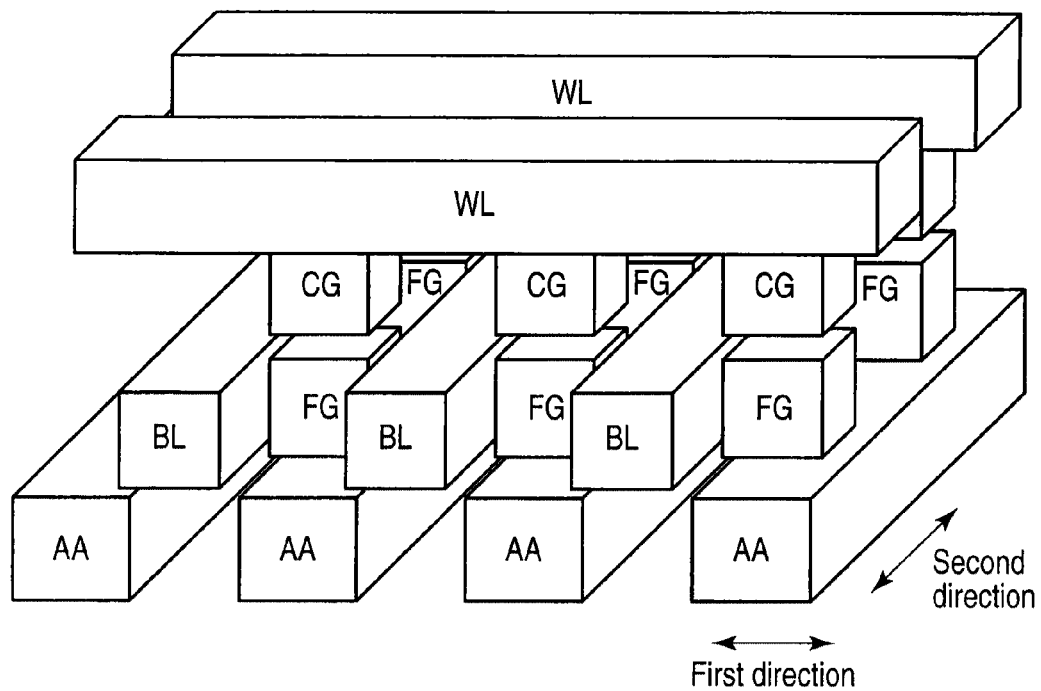
F I G. 1
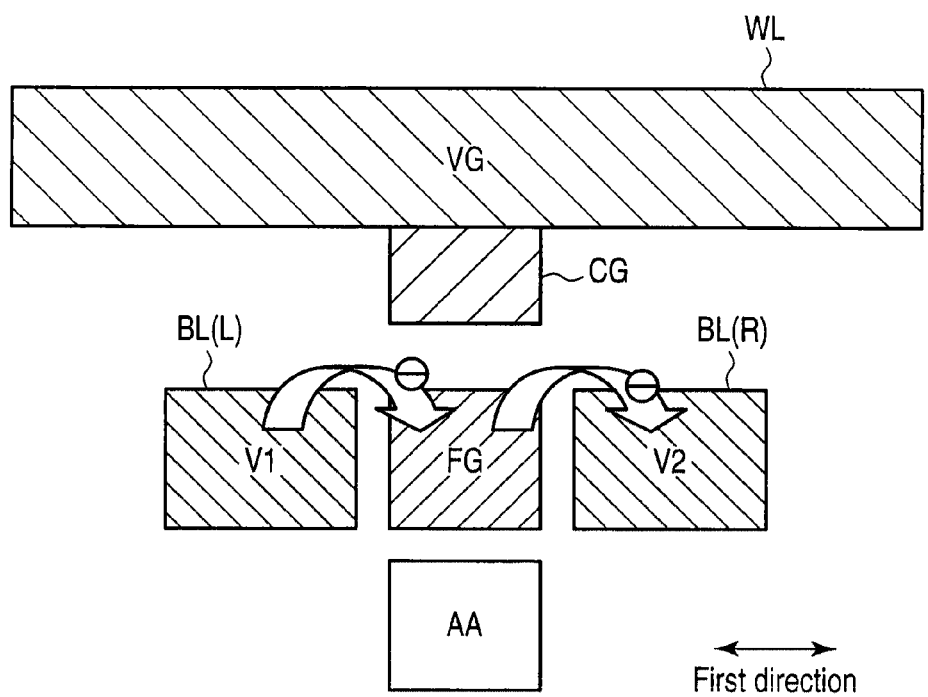
F I G. 2

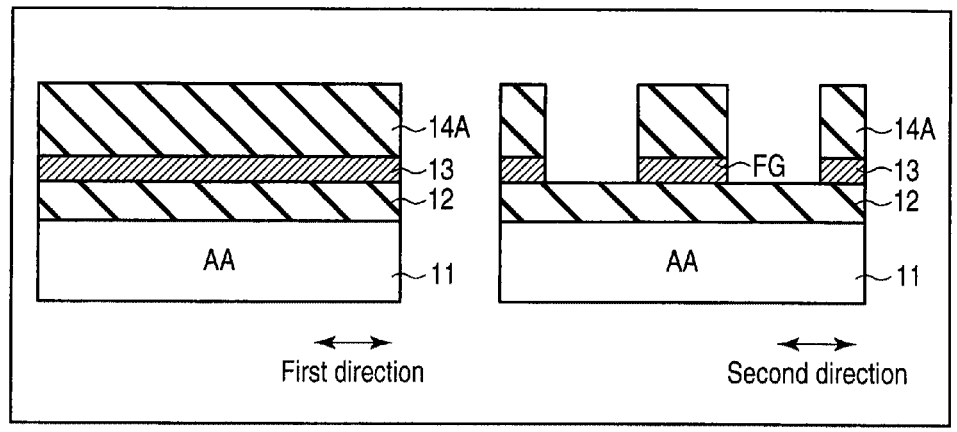
F I G. 3
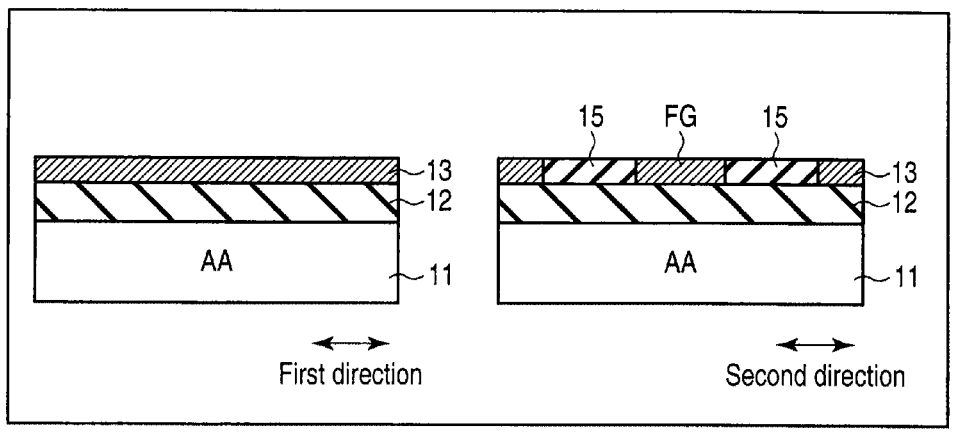
F I G. 4

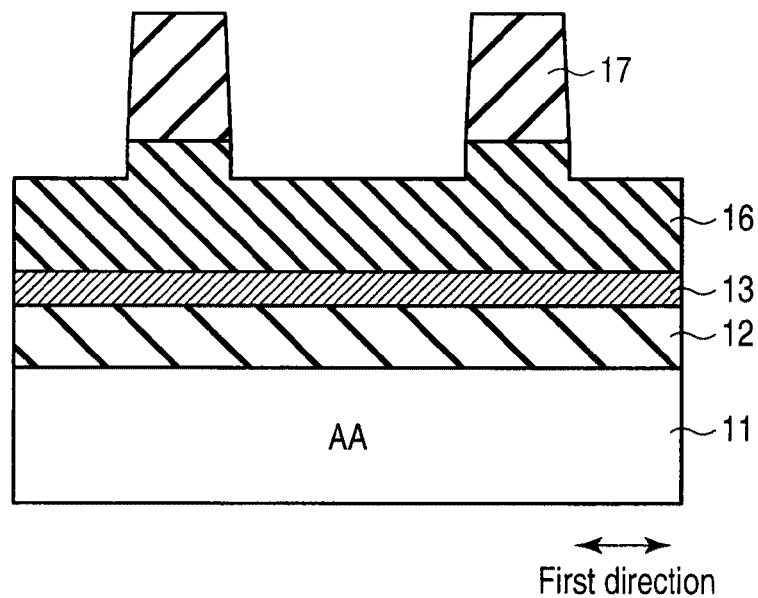
F I G. 7
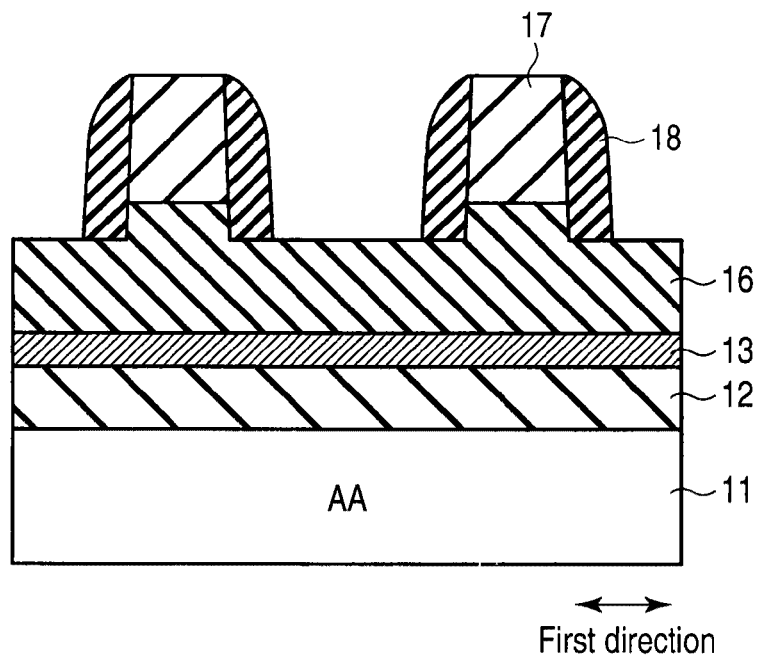
F I G. 8

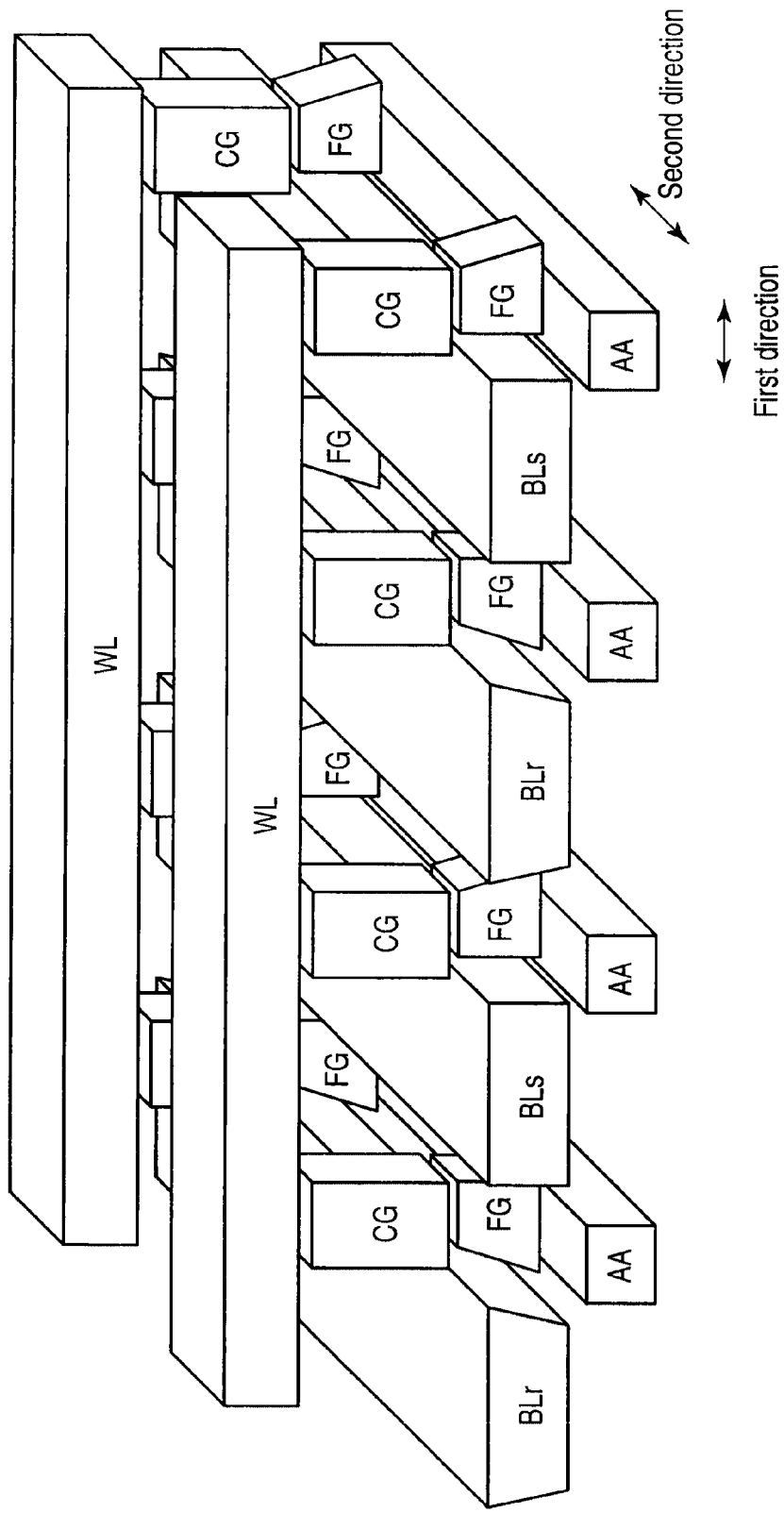
F I G. 13

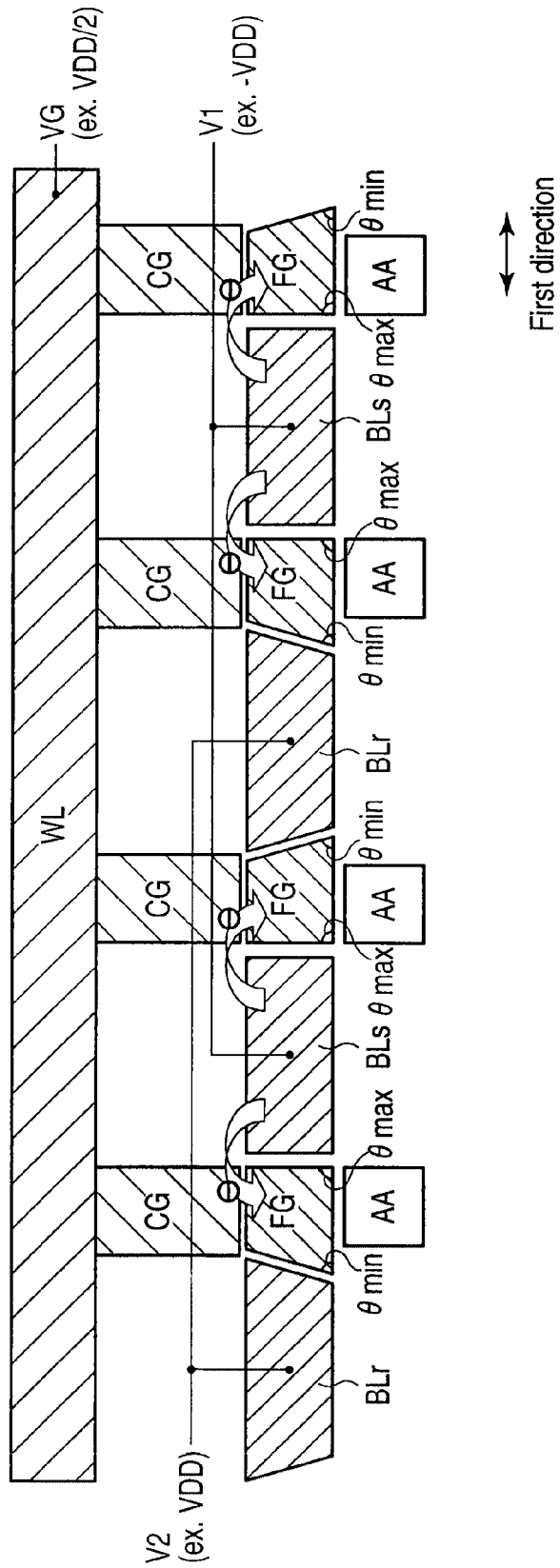
F I G. 14

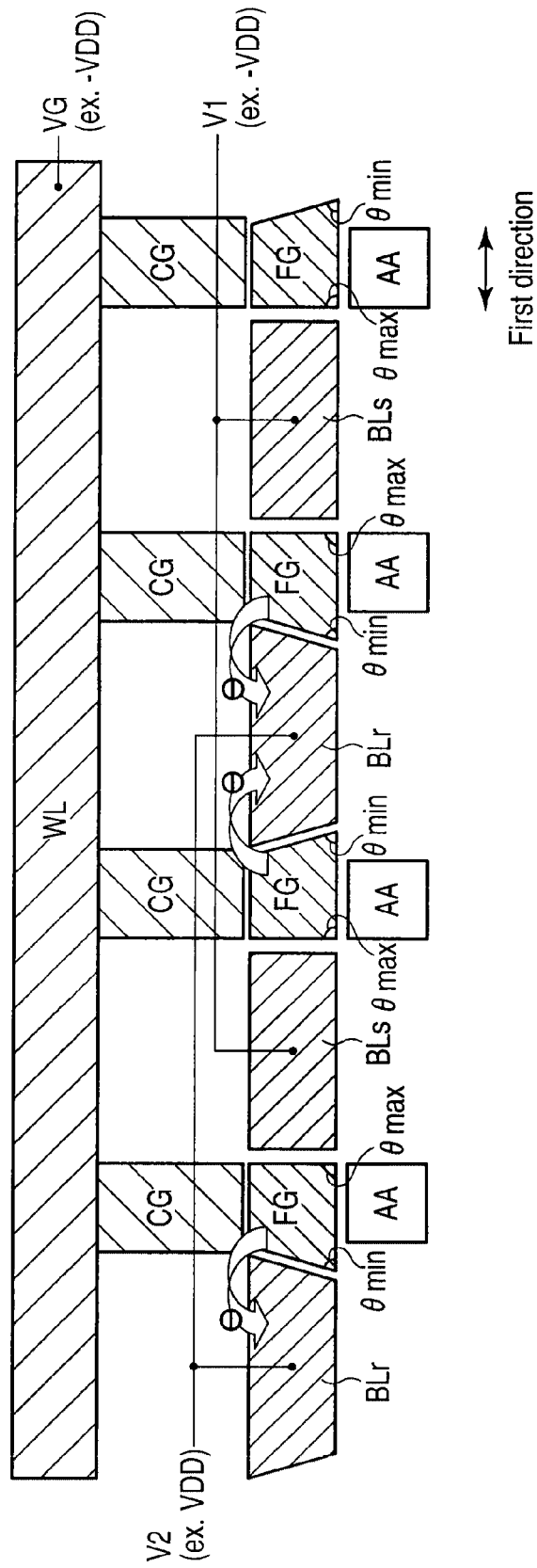
F I G. 15

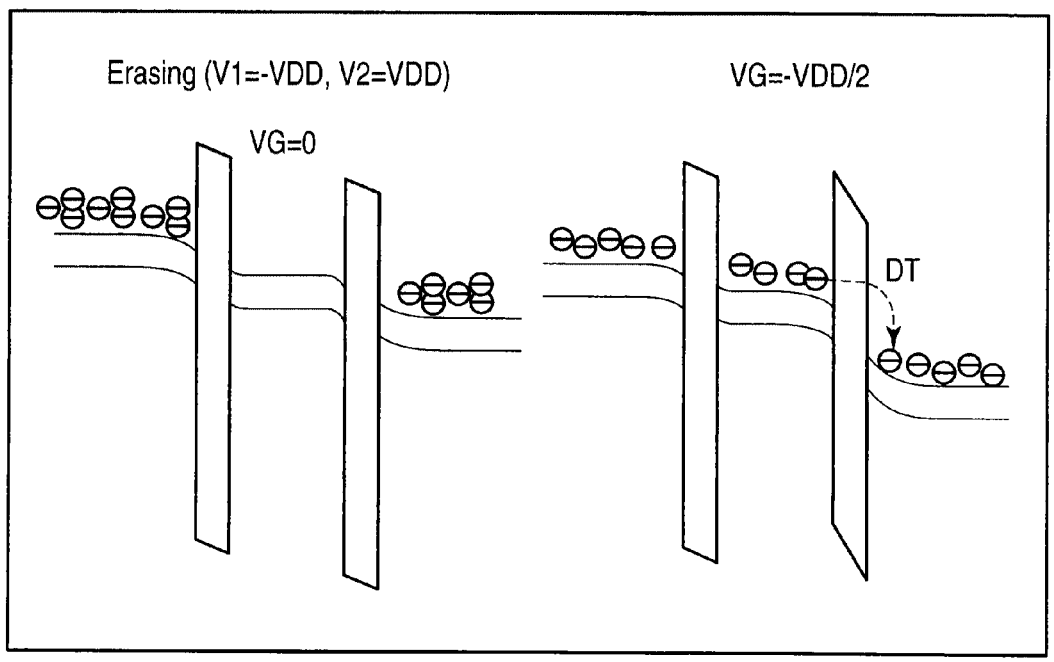
F I G. 2 0

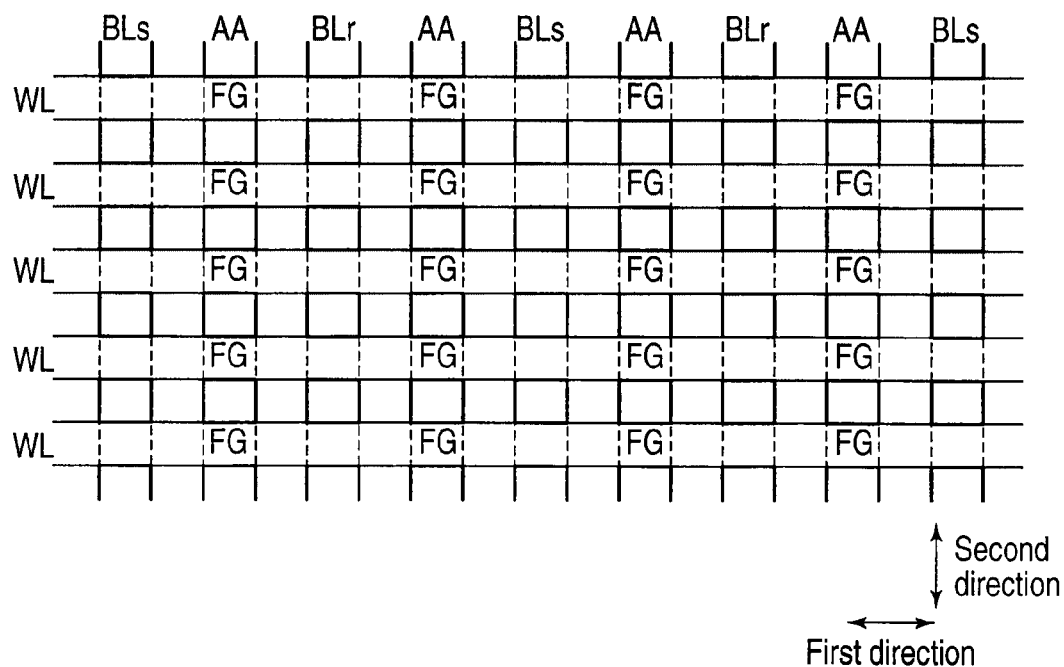
F I G. 2 3

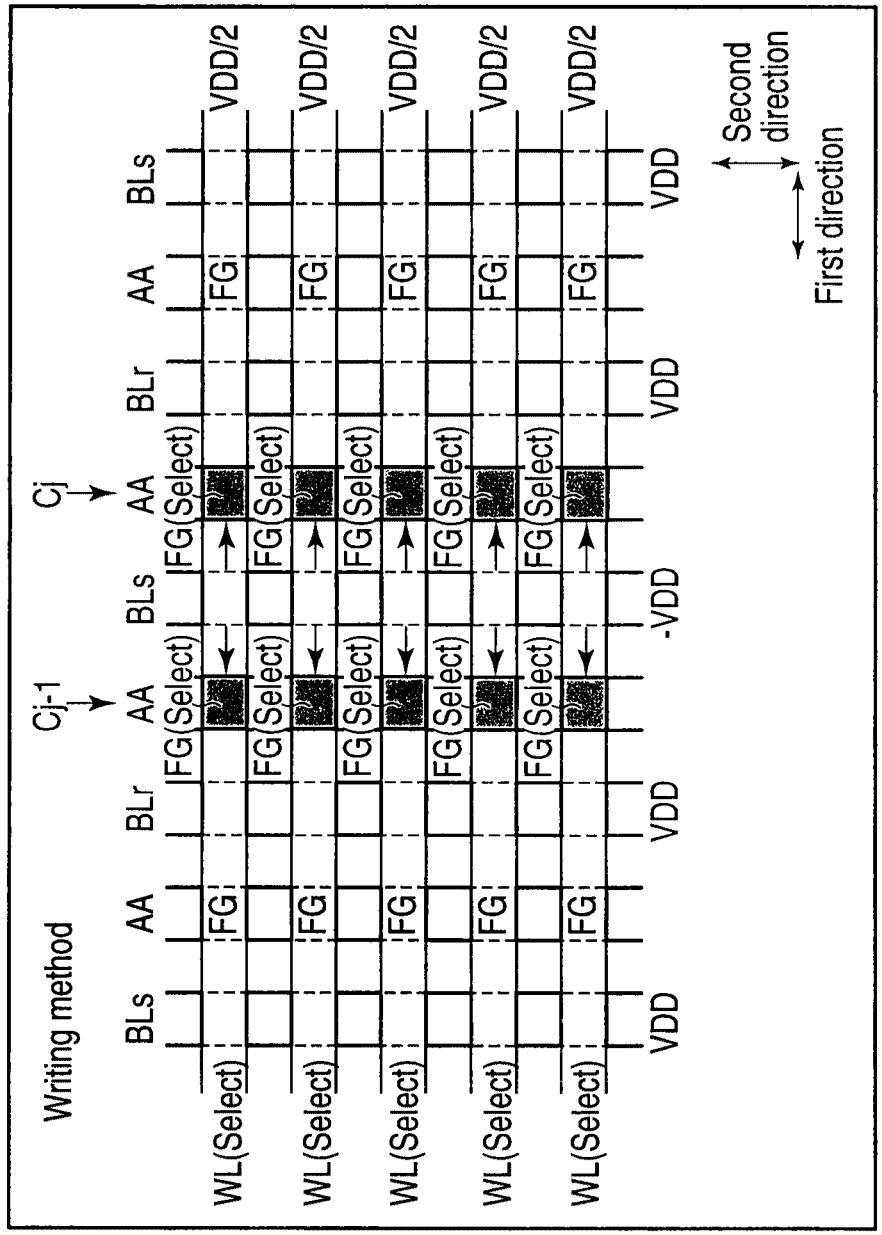
F I G. 29

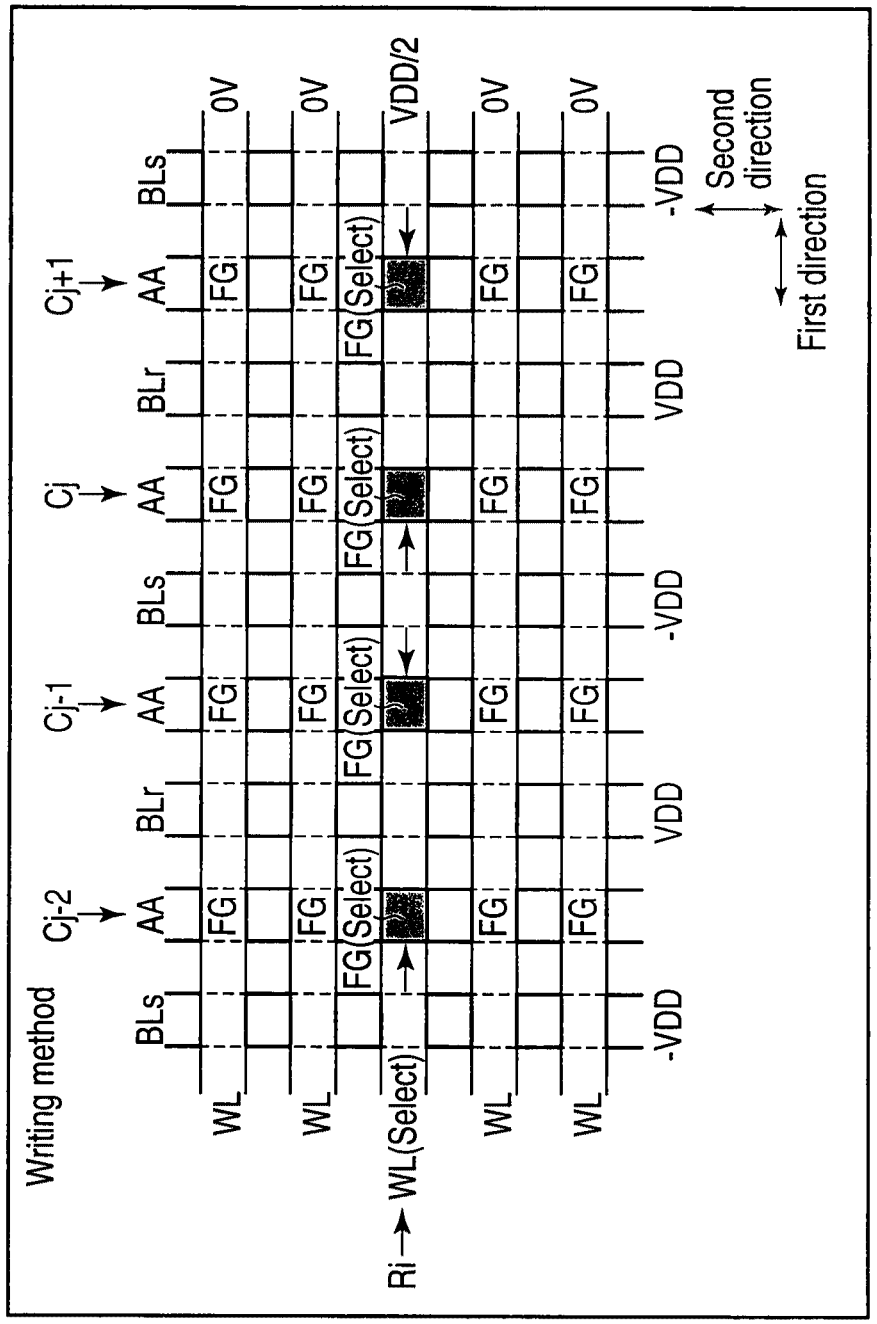
F I G. 30

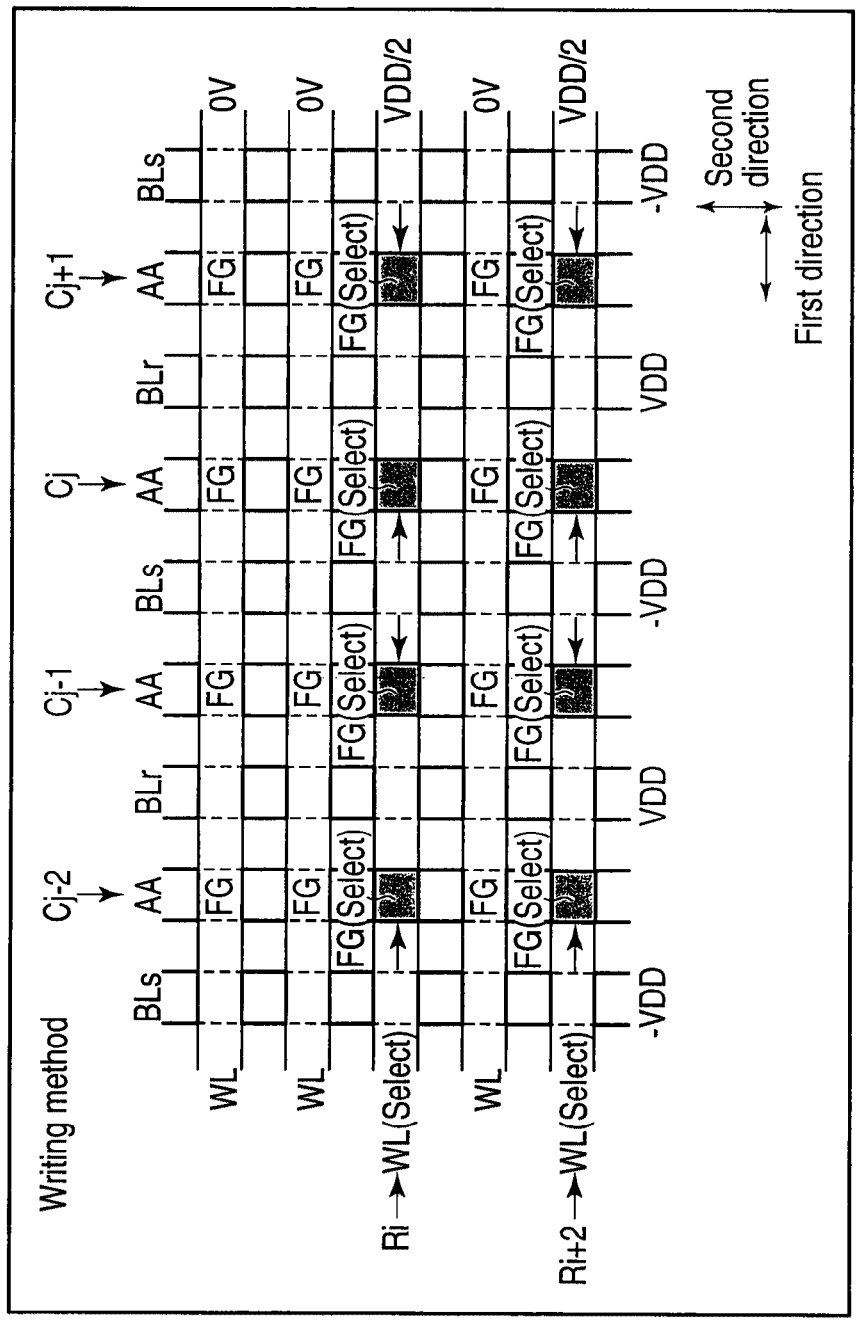
F I G. 31

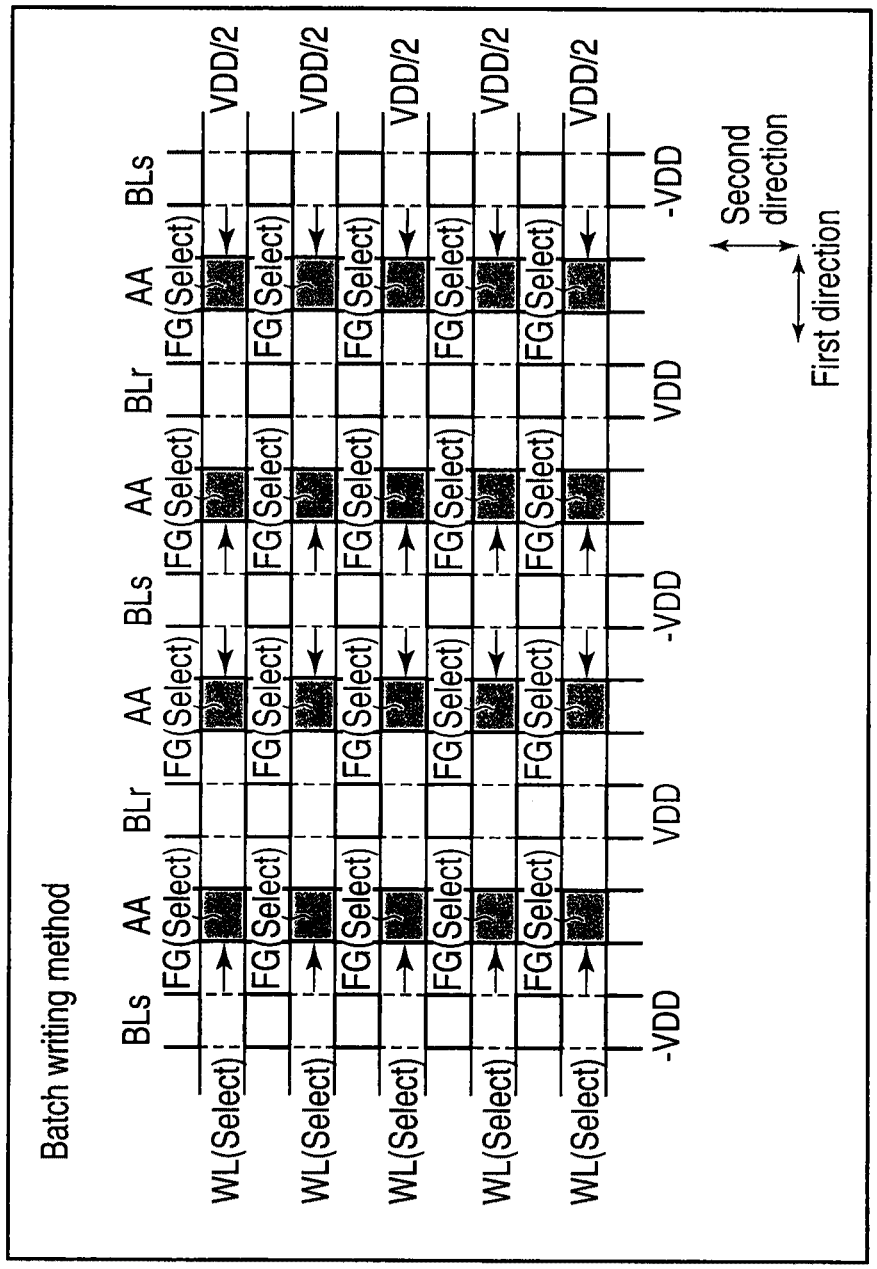
F I G. 32

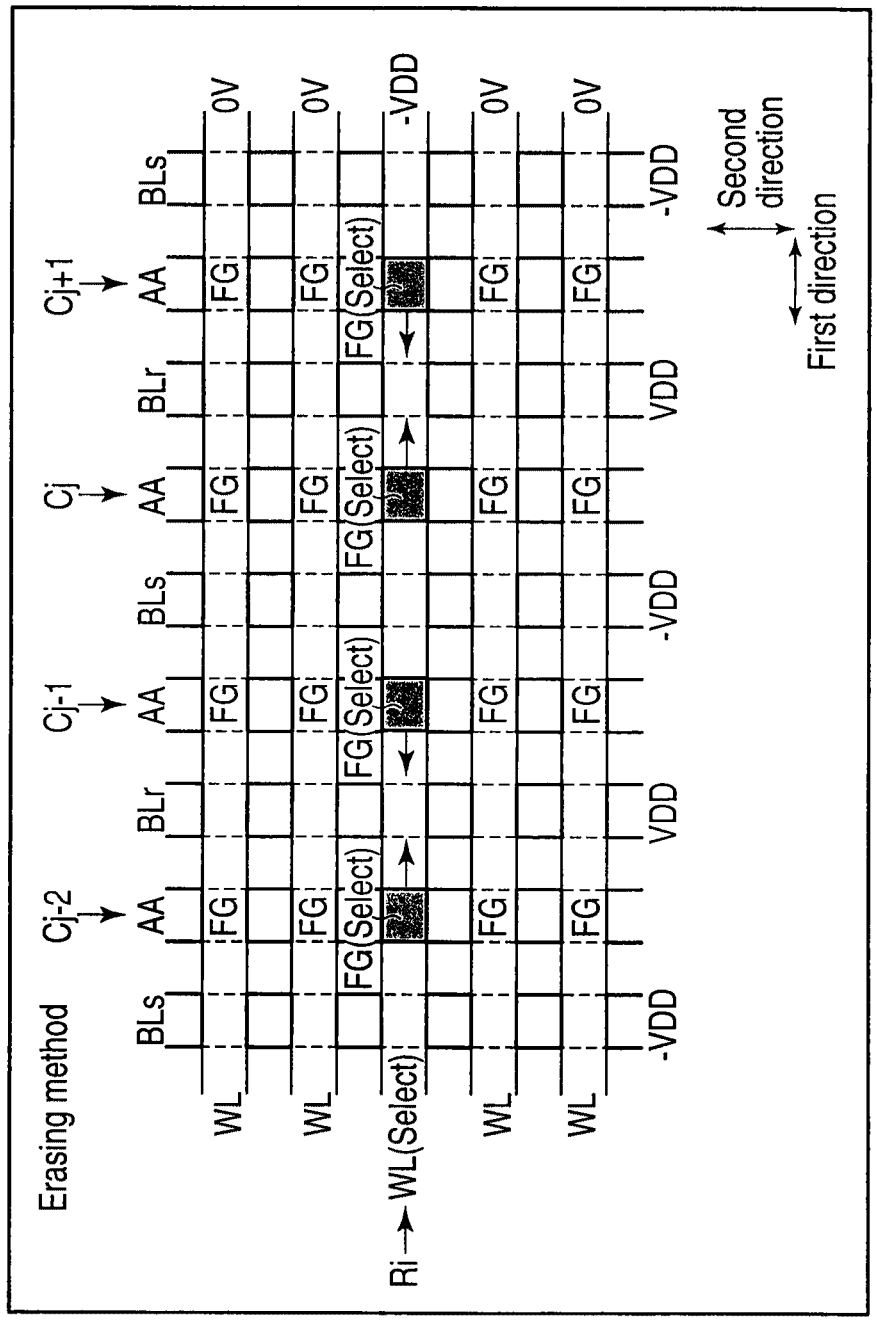
F I G. 39

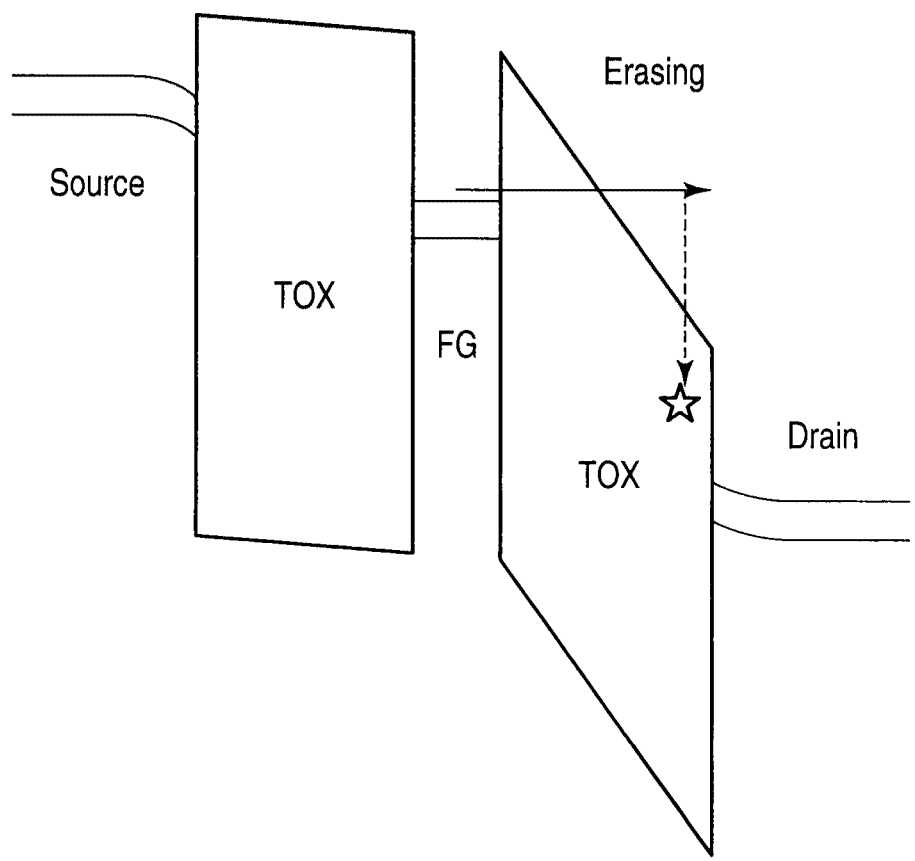
F I G. 46

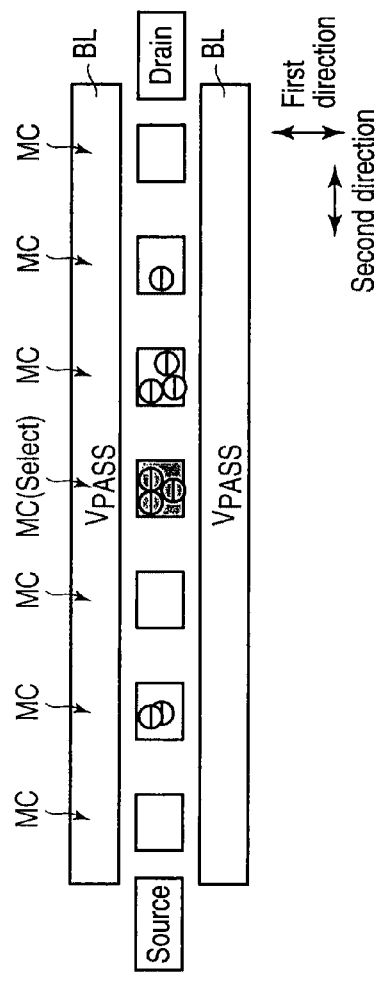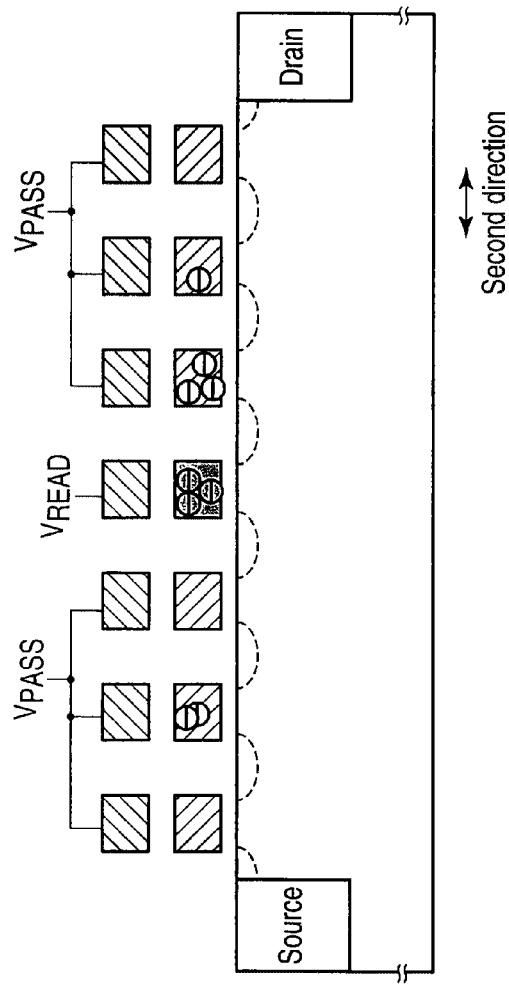
FIG. 50A
FIG. 50B

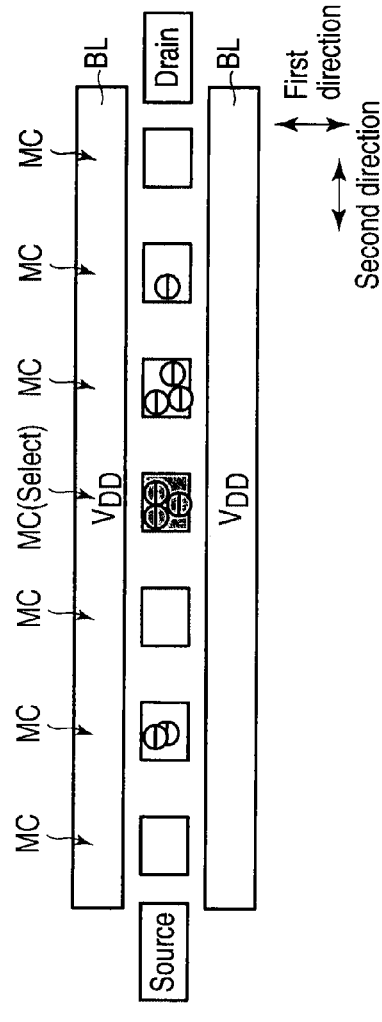
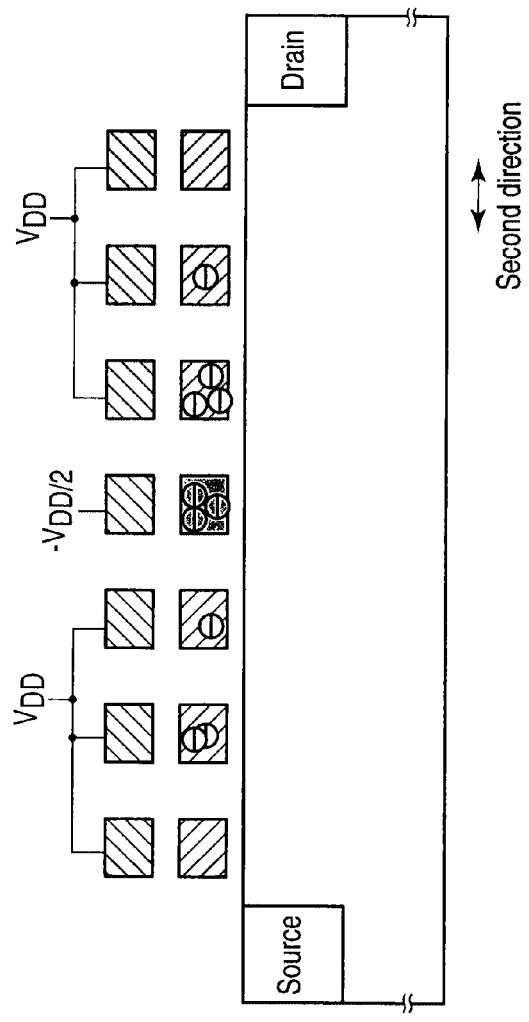
F I G. 52A
F I G. 52B

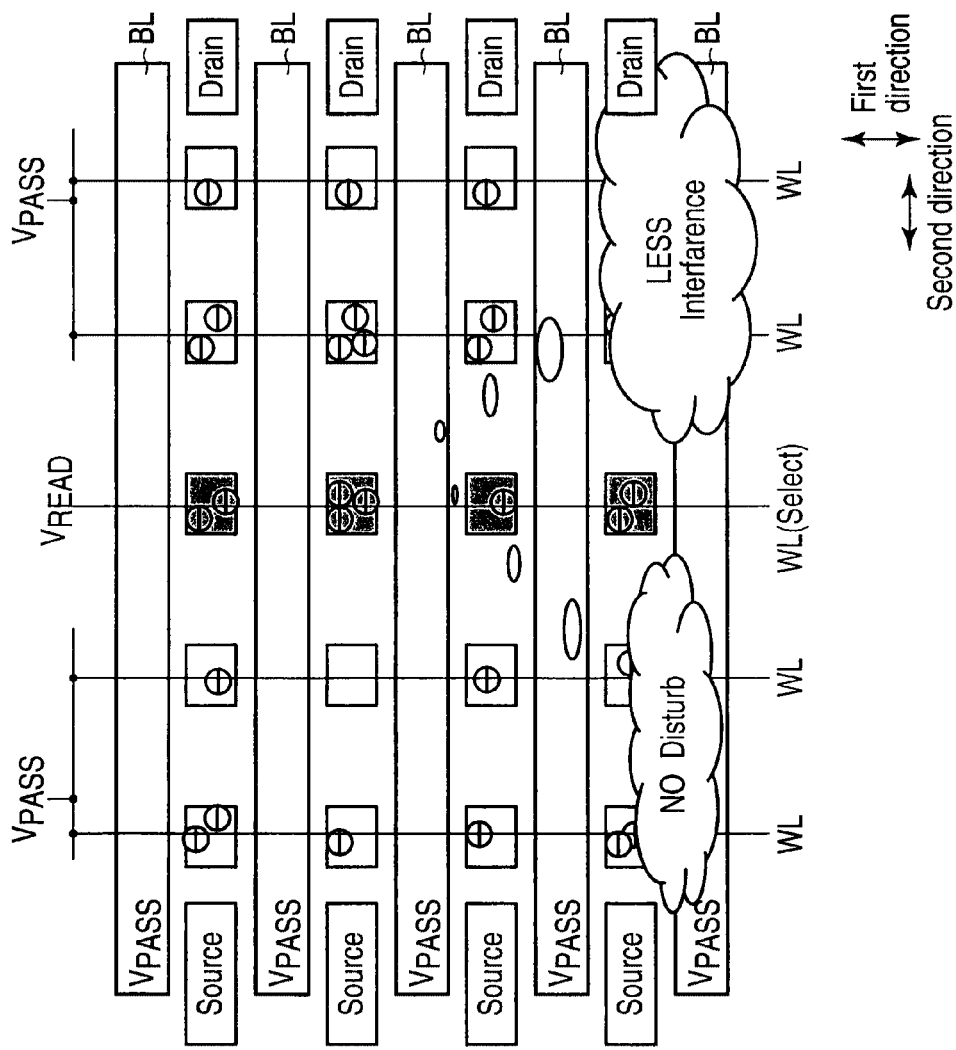
F I G. 53

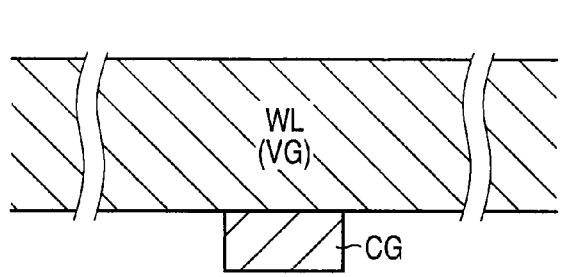
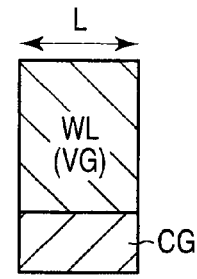
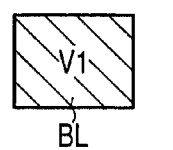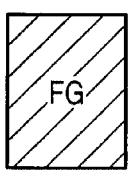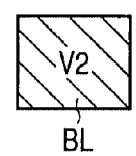
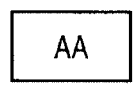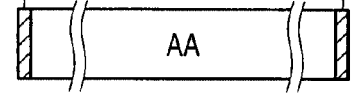
F I G. 5 4 A    F I G. 5 4 B
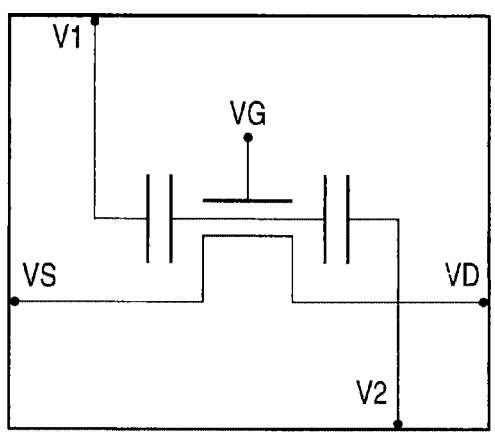
F I G. 5 5

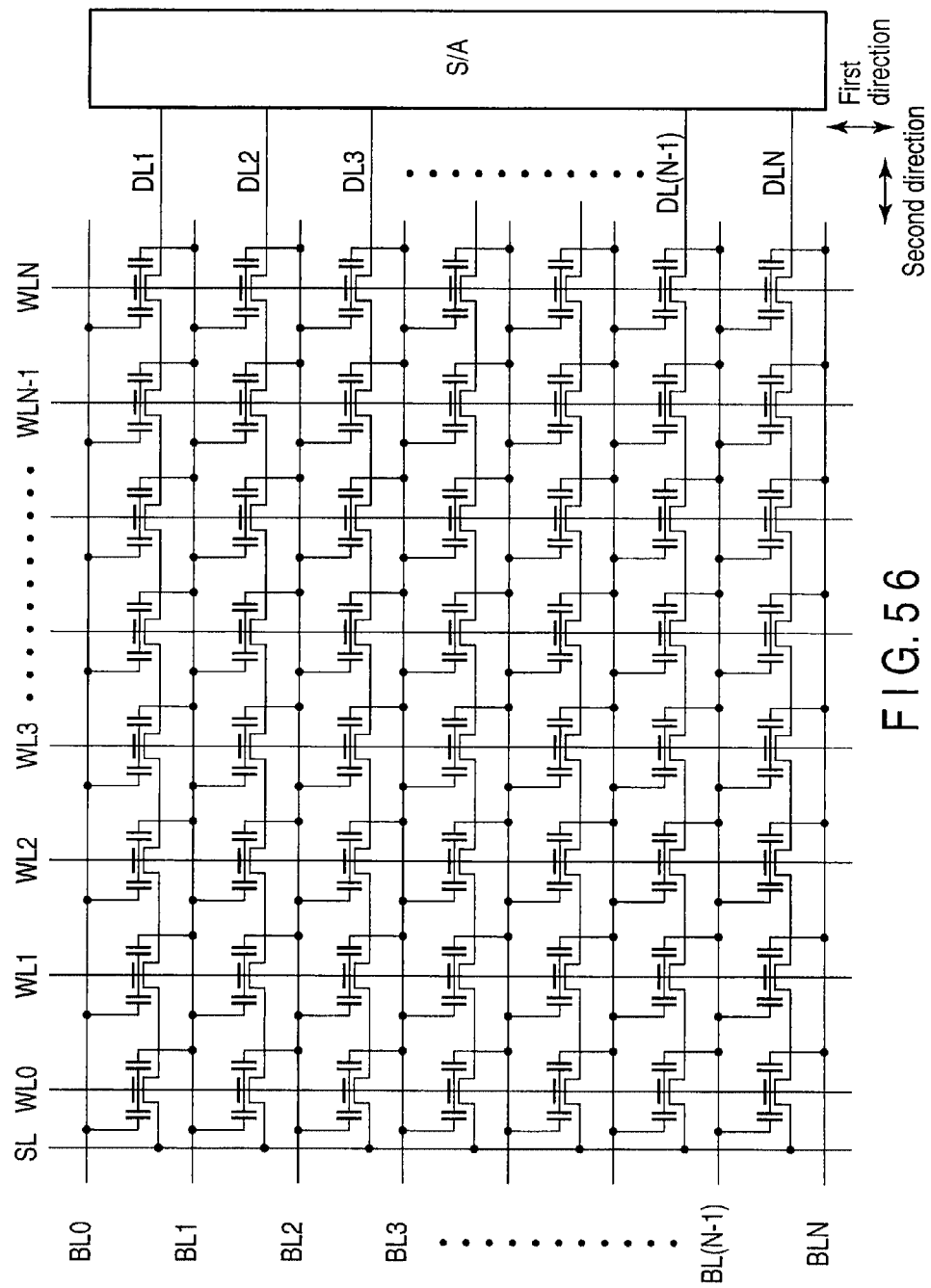
F I G. 56

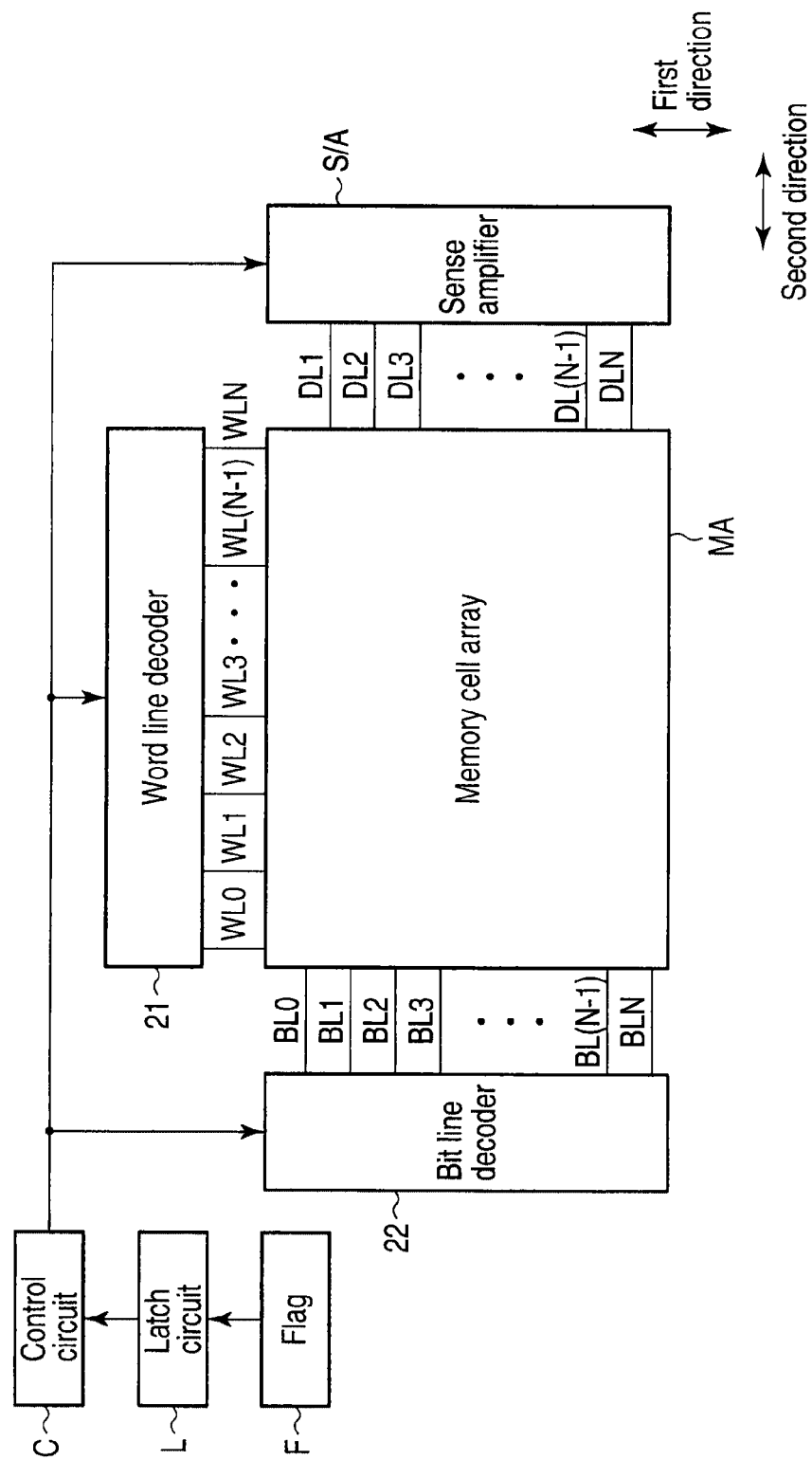
F I G. 5 7

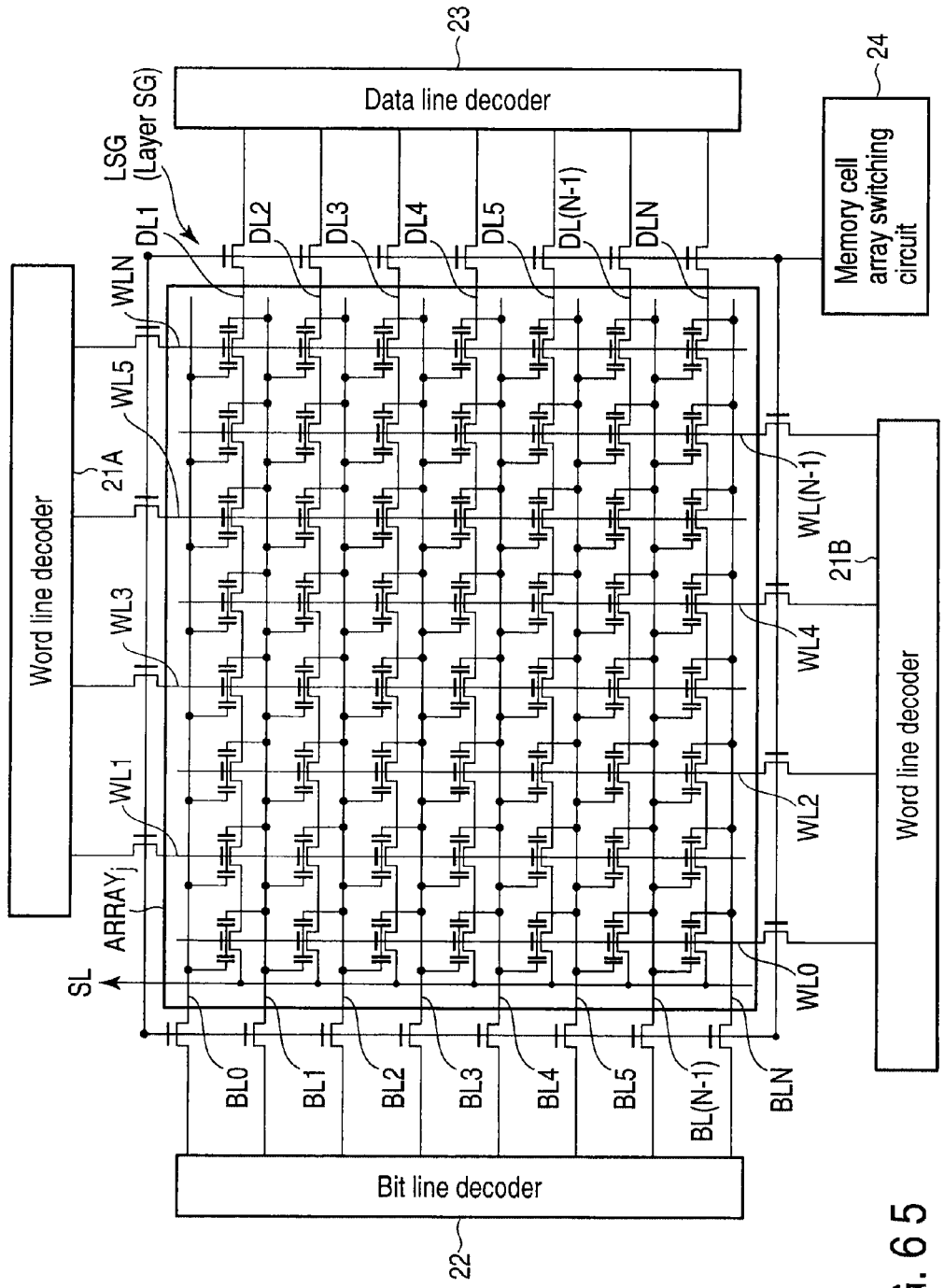
F I G. 65

MULTI-DOT FLASH MEMORY AND METHOD OF MANUFACTURING THE SAME

CROSS-REFERENCE TO RELATED APPLICATIONS

This application is based upon and claims the benefit of priority from prior Japanese Patent Application No. 2009-042548, filed Feb. 25, 2009, the entire contents of which are incorporated herein by reference.

BACKGROUND OF THE INVENTION

1. Field of the Invention

The present invention relates to a multi-dot flash memory (MDF) and a method of manufacturing the same.

2. Description of the Related Art

A NAND flash memory which has been dominating file memory market has a serious problem of performance deterioration due to repetition of the writing/erasing, because a tunnel insulating film used at the time of writing/erasing is also used as a gate insulating film which determines the transistor characteristic of a cell. Such problem in reliability of the tunnel insulating film is disclosed in Fujio Masuoka, "Flash Memory Technology Handbook", publish on demand, released in August, 1993.

In addition, since the NAND flash memory cannot be written in at random, it is not suitable for high-speed large-volume data recording. Therefore, a large-capacity buffer memory is required to record a moving image in real time.

The well-known memory cell structures of the NAND flash memory are a floating gate type using a floating gate to retain a charge, and a local trap type using a charge accumulation layer composed of local traps highly contained in a nitride film, but whether they can be miniaturized to 30 nm or less is doubtful for the following reason.

First, the floating gate type largely used in the market at present has a serious problem of an interference effect between two adjacent floating gates (intercell interference), which prevents miniaturization.

This intercell interference is disclosed in Andrea Ghetti, Luca Bortesi and Loris Vendrame, "3D Simulation study of gate coupling and gate cross-interference in advanced floating gate non-volatile memories", Solid-State Electronics, vol. 49, Issue 11, November 2005, Pages 1805-1812, for example.

As the quickest method to solve the above problem, both a tunnel insulating film provided between a channel and a floating gate and an interelectrode insulating film (IPD (Inter-Polysilicon Dielectric), for example) provided between the floating gate and a control gate are thinned, and lateral shrinkage and vertical shrinkage are implemented at the same time.

Although this method is subject to a scaling law (refer to R. H. Dennard et al., "Design of ion-implanted MOSFET's with very small physical dimensions", IEEE j. of SSC, vol. 9, No. 5, pp. 256-268, 1974, for example) and the most effective method, the writing/erasing have to be performed using the tunnel insulating film. As a result, a charge trap is generated on the side of the floating gate at the time of writing, and the charge trap is generated on the side of the substrate at the time of erasing.

Therefore, as for the memory cell, a difference (threshold window) between a threshold value in a writing state and a threshold value in an erasing state becomes small as the writing/erasing are repeated.

As described above, it is difficult to thin the tunnel insulating film due to the problem in reliability of the tunnel insulating film which is specific to the non-volatile memory.

Therefore, the floating gate type NAND flash memory is miniaturized by strain scaling in which the lateral direction is only shrunk. This makes apparent the problem due to the intercell interference effect.

Meanwhile, since the local trap type has less intercell interference in terms of its structure, and a leak phenomenon of the tunnel insulating film is limited to the local trap concerning a leak path generated in the tunnel insulating film, it is also superior in leak resistance (refer to SONY CX-PAL Vol. 52, Device having traveled in space, Low-cost embedded non-volatile memory device technology "MONOS", for example).

In these respects, the local trap type memory cell has been expected as a favorable memory cell after the end of the miniaturization of the floating gate type memory cell.

The local trap type has the advantage that the energy of a tunnel electron is low and the charge trap is not likely to be generated in the insulating film because the tunnel insulating film is thin as compared with the floating gate type.

However, as the writing/erasing are repeated, the charge trap is generated in the tunnel insulating film in the local trap type also similar to the floating gate type. This trap causes the problem in reliability of the tunnel insulating film naturally.

In addition, further miniaturization in the local trap type causes an essential defect in which the number of the local traps in the charge accumulation layer is decreased and the charge amount which can be stored is also decreased. Thus, even when a very small amount of charge is removed from the local trap of the charge accumulation layer in the miniaturized memory cell, this considerably affects the threshold value of the memory cell.

For example, when it is assumed that a trap density of the charge accumulation layer is $1\times10^{12}$ $cm^{-2}$, the trap number of the charge accumulation layer is only four when a control gate has a planar size of 20 nm×20 nm. When only one trap among them is connected to the leak path, it means that 25% of the total charges is lost.

Such variation in the number of local traps makes the operation of the memory cell unstable.

Consequently, under the circumstances in which the number of the local traps in the charge accumulation layer (electron retention number) is decreased, and the threshold swing between the writing state and the erasing state of the memory cell becomes small, when the variation in the local trap number is taken into consideration, the threshold window cannot be secured and becomes extremely narrow and as a result, the reading cannot be performed.

Under such circumstances, a next-generation memory such as a quantum dot memory has been proposed.

There are two prominent kinds of technologies.

One technology regards many varied quantum dots as one group considering that it is difficult to control the position of the single quantum dot and maintain the quality thereof.

For example, quantum dots are embedded in the tunnel insulating film to improve the writing characteristic. This technology is disclosed in R. Ohba, N. Sugiyama, J. Koga, and S. Fujita, "Silicon nitride memory with double tunnel junction", 2003 Symposium on VLST Technology Dig. Tech. Paper, for example. In addition, the quantum dot itself can be used instead of the local trap.

According to these technologies, although the conventional memory cell characteristic can be partially improved, the floating gate itself cannot be miniaturized to the level that shows a quantum dot property, and essential progress cannot be expected, since the quantum dots are embedded in one floating gate. Furthermore, since the reliability of the tunnel insulating film containing the quantum dot layer is lower than the reliability of the floating gate type tunnel insulating film because of the quantum dots, its production cost is also increased.

The other is a technology using the quantum dot as the floating gate.

Based on a vertical structure in which a regular tetrahedral trench is formed in a GaAs substrate, a floating gate of 10 nm is formed in a self-aligned manner in a valley part of the trench without any positional variation (refer to M. Shima, Y. Sakuma, T. Futatsugi, Y. Awano, and N. Yokoyama, "Tetrahedral shaped recess channel HEMT with a floating quantum dot gate," IEDM Tech. Dig., pp. 437-440, December 1998, for example).

For example, since data is stored by the presence of one electron, terabit-class scaling can be performed. However, since the size of the opening part of the trench is several microns actually, a cell area is considerably larger than that of the file memory using the silicon substrate.

That is, the key to the miniaturization of the cell lies in the miniaturization of the opening part. However, the miniaturization of the opening part of the trench is limited by the limitation of a thinned GaAs substrate because the source and drain are vertically arranged. In addition, since the GaAs substrate increases bit cost, it is not suitable for the file memory originally.

Meanwhile, many proposals have been already made for a memory principle using the quantum dots or silicon nanodots (refer to Jpn. Pat. Appln. KOKAI Publication Nos. 2003-243615, 2004-241781, 2005-175224, 2005-252266, 2006-140482, 2006-269660, and 2006-32970, K. Nishiguchi, H. Inokawa, Y. Ono, A. Fujiwara, and Y. Takahashi, "Mutilevel memory using an electrically formed single-electron box", APPLIED PHYSICS LETTERS, VOLUME 85, NUMBER 7, pp. 1277-1270, 16 August, 2004, and T. Goto et al., "Molecular-Mediated Single-Electron Devices Operating at Room Temperature", Japanese Journal of Applied Physics, Vol. 45, No, 5A, 2006, pp. 4285-4289, for example).

However, since these are proposed consistently for the memory principle, various problems have to be solved to complete the memory as the flash memory such as the NAND flash memory.

One of the above problems includes a memory cell array architecture.

Only after completing the memory cell array architecture, the amount of the charges (electrons or holes) stored in the floating gate can be controlled in unit of one or more, and a next generation multi-level memory in which two or more bits of data can be stored in one memory cell, that is, a random writable multi-dot flash memory that solves the problems in miniaturization and reliability can be established.

Thus, with the silicon technology, the new memory cell array architecture is expected to be developed in which the problem in reliability is solved by providing the gate insulating film and the tunnel insulating film separately, the floating gate can operate in the size showing the quantum dot behavior, and the random writing is possible.

BRIEF SUMMARY OF THE INVENTION

A multi-dot flash memory according to an aspect of the present invention comprises active areas arranged in a first direction, which extend to a second direction crossed to the first direction, the first and second direction being parallel to a surface of a semiconductor substrate, floating gates arranged in the first direction, which are provided above the active areas, a word line provided above the floating gates, which extends to the first direction, and bit lines provided between the floating gates, which extend to the second direction. Each of the floating gates has two side surfaces in the first direction, shapes of the two side surfaces are different from each other, and shapes of the facing surfaces of the floating gates which are adjacent to each other in the first direction are symmetrical.

A multi-dot flash memory according to an aspect of the present invention comprises memory cell arrays stacked above a semiconductor substrate, a peripheral circuit provided in the semiconductor substrate, and a memory cell array switching circuit provided in the semiconductor substrate, which electrically connects a selected memory cell array among the memory cell arrays to the peripheral circuit. Each of the memory cell arrays comprises active areas arranged in a first direction, which extend to a second direction which cross to the first direction, the first and second direction being parallel to a surface of a semiconductor substrate, floating gates arranged in the first direction, which provided above the active areas, a word line provided above the floating gates, which extends to the first direction, and bit lines provided between the floating gates, which extend to the second direction. Each of the floating gates has two side surfaces in the first direction, shapes of the two side surfaces are different from each other, and shapes of the facing surfaces of the floating gates which are adjacent to each other in the first direction are symmetrical.

BRIEF DESCRIPTION OF THE SEVERAL VIEWS OF THE DRAWING

FIG. 1 is a diagram showing a multi-dot flash memory.

FIG. 2 is a diagram showing a writing/erasing mechanism.

FIGS. 3 to 11 are diagrams, each showing a side-wall spacer lithography process.

FIG. 13 is a diagram showing a memory cell array architecture.

FIGS. 14 and 15 are diagrams, each showing a cross-section in a first direction.

FIG. 20 is a diagram showing an erasing principle by a direct tunneling.

FIG. 23 is a diagram showing a memory cell array architecture.

FIG. 29 is a diagram showing a sixth example of a writing operation.

FIG. 30 is a diagram showing a seventh example of a writing operation.

FIG. 31 is a diagram showing an eighth example of a writing operation.

FIG. 32 is a diagram showing a ninth example of a writing operation.

FIG. 39 is a diagram showing a seventh example of an erasing operation.

FIG. 46 is a diagram showing a charge trap in an erasing operation.

FIGS. 50A, 50B, 51A, 51B, 52A, 52B and 53 are diagrams, each showing a state of a reading operation.

FIGS. 54A and 54B are diagrams, each showing a simplified cell structure.

FIG. 55 is a diagram showing an equivalent circuit of a cell structure.

FIG. 56 is a circuit diagram showing a memory cell array.

FIG. 57 is a diagram showing a system for an initial setting.

FIG. 65 is a diagram showing a memory cell array and a peripheral circuit.

DETAILED DESCRIPTION OF THE INVENTION

Figure 5:
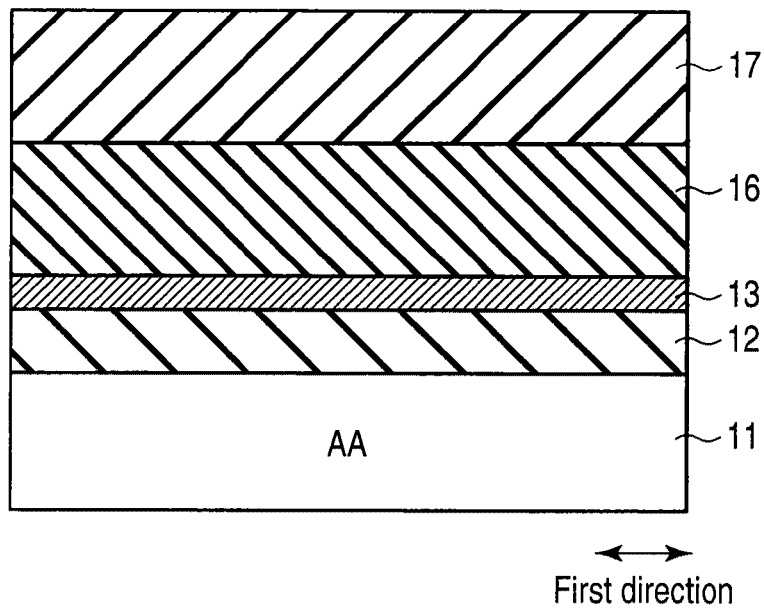

A multi-dot flash memory and a method of manufacturing the same of an aspect of the present invention will be described below in detail with reference to the accompanying drawing.

1. Multi-Dot Flash Memory

First, a description will be made of a multi-dot flash memory on which the present invention is based.

The memory cell array architecture of the multi-dot flash memory is disclosed in PCT/JP2008/053688.

In this specification, the multi-dot flash memory is defined as a next generation multi-level memory in which the amount of charge (electron or hole) stored in a floating gate is controlled in increments of one or more, and two or more bits of data is stored in one memory cell.

FIG. 1 is a birds-eye view showing a memory cell array architecture of the multi-dot flash memory. In addition, FIG. 2 is a cross-sectional view of the memory cell array in FIG. 1 in a first direction.

Active areas (semiconductor substrates or semiconductor layers, for example) AA, . . . are arranged in a line-and-space pattern in the first direction, and the lines of active areas AA, . . . extend in a second direction. Bit lines BL, . . . are arranged above the spaces between active areas AA, . . . and extend in the second direction. The spaces between active areas AA, . . . are element isolation areas (STI (shallow trench isolation), for example).

Floating gates FG, . . . are arranged in the form of an array and provided above active areas AA, . . . and between bit lines BL, . . . . Each of floating gates FG, . . . is sandwiched between two right and left bit lines BL (L) and BL(R).

A gate insulating film is arranged between active areas AA, . . . and floating gates FG, . . . . In addition, tunnel insulating films are arranged between bit lines BL, . . . and floating gates FG, . . . . Thus, since the gate insulating film and the tunnel insulating film are separately provided, the problem in reliability can be solved.

Control gates CG, . . . are arranged above floating gates FG, . . . . An interelectrode insulating film (IPD, for example) is arranged between floating gates FG, . . . and control gates CG, . . . . Word lines WL, . . . are arranged on control gates CG, . . . . Word lines WL . . . extend in the first direction, and commonly connected to control gates CG, . . . arranged in line in the first direction.

In the multi-dot flash memory having the above structure, by controlling gate potential VG to be applied to word line WL, potential V1 to be applied to left bit line BL (L), and potential V2 to be applied to right bit line BL (R), as shown in FIG. 2, the charge can be injected and emitted to and from floating gate FG.

Thus, the multi-dot flash memory is characterized in that one of the two tunnel insulation films existing on the right and left sides of floating gate FG is used for injecting the charge at the time of writing and the other thereof is used for emitting the charge at the time of erasing.

Thus, since the direction of a tunnel current (flow of electrons) flowing in the tunnel insulating film is kept constant, the reliability of the tunnel insulating film can be improved.

In addition, since the tunnel insulating film and the gate insulating film are separately provided, a charge trap generated at the time of writing or erasing does not affect the gate insulating film, and threshold voltage Vth at the time of reading can be prevented from shifting.

2. Principle of the Invention

Since the multi-dot flash memory controls the charge amount in the floating gate in small unit of one or more in view of its principle, to sufficiently reduce the size of the floating gate is an effective way to implement multilevel by a quantum dot effect.

However, to reduce the size of the floating gate in the above memory cell array architecture is very difficult in terms of a technical limit of a size processed by photolithography and production cost.

For example, a line width of 20 nm can be implemented by a technology using EUV (extreme ultraviolet) in principle, but it has not been put to practical use yet. Even if it is put to practical use, its production cost will be high. In addition, there must be a technological limit of a size processed even by the technology using EUV.

Under such circumstances, a technology to implement fine processing by devising the process has been proposed. This technology is characterized in that a fine mask pattern is formed by use of a side-wall insulating film and called a side-wall spacer lithography process or a self-aligned double patterning process.

Therefore, this process is very effective in processing the floating gate of the multi-dot flash memory.

Thus, the inventors of the present invention processed the floating gate by use of the side-wall spacer lithography process and completed the above-described memory cell array architecture.

FIGS. 3 to 10 are cross-sectional views schematically showing the processes of the floating gate by the side-wall spacer lithography process.

Active area (AA) 11 is a semiconductor substrate or a semiconductor layer on an insulating film.

First, as shown in FIG. 3, gate insulating film (silicon oxide film, for example) 12 is formed on active area 11. Then, conductive layer 13 is formed of conductive polysilicon, for example on gate insulating film 12.

Then, line-and-space patterned resist layer 14A extending in a first direction is formed by a photolithography process, and trenches extending in the first direction are formed in conductive layer 13 through an etching process, using resist layer 14A as a mask. Thus, two side surfaces that cross the first direction are provided in floating gate (FG) in a second direction.

Thereafter, resist layer 14A is removed.

Then, as shown in FIG. 4, the trenches formed in conductive layer 13 are filled with insulating film 15 composed of oxide silicon.

Then, as shown in FIG. 5, hard mask layer 16 is formed of an insulator, for example on conductive layer 13, and then, core layer 17 is formed of an insulator, for example on hard mask layer 16.

Figure 6:
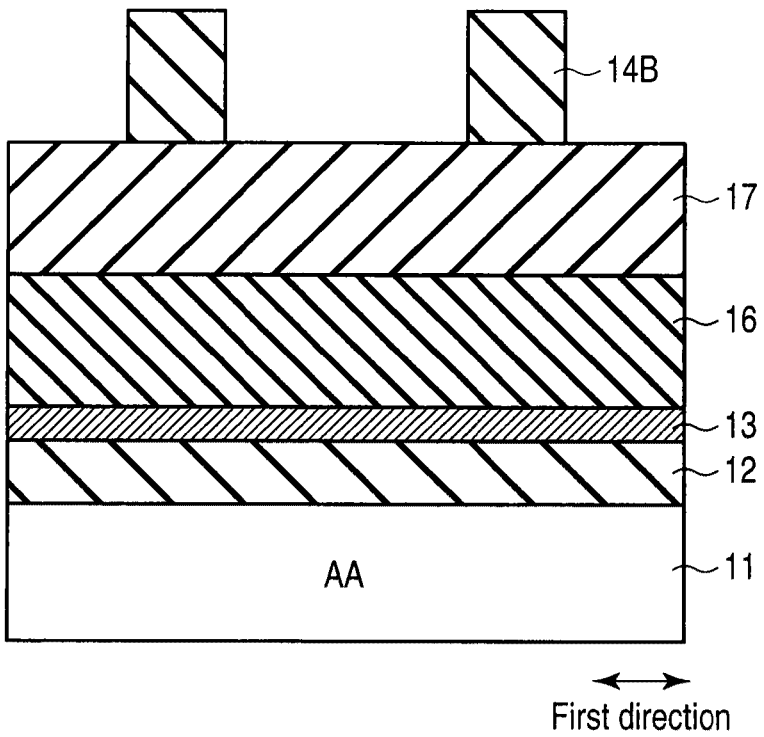

Then, as shown in FIG. 6, line-and-space patterned resist layer 14B is formed by a photolithography process so as to extend in the second direction, and trenches extending in the second direction are formed in core layer 17 through an etching process using resist layer 14B as a mask.

Then, resist layer 14B is removed, whereby a structure shown in FIG. 7 is provided.

Then, as shown in FIG. 8, side-wall insulating films 18 are formed on the two side surfaces of core layer 17 in the first direction. Side-wall insulating film 18 is composed of an insulator different from that of core layer 17. Then, core layer 17 is removed, whereby a structure shown in FIG. 9 is provided.

Figure 9:
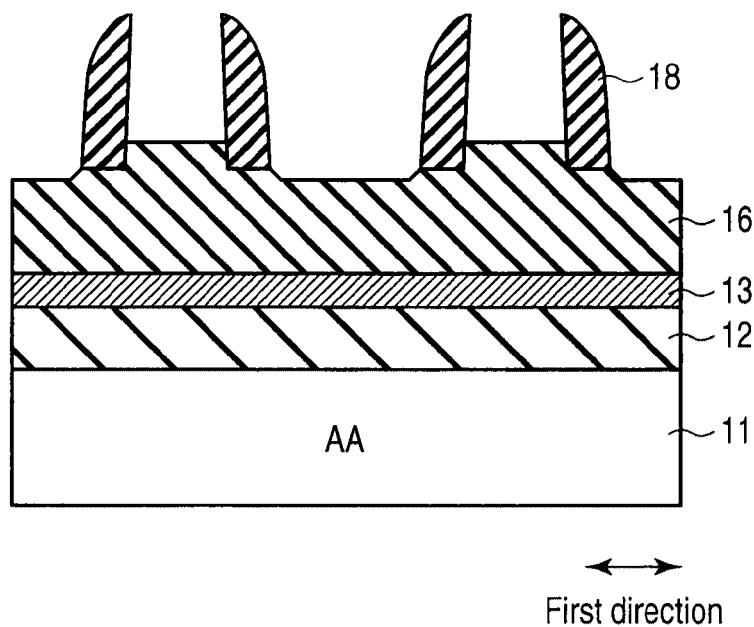
Figure 10:
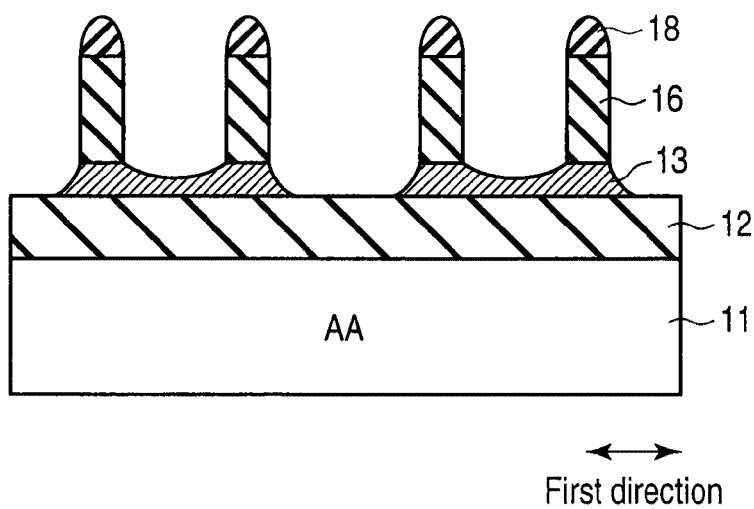

In addition, when hard mask layer 16 is etched by RIE using side-wall insulating film 18 shown in FIG. 9 as a mask, hard mask patterns (hard mask layer) 16 are formed as shown in FIG. 10.

Figure 11:
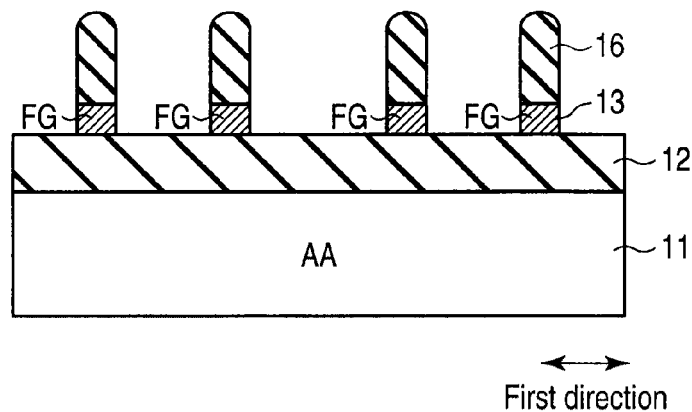

Then, as shown in FIG. 11, when conductive layer 13 is etched by RIE using hard mask patterns 16 as a mask, two side surfaces of floating gate (FG) composed of conductive layer 13 are formed in the first direction.

The array of floating gates (FG) is completed through the above steps.

Then, gate insulating film 12 and active area 11 are etched using the hard mask patterns as a mask and the process of forming the element isolation insulating film will be continued, but the detailed description of those processes is omitted here.

After verifying this process, it has been found that the following problem is newly generated.

The problem is that there are a variation in side surface shape of the floating gates processed by the fine line-and-space mask pattern formed by use of the side-wall insulating film and a variation in width of the bit line between the floating gates.

After verifying this problem in detail, it has been found that the side surface shape of the floating gates processed by odd-numbered patterns from one end of the fine line-and-space mask pattern alternately differ from the side surface shape of the floating gates processed by even-numbered patterns from the one end thereof, and this causes the widths of the bit lines to differ periodically.

Thus, such variation is referred to as "even-odd variation" hereinafter.

This even-odd variation means that regarding the one floating gate, the shapes of two side surfaces existing in the same direction are different, and regarding the two floating gates adjacent in the same direction, the shapes of two side surfaces opposed to each other are symmetrical, that is, almost line symmetrical, or almost the same.

Figure 12:
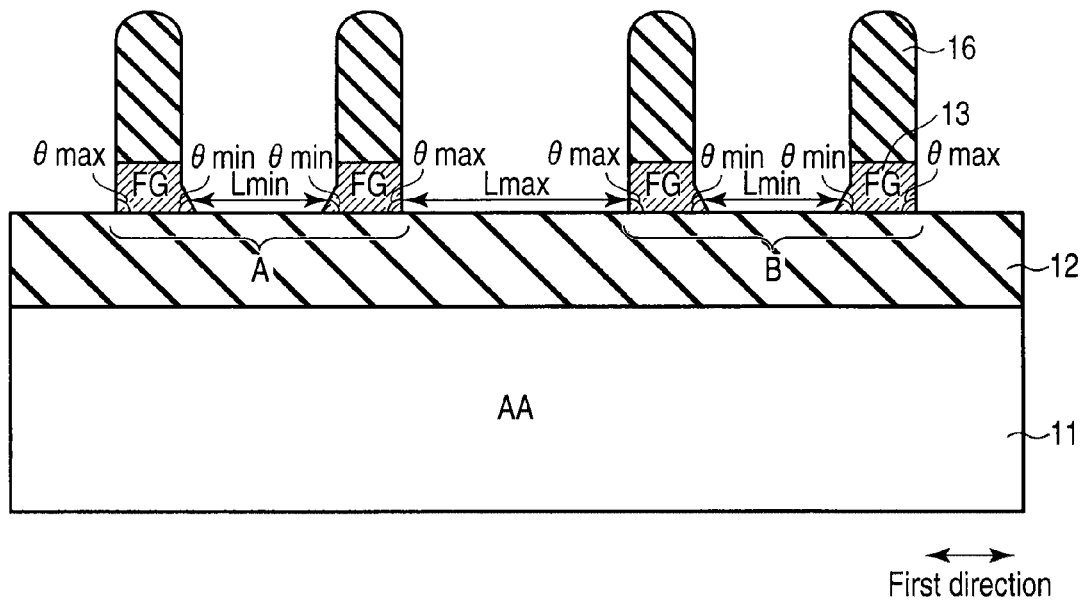
FIG. 12 is a diagram showing an even-odd variation.
Figure 16:
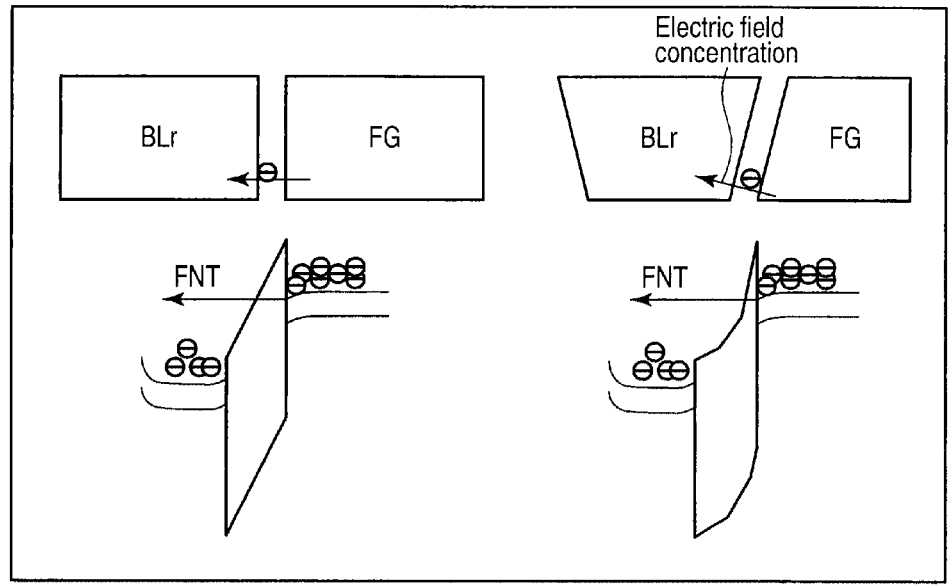
FIG. 16 is a diagram showing a charge transfer to a charge receiving-only line.

FIG. 12 schematically shows the even-odd variation.

This view is an enlarged view of FIG. 11.

Two adjacent floating gates FG in area A are processed by use of the two side-wall insulating films formed on the two side surfaces of the same core layer, and their shapes are symmetric. That is, the two side surfaces of the core layer side (inner side) are sloped.

When a degree of the slope of the side surface is expressed in a taper angle $\theta$, a taper angle $\theta$ (=$\theta$ min) of the two side surfaces on the core layer side of two adjacent floating gates FG in area A is smaller than a taper angle $\theta$ (=$\theta$ max) of the two side surfaces on the side (outer side) opposite to the core layer side.

Here, the taper angle is defined by an angle formed between a bottom surface and the side surface of floating gate (FG).

Similarly, two adjacent floating gates FG in area B are processed by the two side-wall insulating films formed on the two side surfaces of the same core layer, and their shapes are symmetric.

That is, a taper angle $\theta$ (=$\theta$ min) of the two side surfaces on the core layer side of two adjacent floating gates FG in area B is smaller than a taper angle $\theta$ (=$\theta$ max) of the two side surfaces on the side (outer side) opposite to the core layer side.

The $\theta$ max is roughly 90° and the $\theta$ min is smaller than 90°.

It is thought that the even-odd variation is caused by the symmetry of the shapes of the two side-wall insulating films formed based on the same core layer.

In addition, the even-odd variation of floating gates FG causes distances of L min and L max between floating gates FG to vary periodically. The periodical change in distances of L min and L max of floating gates FG causes the widths of bit lines arranged between floating gates FG to vary periodically.

Such variation in widths of the bit lines is referred to as the "even-odd difference" hereinafter.

Here, the width of the bit line is defined by (the width of the lower surface of the bit line+the width of the upper surface of the bit line)/2.

Since the even-odd variation and the even-odd difference change the writing/erasing characteristics in the multi-dot flash memory in which writing/erasing operations are performed by use of the side surface of the floating gate, these are not favorable in the ordinary sense.

However, it is difficult to eliminate the even-odd variation and the even-odd difference completely.

Thus, the inventors converted the development course to oppositely using the even-odd variation and the even-odd difference instead of eliminating them, and could complete a new memory cell array architecture.

More specifically, using the periodicity of the even-odd variation and the even-odd difference, a charge serving-only line as a bit line for supplying the charge into the floating gate, and a charge receiving-only line for receiving the charge from the floating gate are periodically arranged based on the above periodicity.

In addition, which is set as the charge serving-only line and which is set as the charge receiving-only line of the two bit lines sandwiching the floating gate is based on the difference in shapes of the two side surfaces of the floating gate.

More specifically, according to one method, the charge serving-only line is arranged on the side surface having the large taper angle θ max and the charge receiving-only line is arranged on the side surface having the small taper angle θ min of the two side surfaces of the floating gate. When the charge receiving-only line is arranged on the side surface having the small taper angle θ min, the angle formed between the bottom surface and the side surface of the floating gate is an acute angle, and the charge can be easily moved from the floating gate to the charge receiving-only line.

According to another method, the charge serving-only line is arranged on the thick bit line side, and the charge receiving-only line is arranged on the thin bit line side. Thus, when the charge receiving-only line is arranged on the side surface having the small taper angle θ min, the angle formed between the bottom surface and the side surface of the floating gate is an acute angle, and the charge can be easily moved from the floating gate to the charge receiving-only line.

When the above memory cell array architecture is employed, the side-wall spacer lithography process can be employed, so that the multi-dot flash memory can be implemented.

By the way, although it is thought that the even-odd variation and the even-odd difference mainly depend on the symmetry of the shapes of the side-wall insulating films in the side-wall spacer lithography process, they also depend on a wafer in-plane variation of the etching process.

That is, the even-odd variation and the even-odd difference differ with respect to each chip in some cases.

For example, although the periodicity of the even-odd variation and the even-odd difference is not changed, it could be that the odd-numbered floating gate has the first shape and the even-numbered floating gate has the second shape in some chips, while the even-numbered floating gate has the first shape and the odd-numbered floating gate has the second shape in other chips.

Thus, taking such case into consideration, a flag for selecting one of first and second writing/erasing algorithms is provided in the chip.

According to the first writing/erasing algorithm, the odd-numbered bit line is set to the charge serving-only line and the even-numbered bit line is set to the charge receiving-only line, and according to the second writing/erasing algorithm, the odd-numbered bit line is set to the charge receiving-only line and the even-numbered bit line is set to the charge serving-only line.

In a step of testing after manufacturing the chip, the even-odd variation and the even-odd difference are verified to confirm which side has the smaller taper angle of the two side surfaces of the floating gate in the first direction, or which bit line width is shorter.

This confirmation can be made by measuring a signal delay time of the bit line, for example.

That is, the cross-sectional shape (resistance value) of the odd-numbered bit line differs from the cross-sectional shape (resistance value) of the even-numbered bit line due to the even-odd variation and the even-odd difference. In addition, the resistance value of the bit line having the narrow width is greater than that of the bit line having the large width.

In addition, the difference in the resistance values can be found by measuring the signal delay time of the bit line.

Thus, for example, when the average value of the signal delay time of the odd-numbered bit line is greater than the average value of the signal delay time of the even-numbered bit line, the odd-numbered bit line is set to the charge receiving-only line. When the average value of the signal delay time of the even-numbered bit line is greater than the average value of the signal delay time of the odd-numbered bit line, on the other hand, the even-numbered bit line is set to the charge receiving-only line.

Thus, when this test result is stored in the flag, one of the first and second writing/erasing algorithms can be selected based on the flag data at the time of normal operation.

3. Memory Cell Array Architecture

A description will be made of the memory cell array architecture according to the example of the present invention.

FIG. 13 is a birds-eye view showing the memory cell array architecture. In addition, FIGS. 14 and 15 are cross-sectional views of the memory cell array in a first direction in FIG. 13.

Active areas (semiconductor substrates or semiconductor layers, for example) AA, . . . are arranged in a line-and-space pattern in the first direction, and the lines of active areas AA, . . . extend in a second direction. Bit lines BLs, BLr, . . . are arranged above the spaces between active areas AA, . . . and extend in the second direction. The spaces between active areas AA, . . . are element isolation areas (STI: shallow trench isolation, for example).

Floating gates FG, . . . are arranged in the form of an array and provided above active areas AA, . . . and between bit lines BLs, BLr, . . . . Each of floating gates FG, . . . is sandwiched between two bit lines BLs, and BLr.

Gate insulating film is arranged between active areas AA, . . . and floating gates FG, . . . . In addition, tunnel insulating films are arranged between bit lines BLs, BLr, . . . and floating gates FG, . . . . Thus, since the gate insulating film and the tunnel insulating film are separately provided, the problem in reliability can be solved.

Here, each floating gate FG has two differently-shaped side surfaces which are positioned in the first direction, and adjacent floating gates FG, . . . in the first direction have symmetric side surfaces which are opposed to each other.

For example, referring to FIGS. 13 to 15, the right side surface of first floating gate FG from the left side and the left side surface of second floating gate FG from the left side are symmetric, and the right side surface of second floating gate FG from the left side and the left side surface of third floating gate FG from the left side are symmetric.

In addition, odd-numbered floating gates FG from the left side such as first and third floating gates FG from the left side have the same shape. More specifically, the left side surface is slanted and the right side surface is roughly vertical. Consequently, a taper angle θ min of the left side surface is smaller than a taper angle θ max of the right side surface.

Similarly, the even-numbered floating gates FG from the left side such as second and fourth floating gates FG from the left side have the same shape. More specifically, the right side surface is slanted and the left side surface is roughly vertical. Consequently, a taper angle θ min of the right side surface is smaller than a taper angle θ max of the left side surface.

Using such periodicity of the even-odd variation of floating gates FG, . . . , bit lines (charge serving-only lines) BLs which supply the charges into floating gates FG, . . . and bit lines (charge receiving-only lines) BLr which receive the charges from floating gates FG are alternately arranged.

More specifically, bit line (charge serving-only line) BLs is arranged on the side surface having the large taper angle θ max, and bit line (charge receiving-only line) BLr is arranged on the side surface having the small taper angle θ min.

When bit line (charge receiving-only line) BLr is arranged on the side surface having the small taper angle θ min, the angle formed between the bottom surface and the side surface of floating gate FG is an acute angle, so that the charge can easily move from floating gate FG to bit line (charge receiving-only line) BLr.

Since bit line (charge receiving-only line) BLr is arranged between the two side surfaces having the small taper angle θ min, the two side surfaces of bit line (charge receiving-only line) BLr in the first direction form an overhung shape. Therefore, the width of the upper surface of bit line (charge receiving-only line) BLr in the first direction is larger than the width of the lower surface thereof in the first direction.

In addition, when it is assumed that the distance between floating gates FG, . . . in the first direction is constant, the cross-sectional area of bit line (charge receiving-only line) BLr in the first direction is smaller than the cross-sectional area of bit line (charge serving-only line) BLs in the first direction. In other words, the resistance value of bit line (charge receiving-only line) BLr is greater than the resistance value of bit line (charge serving-only line) BLs.

Control gates CG, . . . are arranged above floating gates FG, . . . . An interelectrode insulating film (IPD, for example) is arranged between floating gates FG, . . . and the control gates CG, . . . . Word lines WL, . . . are arranged above control gates CG, . . . . Word line WL extends in the first direction, and commonly connected to control gates CG, . . . arranged in the first direction.

In the multi-dot flash memory having the above structure, the charge can be injected and emitted to and from floating gates FG, . . . by controlling gate potential VG to be applied to word line WL, potential V1 to be applied to bit line (charge serving-only line) BLs, and potential V2 to be applied to bit line (charge receiving-only line) BLr.

For example, when the charge is an electron, the relation of the potentials is V2>V1, and VG>0V. Potential V2 is a positive potential, for example, and potential V1 is a negative potential, for example.

More specifically, at the time of writing, the potentials are set such that VG=VDD/2, V1=−VDD, and V2=VDD as shown in FIG. 14. Here, the potential VDD is a power supply potential. The writing means an operation in which electrons are injected into floating gate FG. The same is true in the following description.

In this case, the electrons are injected from bit line (charge serving-only line) BLs to floating gates FG, . . . .

Figure 17:
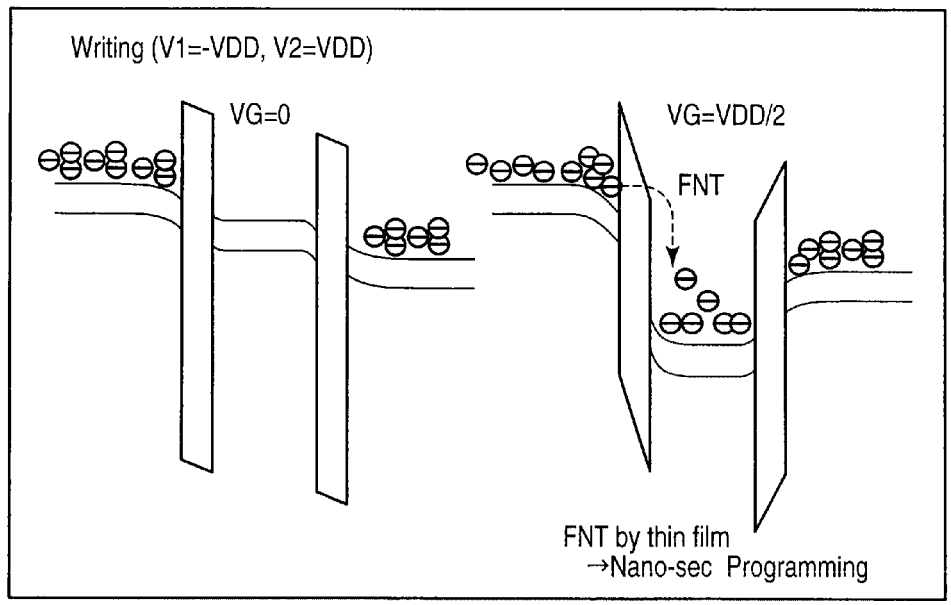
FIG. 17 is a diagram showing a writing principle by a FN-tunneling.

FIG. 17 is a band diagram to explain a writing mechanism.

When the potential are set such that VG=0V, V1=−VDD, and V2=VDD, an electric field is applied to the tunnel insulating film between bit line (charge serving-only line) BLs and floating gate FG, and the tunnel insulating film between floating gate FG and bit line (charge receiving-only line) BLr.

Although this electric field tries to generate electron happening from bit line (charge serving-only line) BLs to bit line (charge receiving-only line) BLr through floating gate FG, the hopping is not generated in a short time because its action is small.

Thus, when the potentials are set such that VG=0V→VDD/2, V1=−VDD, and V2=VDD, the intensity of the electric field applied to the tunnel insulating film between bit line (charge serving-only line) BLs and floating gate FG is increased and electrons are injected into floating gate FG by FNT (Fowler-Nordheim tunneling).

At the same time, since the intensity of the electric field applied to the tunnel insulating film between floating gate FG and bit line (charge receiving-only line) BLr is decreased, or since a reverse electric field is applied to that tunnel insulating film depending on the potential condition, a tunnel current flowing in that tunnel insulating film disappears or becomes very small.

Thus, the electron is injected into floating gate FG, and the writing is carried out.

Figure 18:
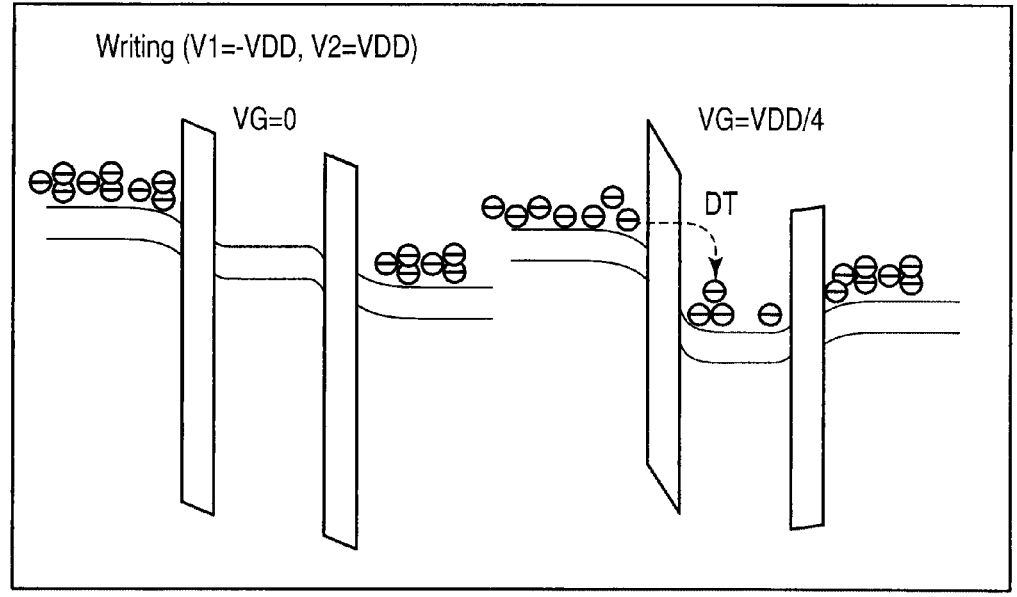
FIG. 18 is a diagram showing a writing principle by a direct tunneling.

As a matter of course, DT (direct tunneling) shown in FIG. 18 may be generated depending on thicknesses of the tunnel insulating films between two right and left bit lines BLs and BLr, and floating gate FG and the voltages (V1, V2 and VG) applied thereto, instead of the Fowler-Nordheim tunneling shown in FIG. 17.

For example, as shown in FIG. 18, when the potentials are set such that VG=0V→VDD/4, V1=−VDD, and V2=VDD, electrons can be injected from bit line (charge serving-only line) BLs to floating gate FG by the direct tunneling.

In this case, although the writing speed becomes slow as compared with the electron injection by the Fowler-Nordheim tunneling, it can be close to the writing speed of the Fowler-Nordheim tunneling by thinning the tunnel insulating film.

When the direct tunneling is used, the power supply potential VDD can be lowered, so that it is preferable that the Fowler-Nordheim tunneling and the direct tunneling are appropriately used depending on the design specification.

Next, an erasing mechanism will be described.

At the time of erasing, as shown in FIG. 15, the potentials are set such that VG=−VDD, V1=−VDD, and V2=VDD. Here, potential VDD is a power supply potential. The erasing means an operation in which electrons are emitted from floating gate FG. The same is true in the following description.

In this case, the electrons are emitted from the floating gates FG, . . . to bit line (charge receiving-only line) BLr.

Figure 19:
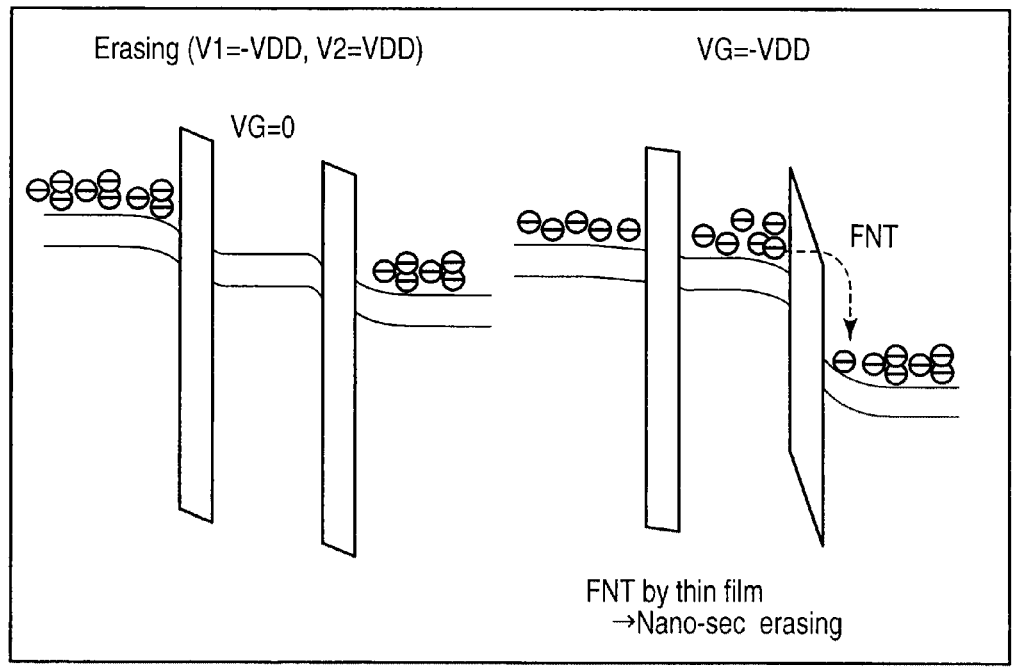
FIG. 19 is a diagram showing an erasing principle by a FN-tunneling.

FIGS. 19 and 20 are band diagrams to explain an erasing mechanism.

FIG. 19 is a band diagram when the Fowler-Nordheim tunneling is used, and FIG. 20 is a band diagram when the direct tunneling is used.

When the potentials are set such that VG=0V→−VDD, V1=−VDD, and V2=VDD, as shown in FIG. 19, the electrons in floating gate FG is emitted to the bit line (charge receiving-only line) BLr by the Fowler-Nordheim tunneling. When VG=0V, this emission does not occur.

In addition, when the potentials are set such that VG=0V→−VDD/2, V1=−VDD, and V2=VDD, as shown in FIG. 20, the electrons in the floating gate FG are emitted to bit line (charge receiving-only line) BLr by the direct tunneling. When VG=0V, this emission does not occur.

At the time of erasing also, the speed of the electron emission (erasing speed) by the direct tunneling is slower than that by the Fowler-Nordheim tunneling, but it can be close to the erasing speed of the Fowler-Nordheim tunneling by thinning the tunnel insulating film.

When the direct tunneling is used, the power supply potential VDD can be lowered, so that it is preferable that the Fowler-Nordheim tunneling and the direct tunneling are appropriately used depending on the design specification.

As described above, one of the two tunnel insulating films existing right and left of floating gate FG is used for the writing (charge injection) and the other thereof is used for the erasing (charge emission).

Thus, since the direction of the tunnel current (electron flow) flowing in the tunnel insulating film is kept constant, the reliability of the tunnel insulating film can be improved.

In addition, when the tunnel insulating film and the gate insulating film are separately provided, the charge trap generated at the time of writing/erasing does not affect the gate insulating film, so that threshold voltage Vt at the time of reading can be prevented from shifting.

FIGS. 21A, 21B, 21C, 22A, 22B and 22C show the cross-sections of a multi-dot flash memory in a second direction.

This structure is the same as the structure shown in FIG. 13 except that the heights of word lines WL, . . . are differentiated every other line.

In this structure, while the pitches of floating gates FG, . . . can be narrow, the pitches of word lines WL, . . . can be increased. That is, while the memory cell can be miniaturized by decreasing the pitches of floating gates FG, the resistance value can be lowered by increasing the pitches of word lines WL, . . . .

When STI (shallow trench isolation) is formed in a semiconductor substrate (silicon substrate, for example), active area AA is provided in an area other than an element isolation area in which the STI is formed. In addition, floating gates FG, . . . are made of monocrystalline silicon subjected to a thermal oxidation treatment or polycrystalline silicon subjected to a radical oxidation treatment.

Memory cells MC, . . . are connected in series in the second direction and form a NAND string similar to a NAND flash memory. One memory cell MC has one floating gate FG. Source diffusion layer (Source) 17A is formed at one end of the NAND string, and drain diffusion layer (Drain) 17B is formed at the other end thereof.

Figure 21A:
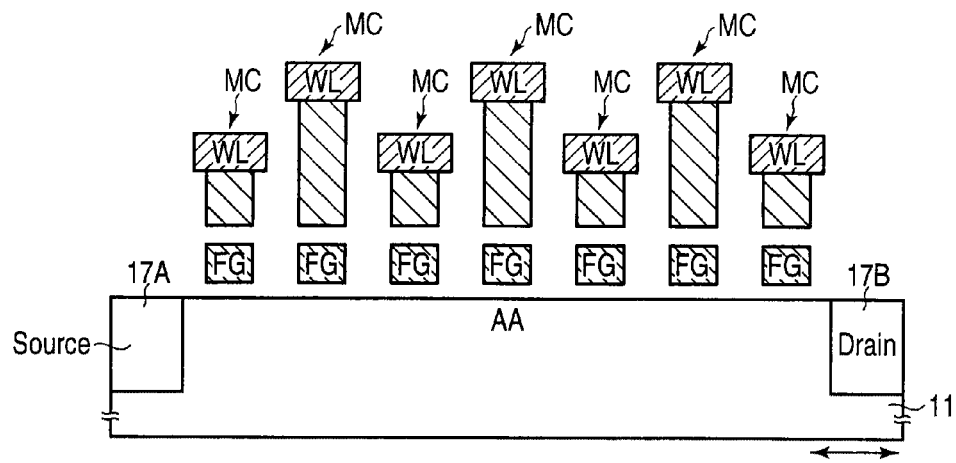
FIGS. 21A to 21C and 22A to 22C are diagrams, each showing a modification example of a memory cell array architecture.
Figure 21B:
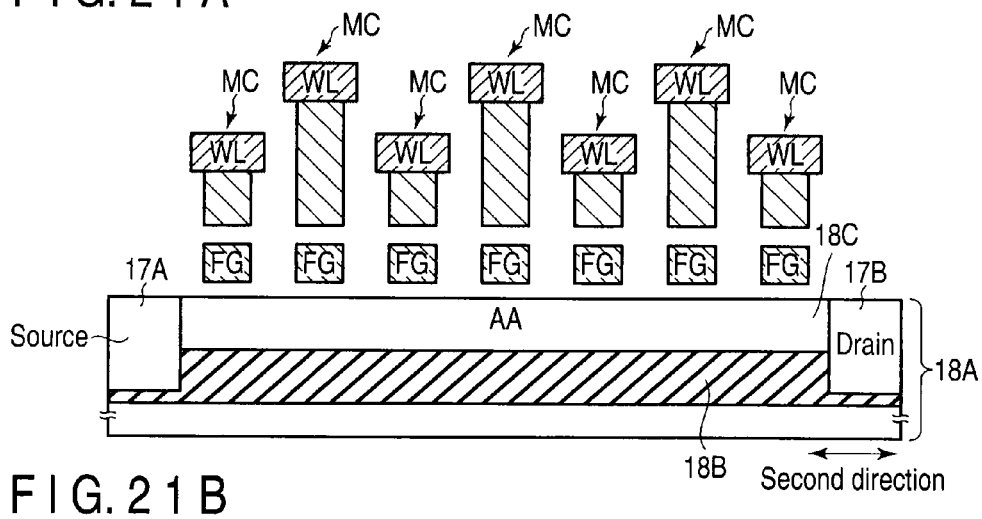
Figure 22A:
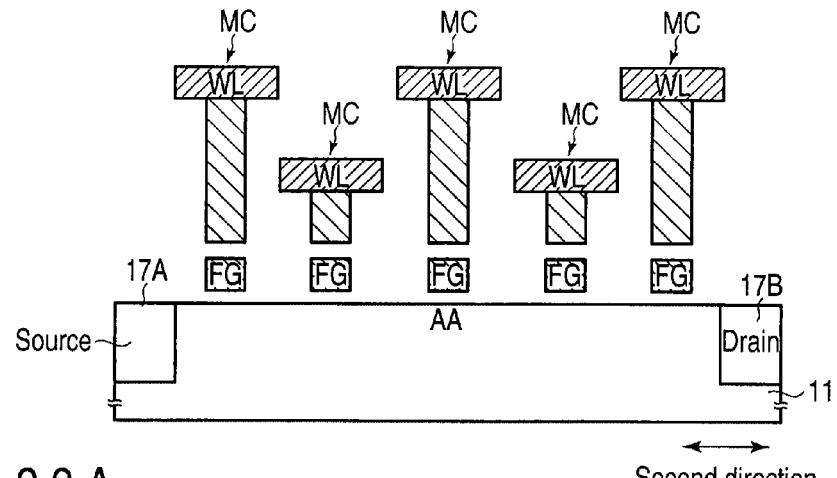
Figure 22B:
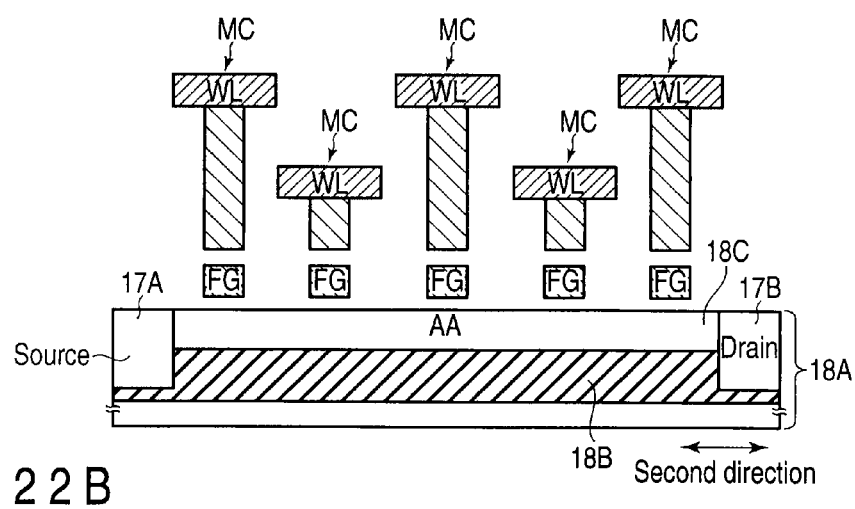

Here, FIGS. 21A and 22A show examples in which semiconductor substrate (silicon substrate, for example) 11 is used for active area AA, and FIGS. 21B and 22B show examples in which semiconductor layer 18C on insulating film 18B in SOI (silicon on insulator) substrate 18A is used for active area AA.

Figure 21C:
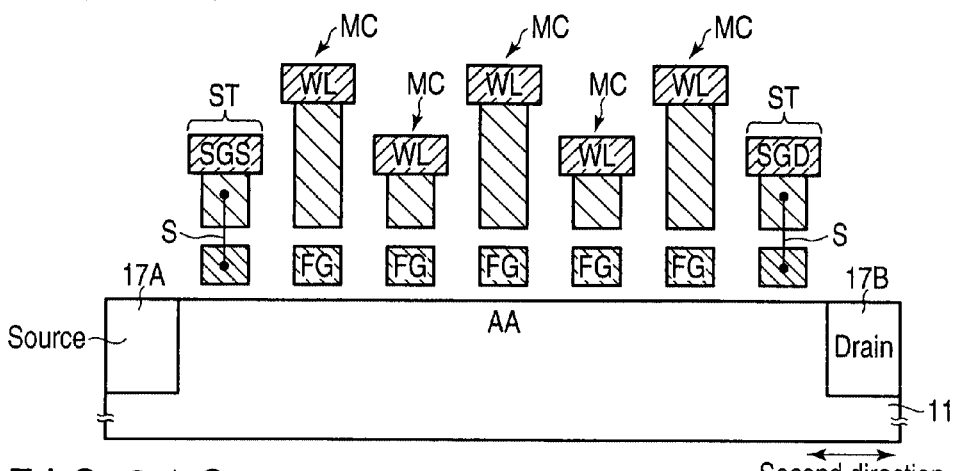
Figure 22C:
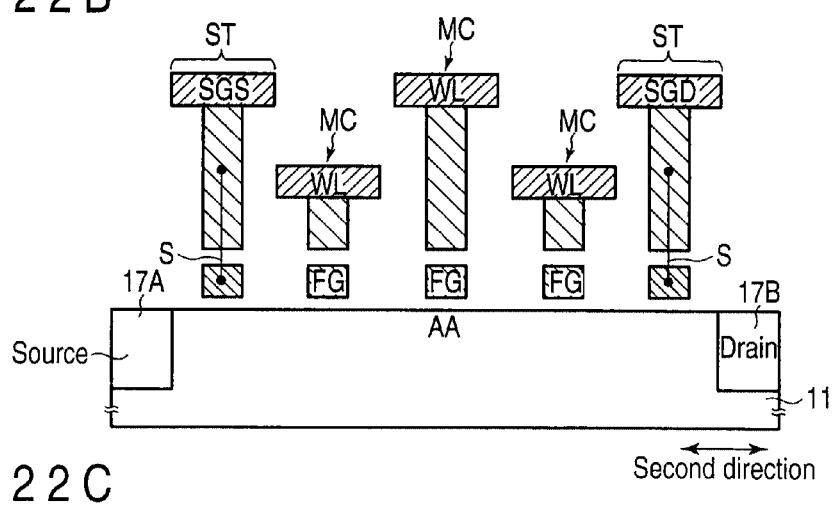

FIGS. 21C and 22C are modifications of the structures in FIGS. 21A and 22A, in which select gate transistors ST are arranged between the NAND string (memory cells MC), and source/drain diffusion layers (Source/Drain) 17A and 17B. Short-circuit line S short-circuits an upper gate and a lower gate.

In addition, in FIGS. 21B and 22B, when semiconductor layer 18C on insulating film 18B is sufficiently thinned, the reading and writing can be performed even when the select gate transistor is omitted.

When the NAND string is composed of memory cells MC, . . . , memory cells MC, . . . may be either normally on or normally off. In FIGS. 21B and 22B, memory cell MC is normally on, and the extension of a depletion layer in semiconductor layer 18C is controlled by the potentials of word lines WL, . . . , whereby on/off can be controlled.

In addition, although a diffusion layer is not formed between serially connected memory cells MC, . . . and select gate transistor ST in FIGS. 21A, 21B, 21C, 22A, 22B and 22C, the diffusion layer may be formed there as a matter of course.

Normally, when memory cells MC, . . . are miniaturized, on/off of the current passage of the NAND string can be controlled by controlling the potential of word line WL even without the diffusion layer.

4. Operation

A description will be made of a writing operation, an erasing operation, and a reading operation.

FIG. 23 is a top view of the birds-eye view in FIG. 13.

Word lines WL, . . . extend in a lateral direction (first direction), and bit lines BL, . . . extend in a vertical direction (second direction), and active areas AA, . . . extend in the vertical direction similar to bit lines BL, . . . .

Floating gates FG, . . . are arranged above active areas AA, . . . and floating gates FG, . . . are arranged between bit lines BL, . . . .

(1) Writing Operation

First, an example of the writing operation will be described.

In the following description, bit line BLs means the charge serving-only line, and bit line BLr means the charge receiving-only line.

Figure 24:
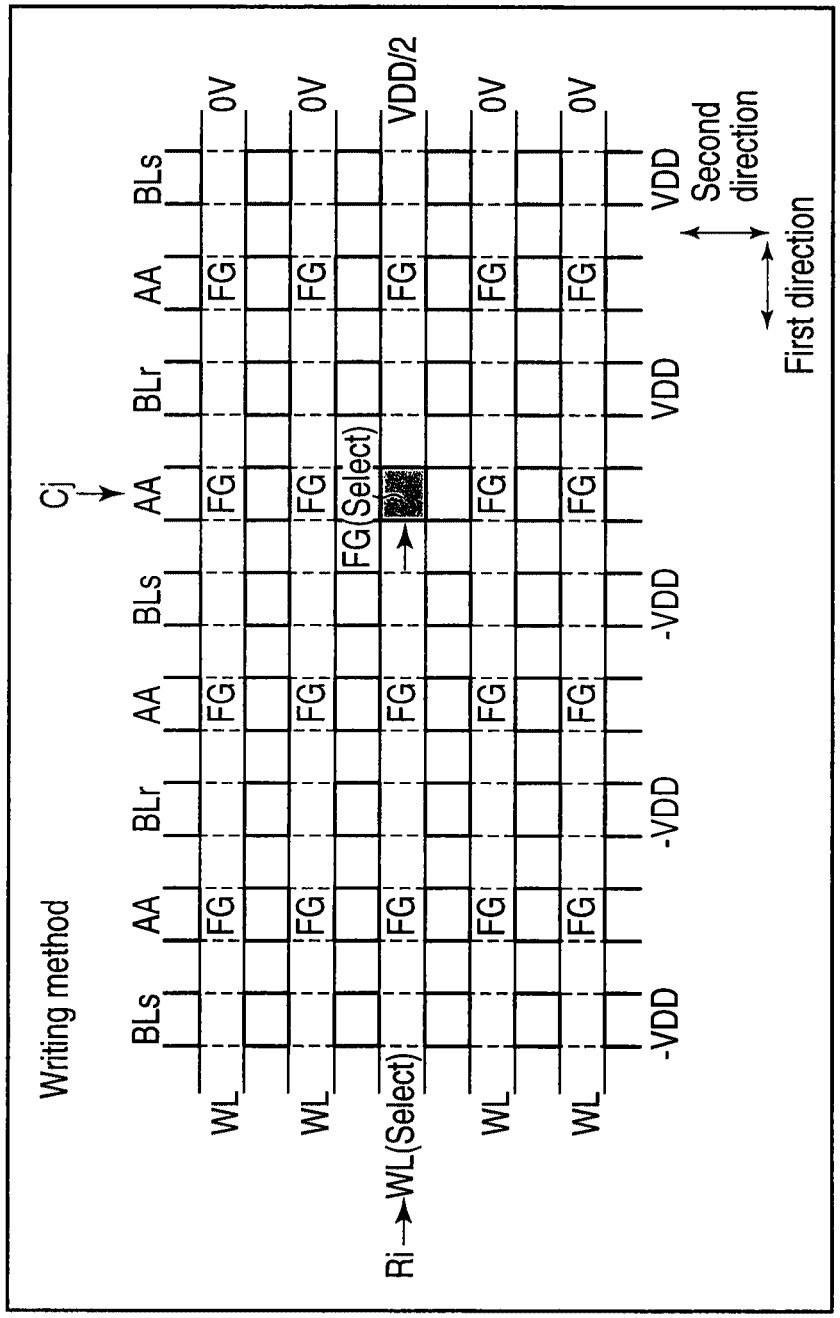
FIG. 24 is a diagram showing a first example of a writing operation.

FIG. 24 shows a first example of the writing operation.

FIG. 24 shows the example in which electrons are injected into one selected floating gate FG (Select) positioned at row address Ri and column address Cj, from bit line BLs existing on the left side thereof.

In this case, bit line BLs on the left side of selected floating gate FB (Select) is set to −VDD, and all bit lines BLs and BLr subsequently existing on the left side thereof are set to −VDD. In addition, bit line BLr on the right side of selected floating gate FG (Select) is set to +VDD, and all bit lines BLs and BLr subsequently existing on the right side thereof are set to +VDD. Word line WL (Select) existing above selected floating gate FG (Select) is set to +VDD/2, and other word lines WL are set to 0V.

In this state, the electrons are injected from bit line BLs on the left side of selected floating gate FG (Select) to selected floating gate FG (Select) as shown by an arrow.

Figure 25:
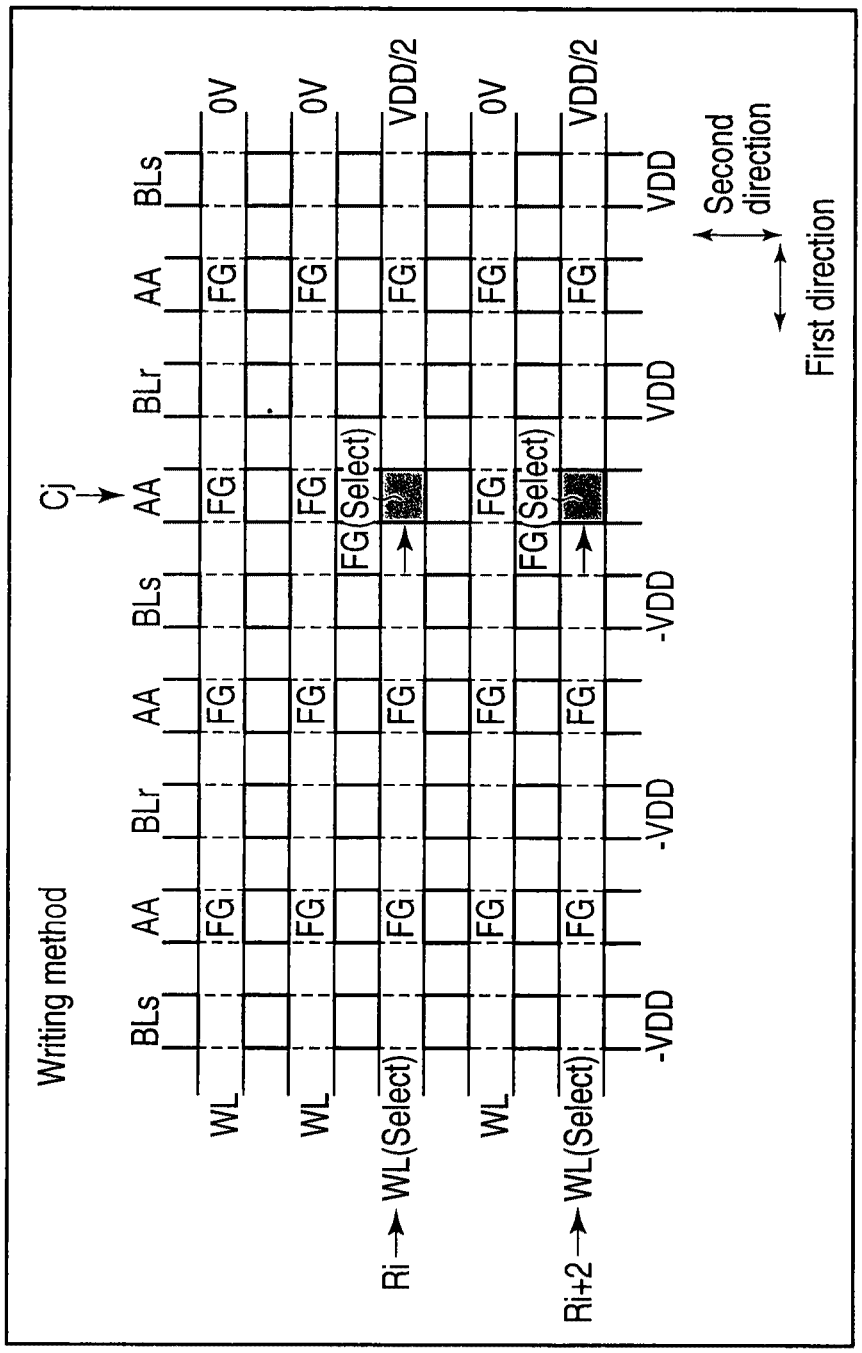
FIG. 25 is a diagram showing a second example of a writing operation.

FIG. 25 shows a second example of the writing operation.

FIG. 25 shows the example in which electrons are injected into two selected floating gates FG (Select) positioned at row addresses Ri and Ri+2, and column address Cj, from bit line BLs existing on the left side thereof.

In this case, two selected floating gates FB (Select) exist at the same column Cj. Therefore, bit line BLs on the left side of selected floating gates FG (Select) is set to −VDD, and all bit lines BLs and BLr subsequently existing on the left side thereof are set to −VDD. In addition, bit line BLr on the right side of selected floating gates FG (Select) is set to +VDD, and all bit lines BLs and BLr subsequently existing on the right side thereof are set to +VDD.

Two word lines WL (Select) existing above two selected floating gates FG (Select) are set to +VDD/2, and other word lines WL are set to 0V.

In this state, the electrons are injected from bit line BLs on the left side of selected floating gates FG (Select) to selected floating gates FG (Select) as shown by arrows.

Figure 26:
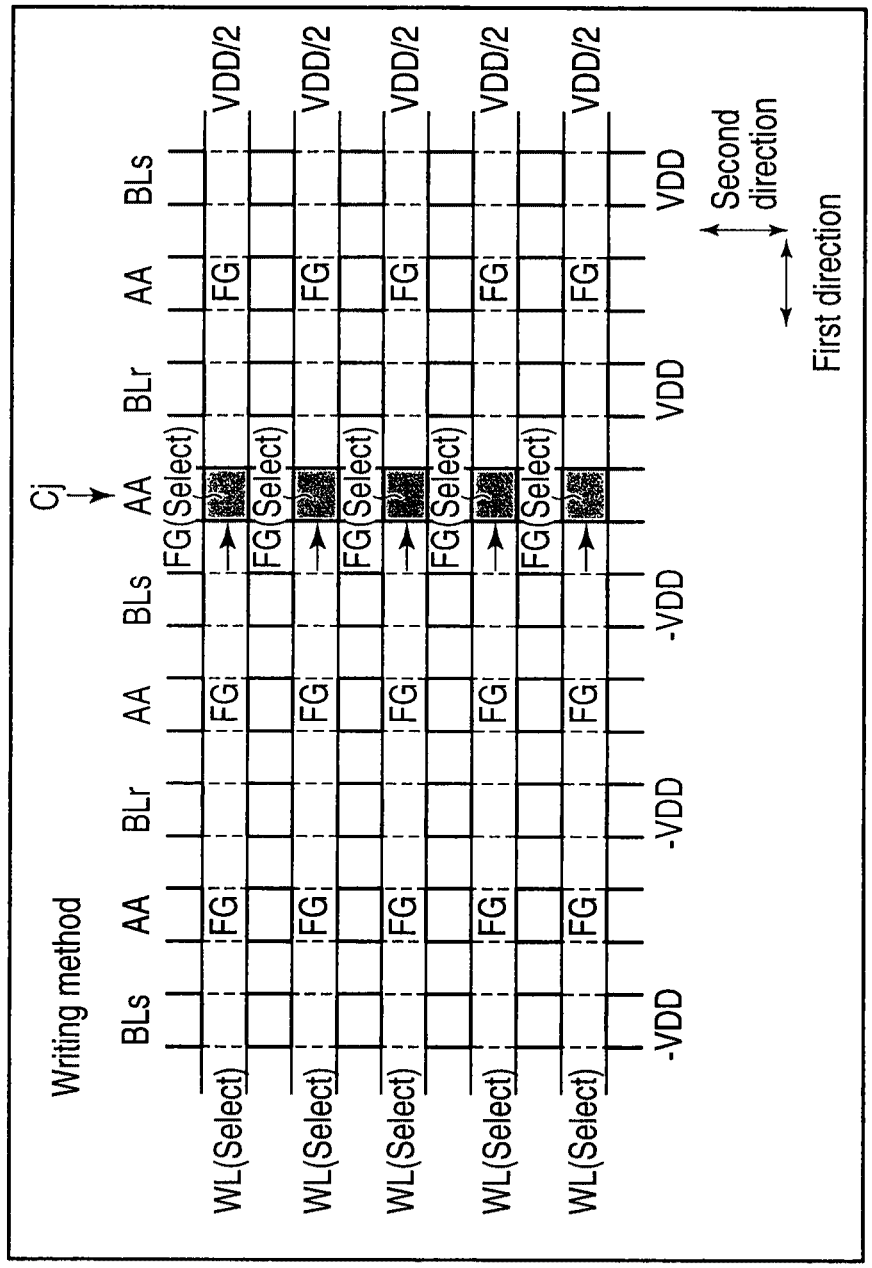
FIG. 26 is a diagram showing a third example of a writing operation.

FIG. 26 shows a third example of the writing operation.

FIG. 26 shows the example in which electrons are injected into all floating gates FG (Select) positioned at column address Cj, from bit line BLs existing on the left side thereof at the same time.

In this case, bit line BLs on the left side of selected floating gates FG (Select) existing at column address Cj is set to −VDD, and all bit lines BLs and BLr subsequently existing on the left side thereof are set to −VDD. In addition, bit line BLr on the right side of selected floating gates FG (Select) exiting at column address Cj is set to +VDD, and all bit lines BLs and BLr subsequently existing on the right side thereof are set to +VDD.

In addition, all word lines WL (Select) are set to +VDD/2.

In this state, the electrons are injected from bit line BLs on the left side of selected floating gates FG (Select) existing at column address Cj into floating gates FG (Select) as shown by arrows.

Figure 27:
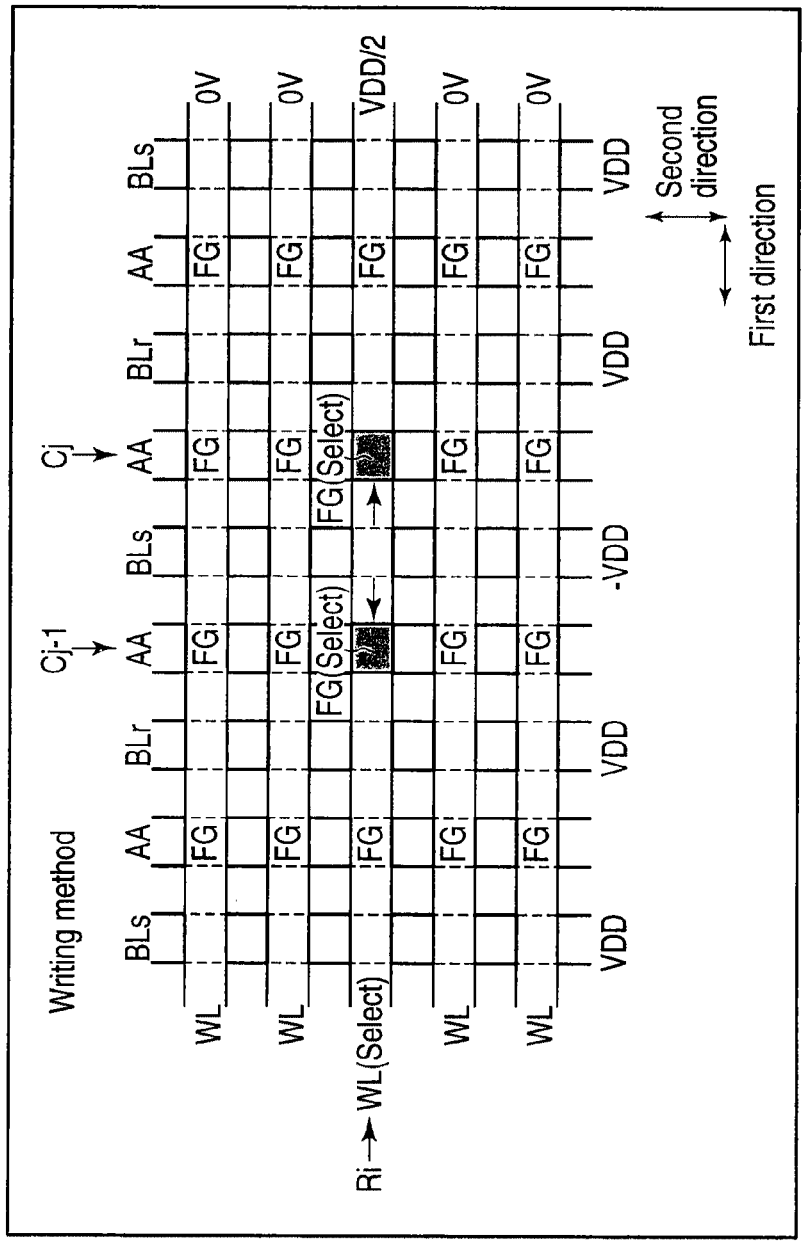
FIG. 27 is a diagram showing a fourth example of a writing operation.

FIG. 27 shows a fourth example of the writing operation.

FIG. 27 shows the example in which electrons are injected into two selected floating gates FG (Select) positioned at row address Ri, and column addresses Cj−1 and Cj.

More specifically, the electrons are injected from bit line BLs existing between two selected floating gates FG (Select) to these floating gates FG (Select).

In this case, bit line BLs existing between two selected floating gates FG (Select) is set to −VDD, and other bit lines BLs and BLr are set to +VDD.

Word line WL (Select) existing above two selected floating gates FG (Select) is set to +VDD/2, and other word lines WL are set to 0V.

In this state, the electrons are injected from bit line BLs existing between two selected floating gates FG (Select) to two selected floating gates FG (Select) as shown by arrows.

Figure 28:
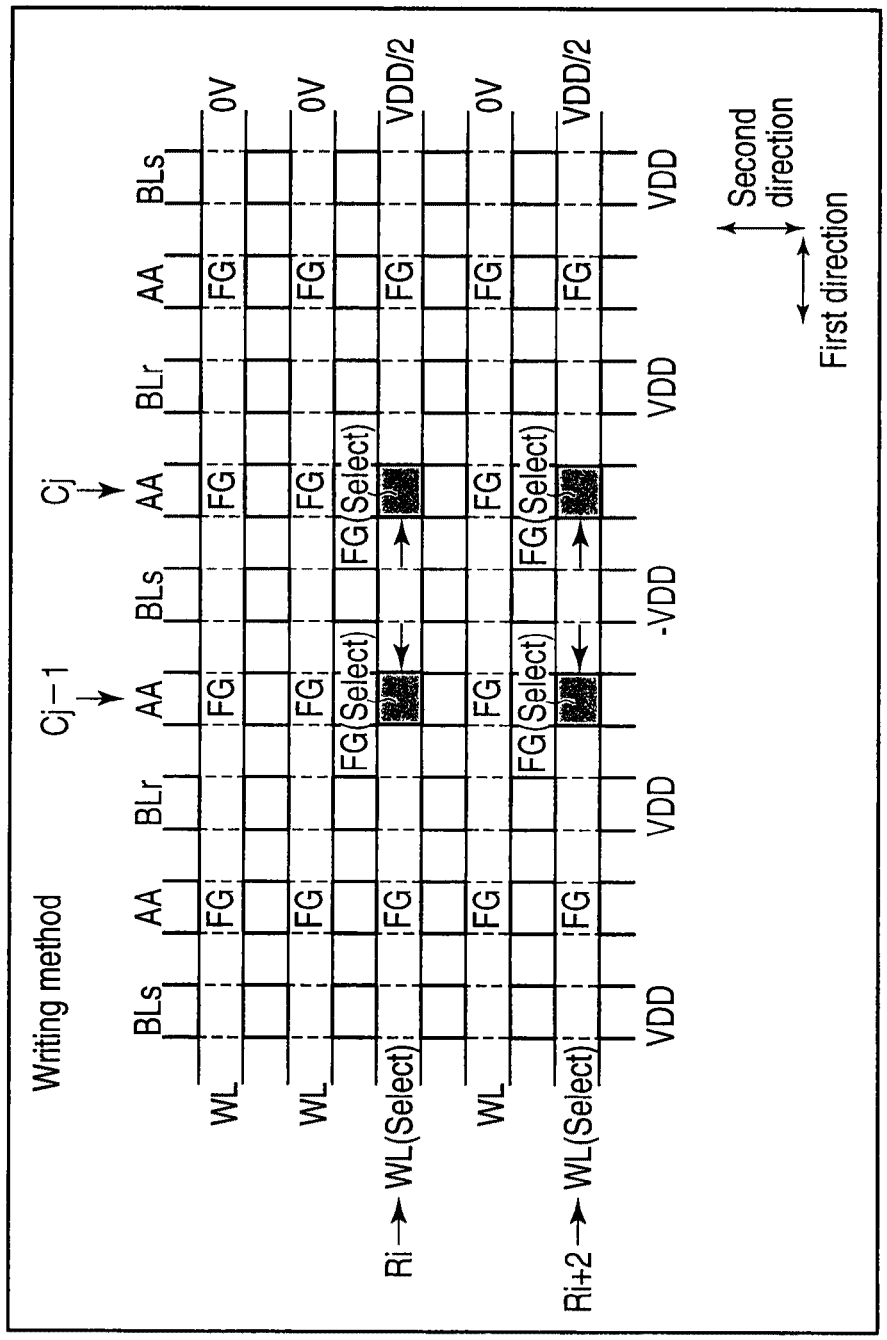
FIG. 28 is a diagram showing a fifth example of a writing operation.

FIG. 28 shows a fifth example of the writing operation.

FIG. 28 shows the example in which electrons are injected into four selected floating gates FG (Select) positioned at row addresses Ri and Ri+2, and column addresses Cj−1 and Cj.

More specifically, the electrons are injected from bit line BLs existing between four selected floating gates FG (Select) to these floating gates FG (Select).

In this case, bit line BLs existing between four selected floating gates FG (Select) is set to −VDD, and other bit lines BLs and BLr are set to +VDD.

Two word lines WL (Select) existing above four selected floating gates FG (Select) are set to +VDD/2, and other word lines WL are set to 0V.

In this state, the electrons are injected from bit line BLs existing between four selected floating gates FG (Select) to four selected floating gates FG (Select) as shown by arrows.

FIG. 29 shows a sixth example of the writing operation.

FIG. 29 shows the example in which electrons are injected into all floating gates FG (Select) positioned at column addresses Cj−1 and Cj at the same time from bit line BLs existing between column addresses Cj−1 and Cj.

In this case, bit line BLs existing between column addresses Cj−1 and Cj is set to −VDD, and other bit lines BLs and BLr are set to +VDD.

In addition, all word lines WL (Select) are set to +VDD/2.

In this state, the electrons are injected from bit line BLs existing between column addresses Cj−1 and Cj to floating gates FG (Select) positioned at column addresses Cj−1 and Cj as shown by arrows.

FIG. 30 shows a seventh example of the writing operation.

FIG. 30 shows the example in which electrons are injected into four selected floating gates FG (Select) positioned at row address Ri, and column addresses Cj−2, Cj−1, Cj, and Cj+1.

More specifically, the electrons are injected from bit line BLs existing between column addresses Cj−1 and Cj to floating gates FG (Select) at column addresses Cj−1 and Cj, the electrons are injected from bit line BLs on the left side of column address Cj−2 to floating gate FG (Select) at column address Cj−2, and the electrons are injected from bit line BLs on the right side of column address Cj+1 to floating gates FG (Select) at column addresses Cj+1.

In this case, bit line BLs existing between column addresses Cj−1 and Cj, bit line BLs on the left side of column address Cj−2, and bit line BLs on the right side of column address Cj+1 are set to −VDD, and other bit lines BLr are set to +VDD.

Word line WL (Select) existing above four selected floating gates FG (Select) is set to +VDD/2, and other word lines WL are set to 0V.

In this state, the electrons are injected from bit line BLs existing between column addresses Cj−1 and Cj into floating gates FG (Select) at column addresses Cj−1 and Cj as shown by arrows.

In addition, the electrons are injected from bit line BLs on the left side of column address Cj−2 to floating gate FG (Select) at column address Cj−2, and from bit line BLs on the right side of column address Cj+1 into floating gate FG (Select) at the column address Cj+1.

FIG. 31 shows an eighth example of the writing operation.

FIG. 31 shows the example in which electrons are injected into eight selected floating gates FG (Select) positioned at row addresses Ri and Ri+2, and column addresses Cj−2, Cj−1, Cj, and Cj+1.

More specifically, the electrons are injected from bit line BLs existing between column addresses Cj−1 and Cj to floating gates FG (Select) at column addresses Cj−1 and Cj, the electrons are injected from bit line BLs on the left side of column address Cj−2 to floating gate FG (Select) at column address Cj−2, and the electrons are injected from bit line BLs on the right side of column address Cj+1 to floating gate FG (Select) at column address Cj+1.

In this case, bit line BLs existing between column addresses Cj−1 and Cj, bit line BLs on the left side of column address Cj−2, and bit line BLs on the right side of column address Cj+1 are set to −VDD, and other bit lines BLr are set to +VDD.

Two word line WL (Select) existing above eight selected floating gates FG (Select) are set to +VDD/2, and other word lines WL are set to 0V.

In this state, the electrons are injected from bit line BLs existing between column addresses Cj−1 and Cj into floating gates FG (Select) at column addresses Cj−1 and Cj as shown by arrows.

In addition, the electrons are injected from bit line BLs on the left side of column address Cj−2 to floating gate FG (Select) at column address Cj−2, and from bit line BLs on the right side of column address Cj+1 into floating gate FG (Select) at column address Cj+1.

FIG. 32 shows a ninth example of the writing operation.

FIG. 32 shows the example in which electrons are injected from bit lines BLs to all floating gates FG (Select) at the same time.

In this case, all bit lines (charge serving-only line) BLs are set to −VDD, and all bit lines (charge receiving-only line) BLr are set to +VDD.

In addition, all word lines WL (select) are set to +VDD/2.

In this state, the electrons are injected from bit lines BLs to all floating gates FG (Select) as shown by arrows.

(2) Erasing Operation

Next, an example of the erasing operation will be described.

In the following description, bit line BLs means the charge serving-only line, and bit line BLr means the charge receiving-only line.

Figure 33:
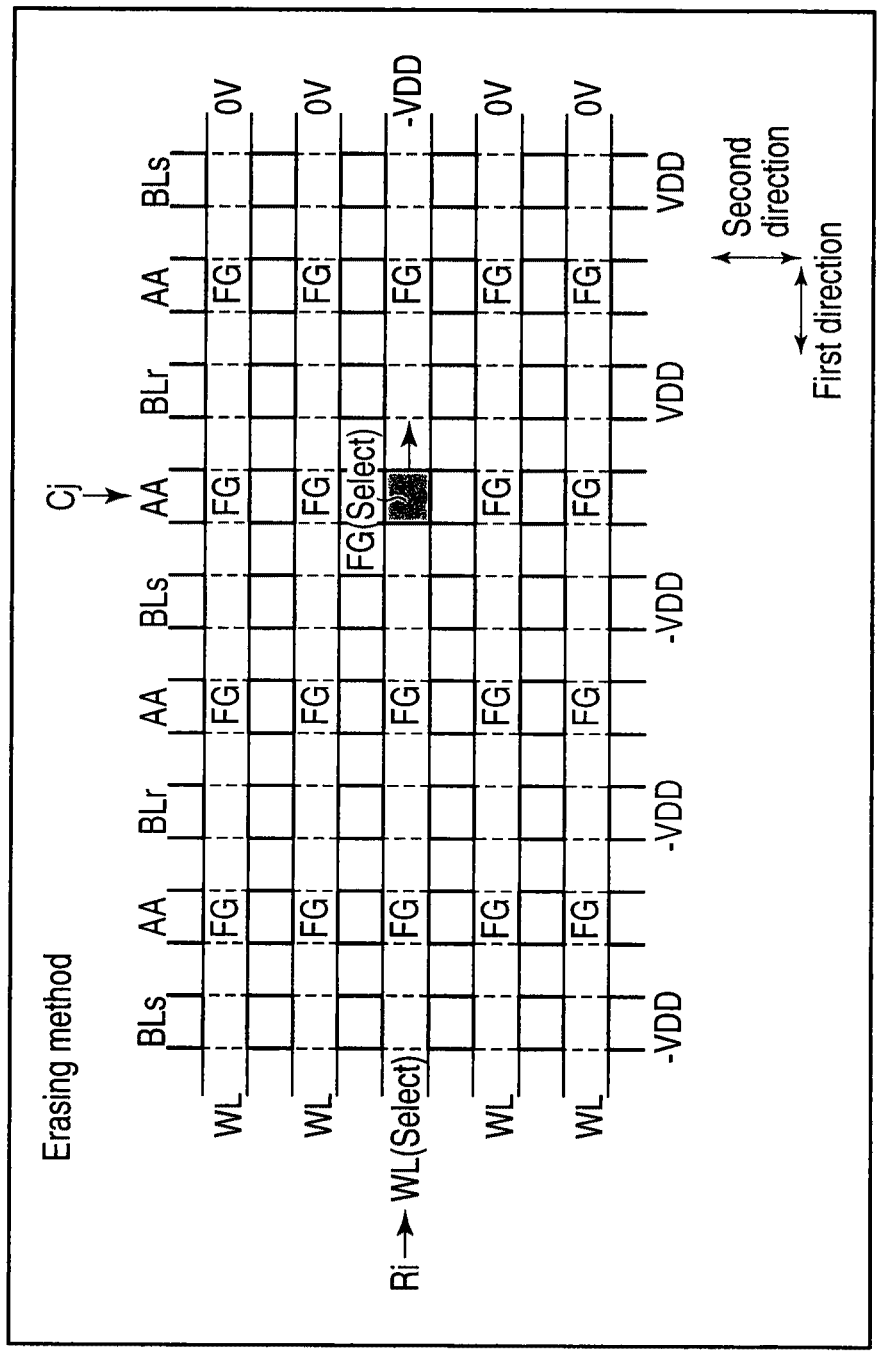
FIG. 33 is a diagram showing a first example of an erasing operation.

FIG. 33 shows a first example of the erasing operation.

FIG. 33 shows the example in which electrons are emitted from one selected floating gate FG (Select) positioned at row address Ri and column address Cj, to bit line BLr existing on the right side thereof.

In this case, bit line BLs on the left side of selected floating gate FG (Select) is set to −VDD, and all bit lines BLs and BLr subsequently existing on the left side thereof are set to −VDD. In addition, bit line BLr on the right side of selected floating gate FG (Select) is set to +VDD, and all bit lines BLs and BLr subsequently existing on the right side thereof are set to +VDD.

Word line WL (Select) existing above selected floating gate FG (Select) is set to −VDD, and other word lines WL are set to 0V.

In this state, the electrons are emitted from selected floating gate FG (Select) to bit line BLs on the right side thereof as shown by an arrow.

Figure 34:
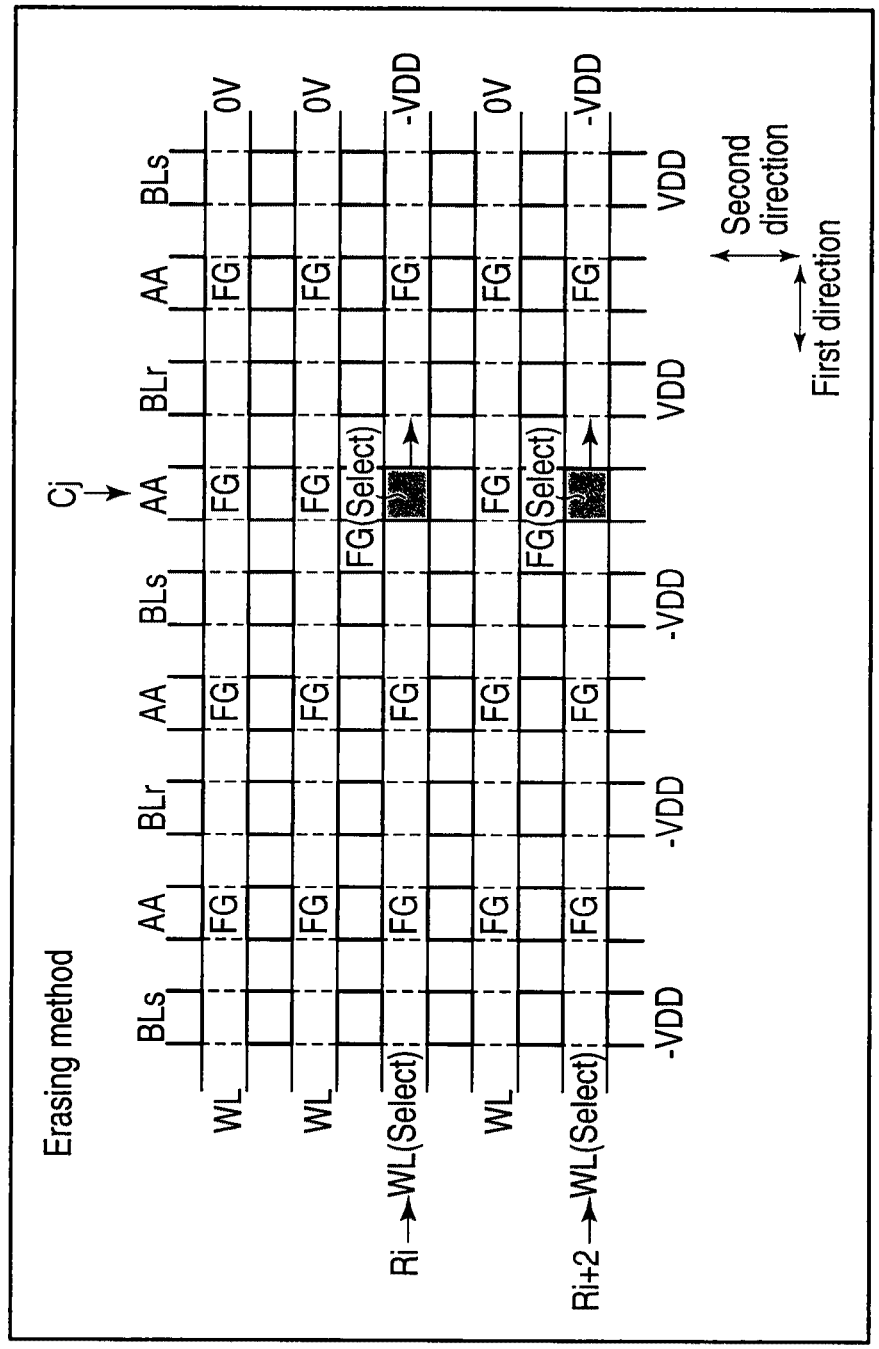
FIG. 34 is a diagram showing a second example of an erasing operation.

FIG. 34 shows a second example of the erasing operation.

FIG. 34 shows the example in which electrons are emitted from two selected floating gates FG (Select) positioned at row addresses Ri and Ri+2, and column address Cj, to bit line BLr existing on the right side thereof.

In this case, two selected floating gates FG (Select) exist at the same column Cj. Therefore, bit line BLs on the left side of selected floating gates FG (Select) is set to −VDD, and all bit lines BLs and BLr subsequently existing on the left side thereof are set to −VDD. In addition, bit line BLr on the right side of selected floating gates FG (Select) is set to +VDD, and all bit lines BLs and BLr subsequently existing on the right side thereof are set to +VDD.

Two word lines WL (Select) existing above two selected floating gates FG (Select) are set to −VDD, and other word lines WL are set to 0V.

In this state, the electrons are emitted from selected floating gates FG (Select) to bit line BLr on the right side thereof as shown by arrows.

Figure 35:
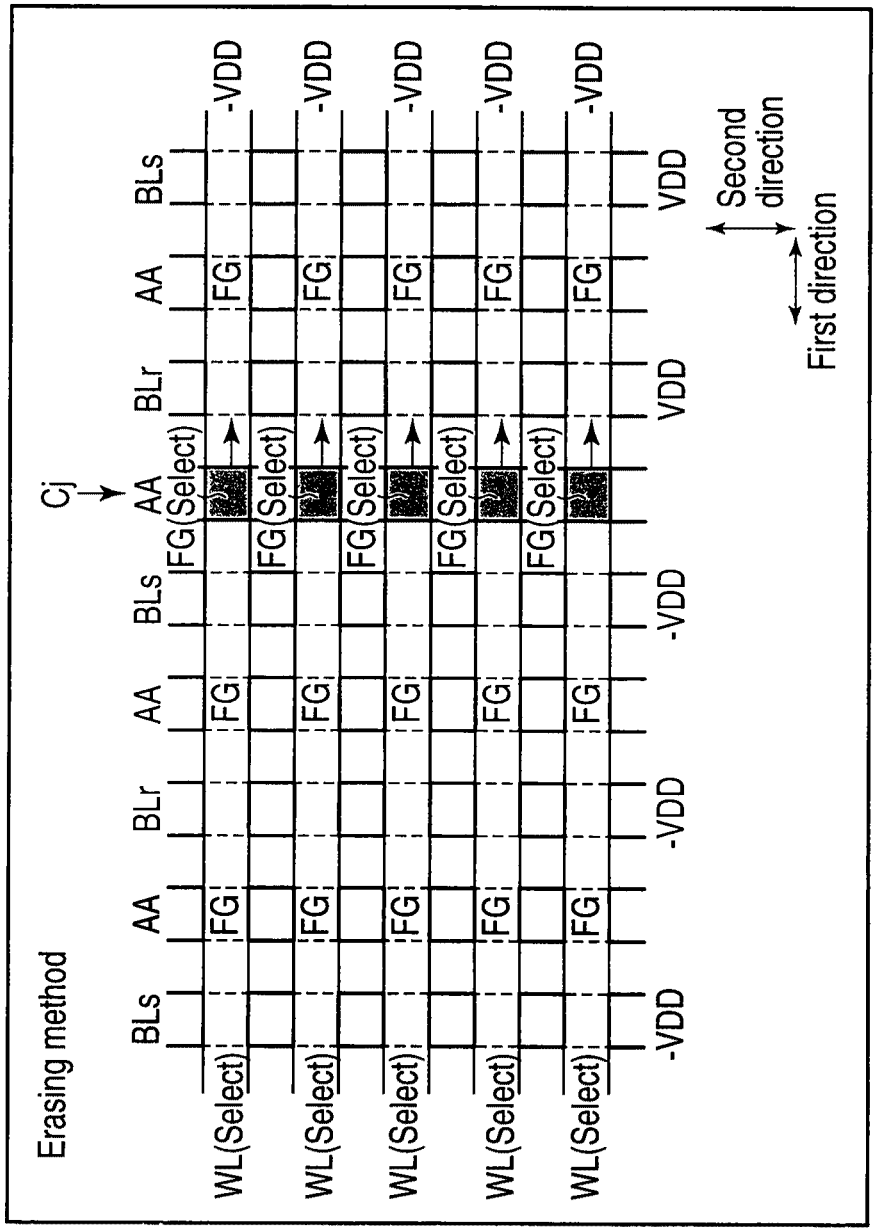
FIG. 35 is a diagram showing a third example of an erasing operation.

FIG. 35 shows a third example of the erasing operation.

FIG. 35 shows the example in which electrons are emitted from all floating gates FG (Select) positioned at column address Cj to bit line BLr existing on the right side thereof at the same time.

In this case, bit line BLs on the left side of floating gates FG (Select) existing at column address Cj is set to −VDD, and all bit lines BLs and BLr subsequently existing on the left side thereof are set to −VDD. In addition, bit line BLr on the right side of floating gates FG (Select) at column address Cj is set to +VDD, and all bit lines BLs and BLr subsequently existing on the right side thereof are set to +VDD.

In addition, all word lines WL (Select) are set to −VDD.

In this state, the electrons are emitted from floating gates FG (Select) at column address Cj to the bit line BLr existing on the right side thereof as shown by arrows.

Figure 36:
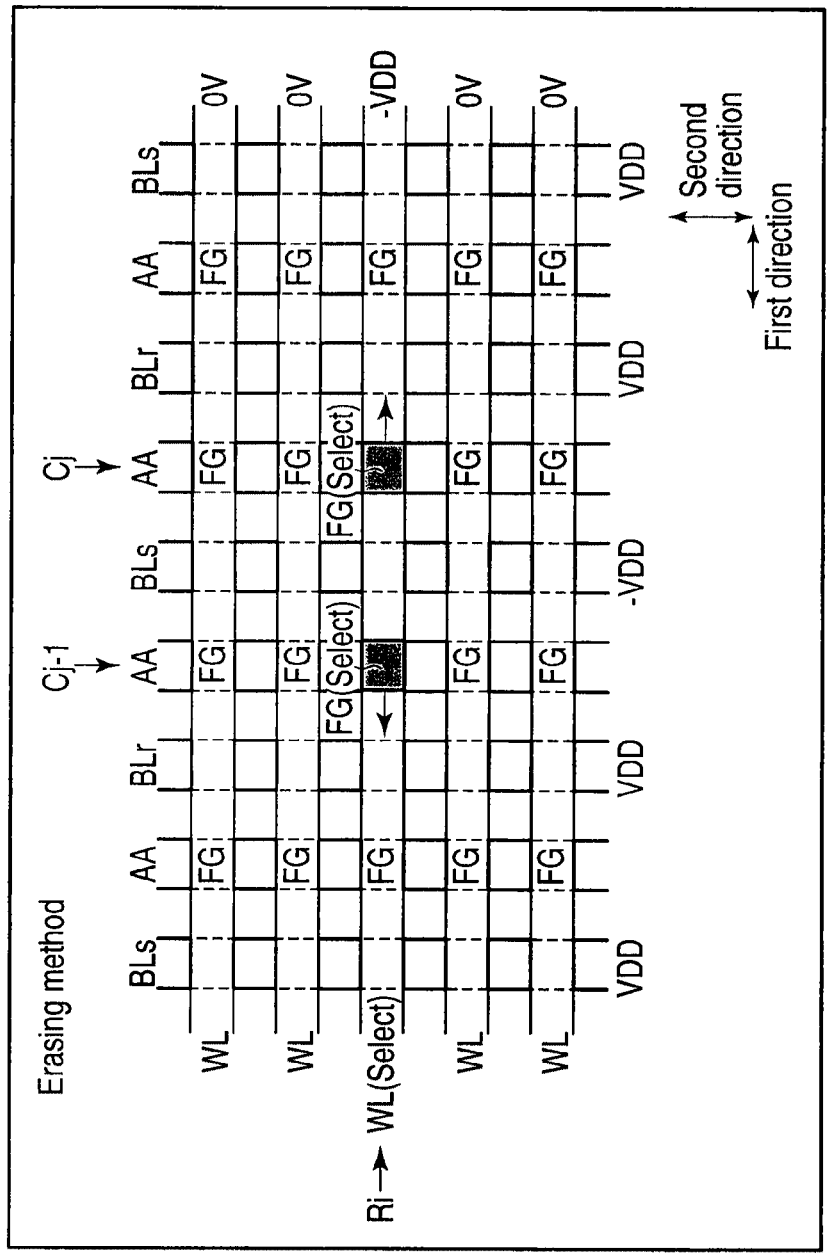
FIG. 36 is a diagram showing a fourth example of an erasing operation.

FIG. 36 shows a fourth example of the erasing operation.

FIG. 36 shows the example in which electrons are emitted from two selected floating gates FG (Select) positioned at row address Ri, and column addresses Cj−1 and Cj.

In this case, bit line BLs existing between two selected floating gates FG (Select) is set to −VDD, and other bit lines BLs and BLr are set to +VDD.

Word line WL (Select) existing above two selected floating gates FG (Select) is set to −VDD, and other word lines WL are set to 0V.

In this state, the electrons are emitted from two selected floating gates FG (Select) to bit lines BLs on the right and left sides of two selected floating gates FG (Select) as shown by arrows.

Figure 37:
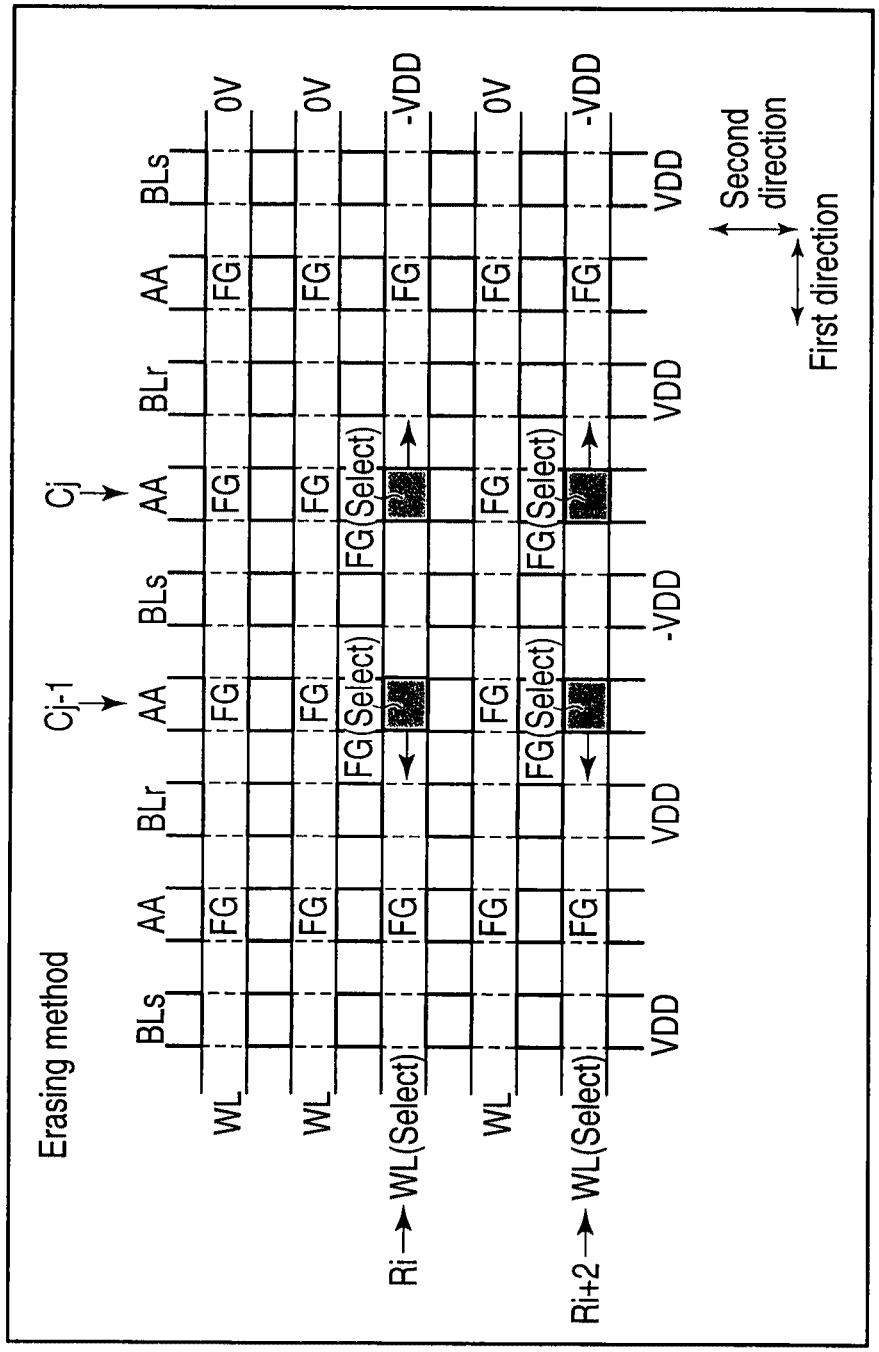
FIG. 37 is a diagram showing a fifth example of an erasing operation.

FIG. 37 shows a fifth example of the erasing operation.

FIG. 37 shows the example in which electrons are emitted from four selected floating gates FG (Select) positioned at row addresses Ri and Ri+2, and column addresses Cj−1 and Cj.

In this case, bit line BLs existing between four selected floating gates FG (Select) is set to −VDD, and other bit lines BLs and BLr are set to +VDD.

Two word lines WL (Select) existing above four selected floating gates FG (Select) are set to −VDD, and other word lines WL are set to 0V.

In this state, the electrons are emitted from four selected floating gates FG (Select) to bit lines BLr existing on the right and left sides of four selected floating gates FG (Select) as shown by arrows.

Figure 38:
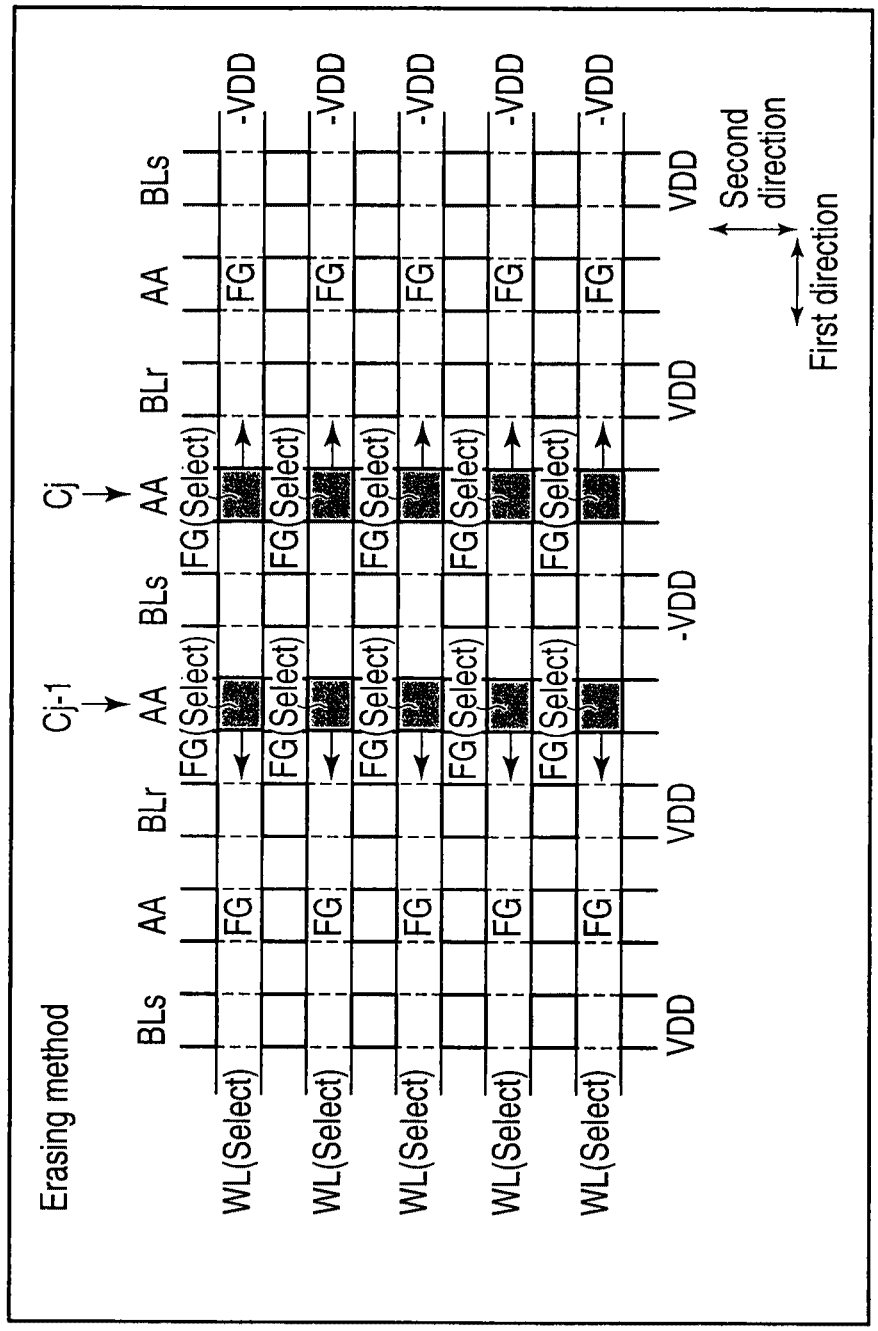
FIG. 38 is a diagram showing a sixth example of an erasing operation.

FIG. 38 shows a sixth example of the erasing operation.

FIG. 38 shows the example in which electrons are emitted from all floating gates FG (Select) positioned at column addresses Cj−1 and Cj at the same time.

In this case, bit line BLs existing between column addresses Cj−1 and Cj is set to −VDD, and other bit lines BLs and BLr are set to +VDD.

In addition, all word lines WL (Select) are set to −VDD.

In this state, the electrons are emitted from floating gates FG (Select) existing at column addresses Cj−1 and Cj to bit lines BLr existing at the right and left sides of these floating gates FG (Select) as shown by arrows.

FIG. 39 shows a seventh example of the erasing operation.

FIG. 39 shows the example in which electrons are emitted from four selected floating gates FG (Select) positioned at row address Ri, and column addresses Cj−2, Cj−1, Cj, and Cj+1.

In this case, bit line BLs existing between column addresses Cj−1 and Cj, bit line BLs on the left side of column address Cj−2, and bit line BLs on the right side of column address Cj+1 are set to −VDD, and other bit lines BLr are set to +VDD.

Word line WL (Select) existing above four selected floating gates FG (Select) are set to −VDD, and other word lines WL are set to 0V.

In this state, the electrons are emitted from floating gates FG (Select) existing at column addresses Cj−2, Cj−1, Cj and Cj+1 to bit lines BLs existing on the right side and left side thereof as shown by arrows.

Figure 40:
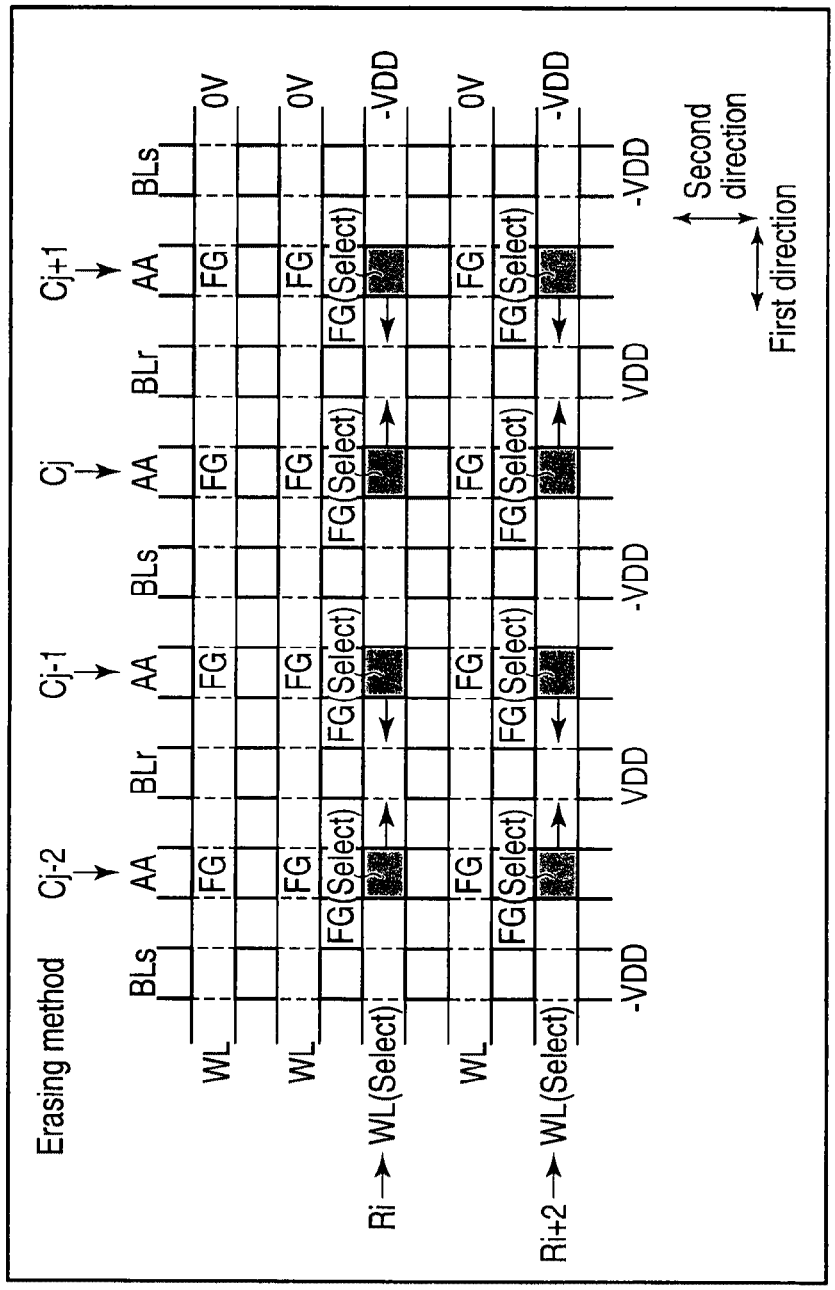
FIG. 40 is a diagram showing an eighth example of an erasing operation.

FIG. 40 shows an eighth example of the erasing operation.

FIG. 40 shows the example in which electrons are emitted from eight selected floating gates FG (Select) positioned at row addresses Ri and Ri+2, and column addresses Cj−2, Cj−1, Cj, and Cj+1.

In this case, bit line BLs existing between column addresses Cj−1 and Cj, bit line BLs on the left side of column address Cj−2, and bit line BLs on the right side of column address Cj+1 are set to −VDD, and other bit lines BLr are set to +VDD.

Two word lines WL (Select) existing above eight selected floating gates FG (Select) are set to −VDD, and other word lines WL are set to 0V.

In this state, the electrons are emitted from floating gates (Select) at column addresses Cj−2, Cj−1, Cj, and Cj+1 to bit lines BLr existing on the right side and left side thereof as shown by arrows.

Figure 41:
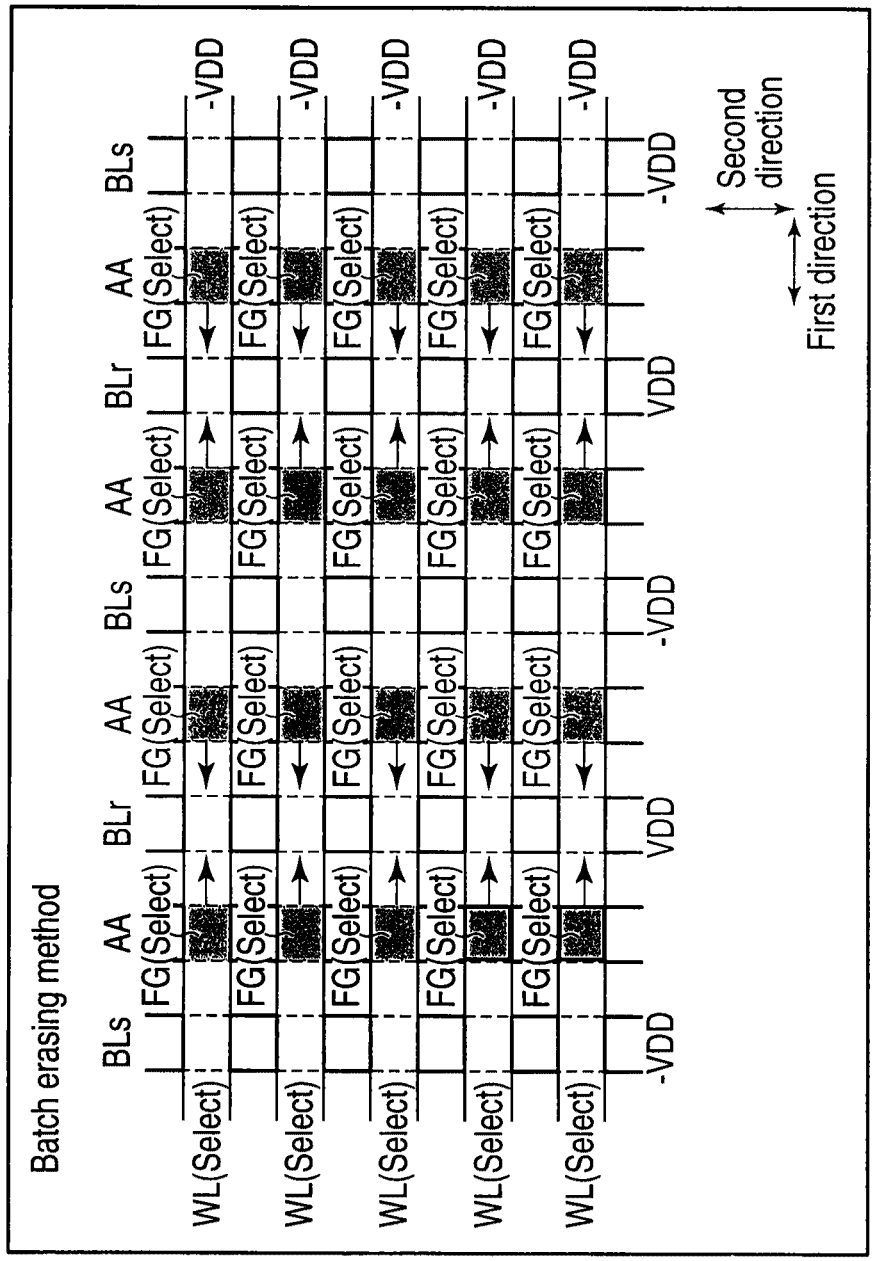
FIG. 41 is a diagram showing a ninth example of an erasing operation.

FIG. 41 shows a ninth example of the erasing operation.

FIG. 41 shows the example in which electrons are emitted from all floating gates FG (Select) to bit lines BLr at the same time.

In this case, all bit lines (charge serving-only line) BLs are set to −VDD, and all bit lines (charge receiving-only line) BLr are set to +VDD.

In addition, all word lines WL (Select) are set to −VDD.

In this state, the electrons are emitted from all floating gates FG (Select) to bit lines BLs as shown by arrows.

(3) Bias Conditions at the Time of Writing/Erasing

Figure 42:
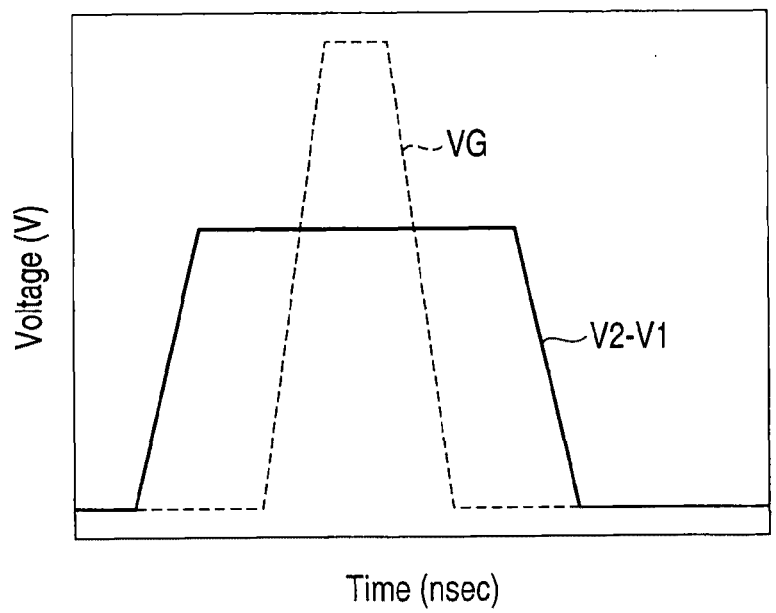
FIG. 42 is a diagram showing a timing that a gate potential is supplied.

FIG. 42 shows an example of bias conditions at the time of writing/erasing.

In this drawing, potential VG designates a gate potential, and potential V2-V1 designates a voltage between bit line (charge receiving-only line) BLr and bit line (charge serving-only line) BLs.

This is characterized in that the potential is applied to bit lines BLs and BLr and then the gate potential is applied to selected word line WL.

For example, at the time of writing, potential V2-V1 is raised from 0V to 3V and then VG is raise from 0V to 5V. In this state, the writing is carried out. Alternatively, potential VG is lowered from 5V to 0V and then potential V2-V1 is lowered from 3V to 0V.

Figure 43:
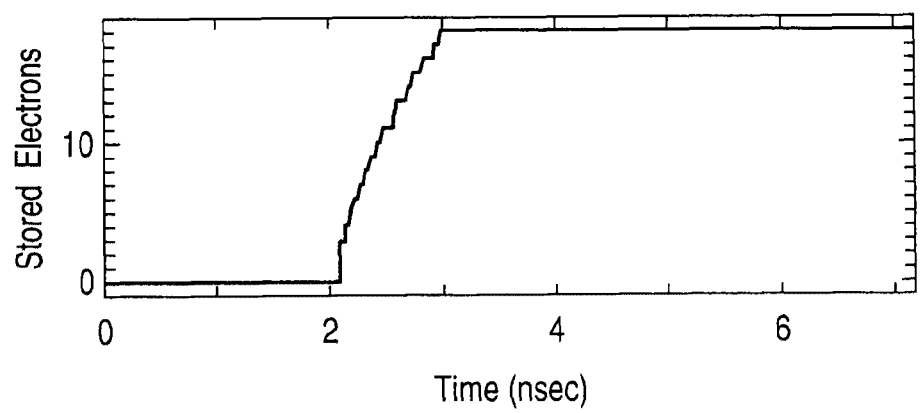
FIG. 43 is a diagram showing an increase of a charge amount in a floating gate.

FIG. 43 shows a writing simulation under the bias conditions in FIG. 42.

In this drawing, a time is plotted on a lateral axis, and the number of electrons stored in the floating gate is plotted on a vertical axis.

Before the gate potential is applied (0-2 nsec), the electron is not injected into the floating gate. While gate potential VG is raised from 2 nsec to 3 nsec, the electrons are injected into the floating gate one by one as potential VG is raised.

Thus, the phenomenon in which the electrons are injected one by one shows that the writing is performed by use of a monoelectron effect in this cell structure. Here, it is to be noted that the size of the floating gate used in this simulation is 5 nm×5 nm×5 nm.

(4) Data Retention Characteristic

Figure 44:
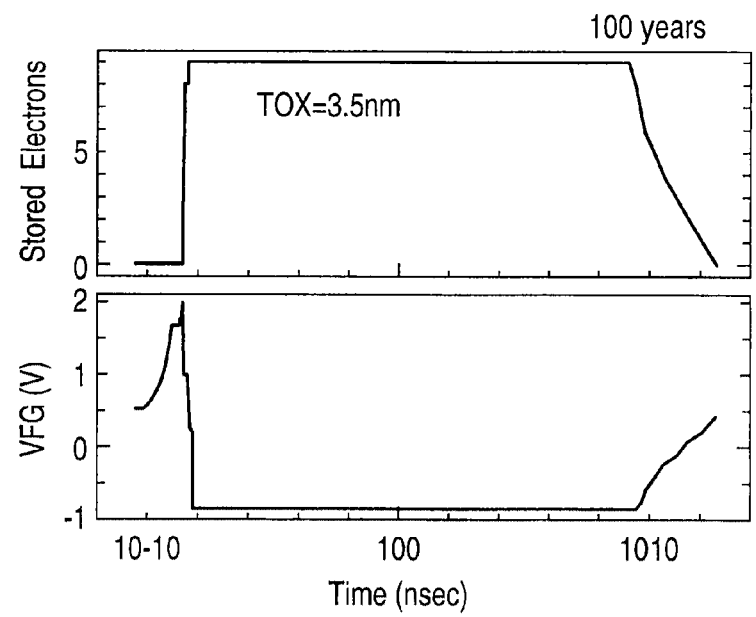
FIG. 44 is a diagram showing a charge retention characteristic.

FIG. 44 shows an electron retention characteristic (data retention characteristic).

The electron retention characteristic is an index showing how long the electrons injected into the floating gate can be retained.

According to this cell structure, when thickness Tox of the tunnel insulating film is 3.5 nm, a certain amount of charges can be kept retained in the floating gate for about 100 years. Here, it is to be noted that this is estimated under the condition that a charge trap is not generated in the tunnel insulating film.

Thus, a description will be made of the charge retention characteristic when the charge trap is generated in the tunnel insulating film, in the writing/erasing methods in the cell structure according to the present invention.

Figure 45:
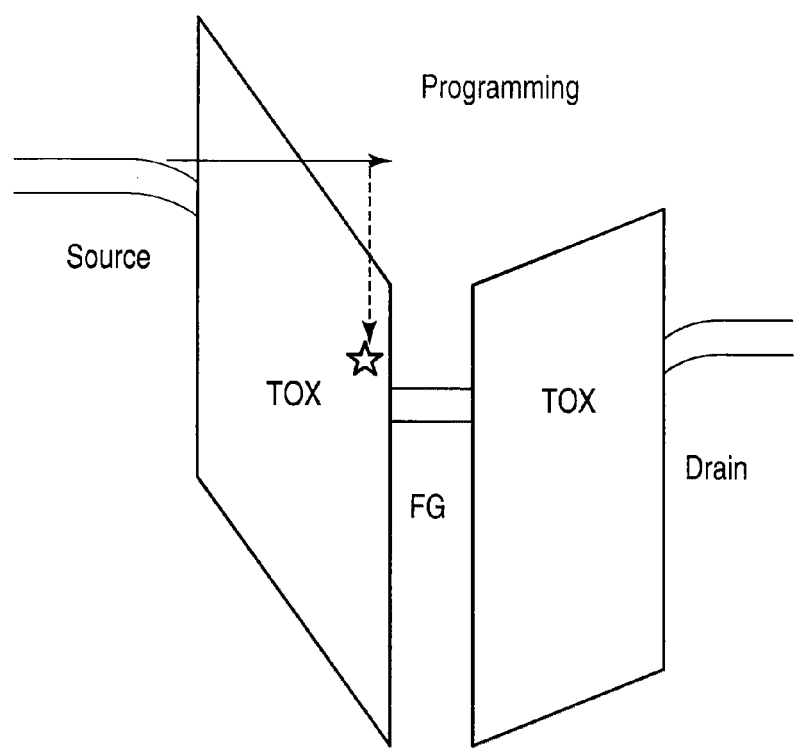
FIG. 45 is a diagram showing a charge trap in a writing operation.

FIG. 45 shows a mechanism of charge trap generation at the time of writing. FIG. 46 shows a mechanism of charge trap generation at the time of erasing.

General non-volatile semiconductor memories use the same tunnel insulating film at the time of writing/erasing. Therefore, a trap level is generated on each side of the tunnel insulating film. When it is assumed that the trap level is generated within a range of 25% of the whole thickness on each side of the tunnel insulating film, a part which functions as the tunnel insulating film actually is about 50% of the whole thickness of the tunnel insulating film.

Meanwhile, the multi-dot flash memory according to the present invention is characterized in that the tunnel insulating film used at the time of writing and the tunnel insulating film used at the time of erasing are different from each other as described above.

In this case, as shown in FIG. 45, the trap level is generated only on one side of the tunnel insulating film used at the time of writing. Therefore, when it is assumed that the trap level is generated within a range of 25% of the whole thickness on one side of the tunnel insulating film, a part functioning as the tunnel insulating film actually is 75% of the whole thickness of the tunnel insulating film.

Similarly, as shown in FIG. 46, the trap level is generated only on one side of the tunnel insulating film used at the time of erasing. Therefore, when it is assumed that the trap level is generated within a range of 25% of the whole thickness on one side of the tunnel insulating film, a part functioning as the tunnel insulating film actually is 75% of the whole thickness of the tunnel insulating film.

Consequently, according to the cell structure in the present invention, since the part functioning as the tunnel insulating film actually can be increased as compared with the cell structure of the general nonvolatile semiconductor memory, it has the advantage in thinning the tunnel insulating film.

In addition, since the gate insulating film and the tunnel insulating film are completely separated, the threshold window is not narrowed even after repeating the writing/erasing.

In addition, since the memory cell according to the present invention is characterized in that there are two kinds of tunnel insulating film, it is preferable that one tunnel insulating films is used for writing and the other is used for erasing to solve the problem in reliability.

(5) Reading Operation

Next, an example of a reading operation will be described.

Figure 47:
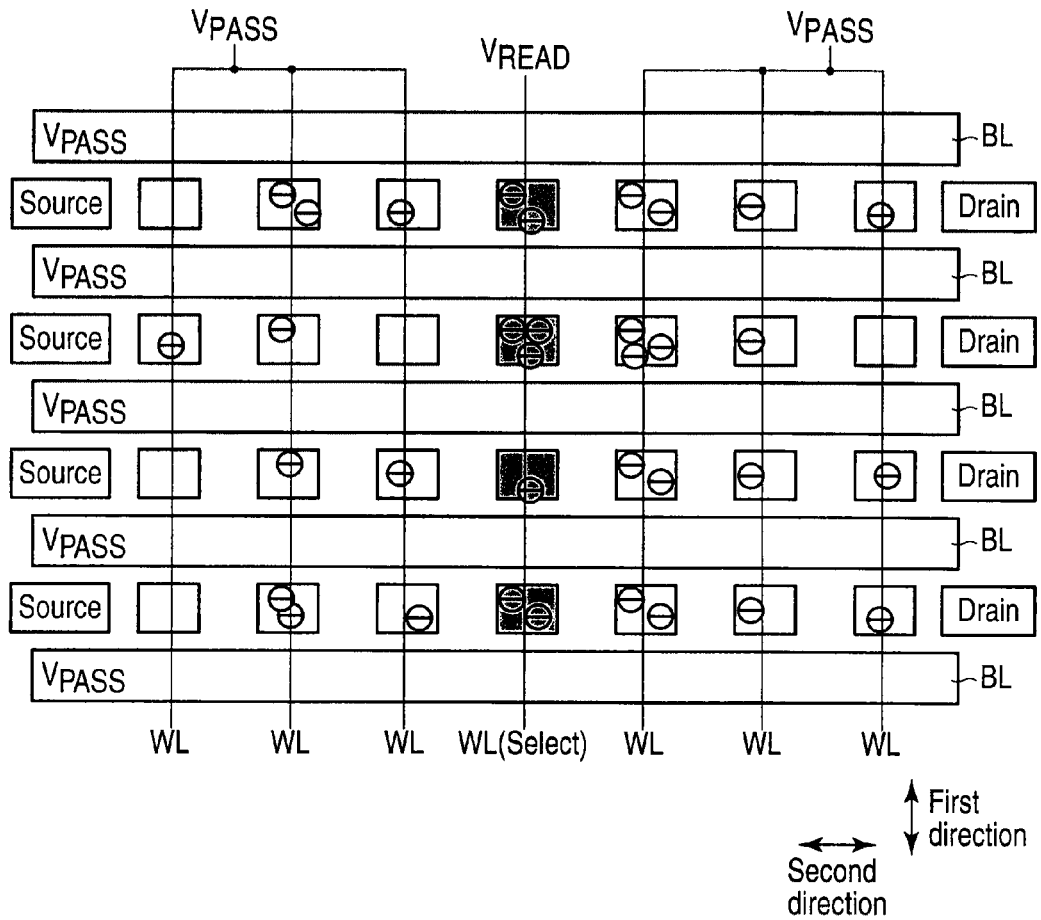
FIG. 47 is a diagram showing an example of a reading operation.

FIG. 47 shows an example of the reading operation.

When data of memory cells aligned in the center, that is, a charge amount stored in the floating gates (gray parts) is read, word line WL (Select) existing above them is set to VREAD, and other word lines WL, . . . are set to VPASS. In addition, bit lines BL, . . . existing on the right and left sides of the floating gates are set to VPASS also.

VREAD is set such that on/off of the memory cell can be determined according to the charge amount in the floating gate, and VPASS is set such that the memory cell is always turned on regardless of the charge amount in the floating gate. For example, their relation is VREAD<VPASS.

In this state, the data of the memory cells aligned in the center can be read by detecting a cell current flowing between a source region (Source) and a drain region (Drain).

Figure 48:
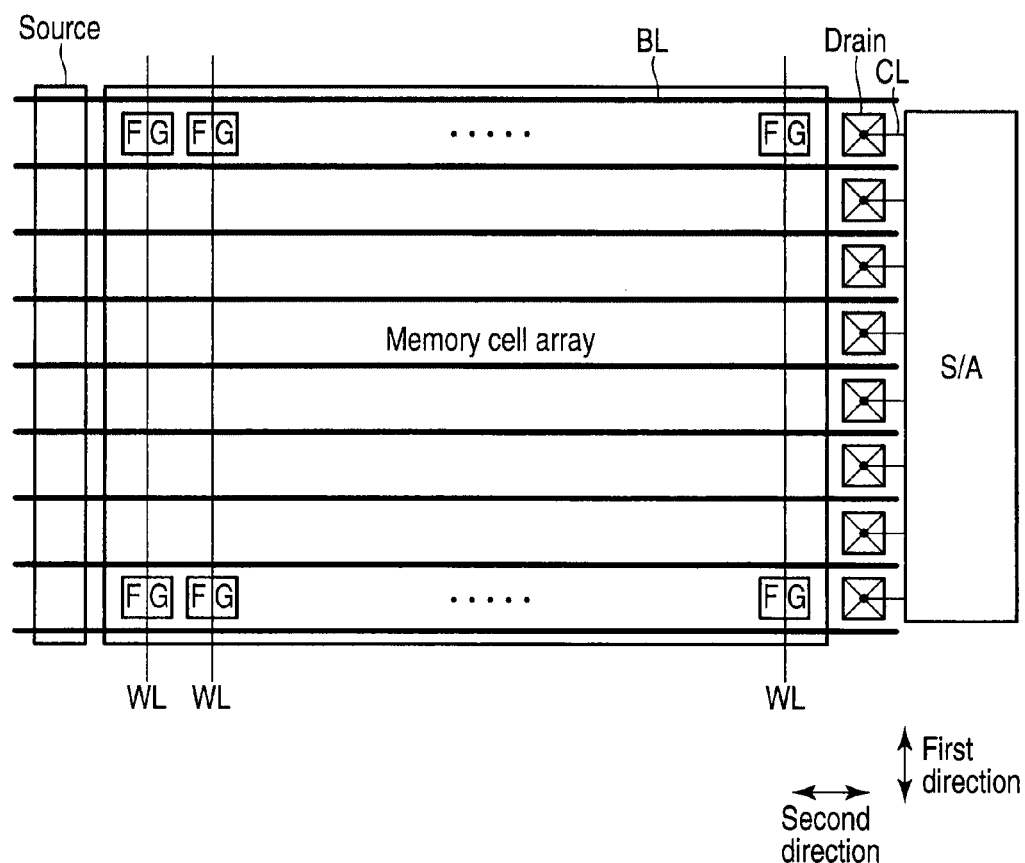
FIGS. 48 and 49 are diagrams, each showing an example of a memory cell array.

Here, when the source region and the drain region are arranged at both ends of the memory cell array as shown in FIG. 48, a conductive line CL to connect the drain region (Drain) and a sense amplifier (S/A), for example is not necessarily arranged in the memory cell array.

In addition, since a select gate transistor is not needed in the memory cell array, the memory cell array can be implemented with the cell structures shown in FIGS. 21A, 21B, 22A, and 22B, for example.

However, in order to increase the capacity of the memory cell array, a great number of memory cells have to be connected between the source region and the drain region. In this case, the resistance between the source region and the drain region is increased at the time of reading, which causes sensitivity to be lowered.

Figure 49:
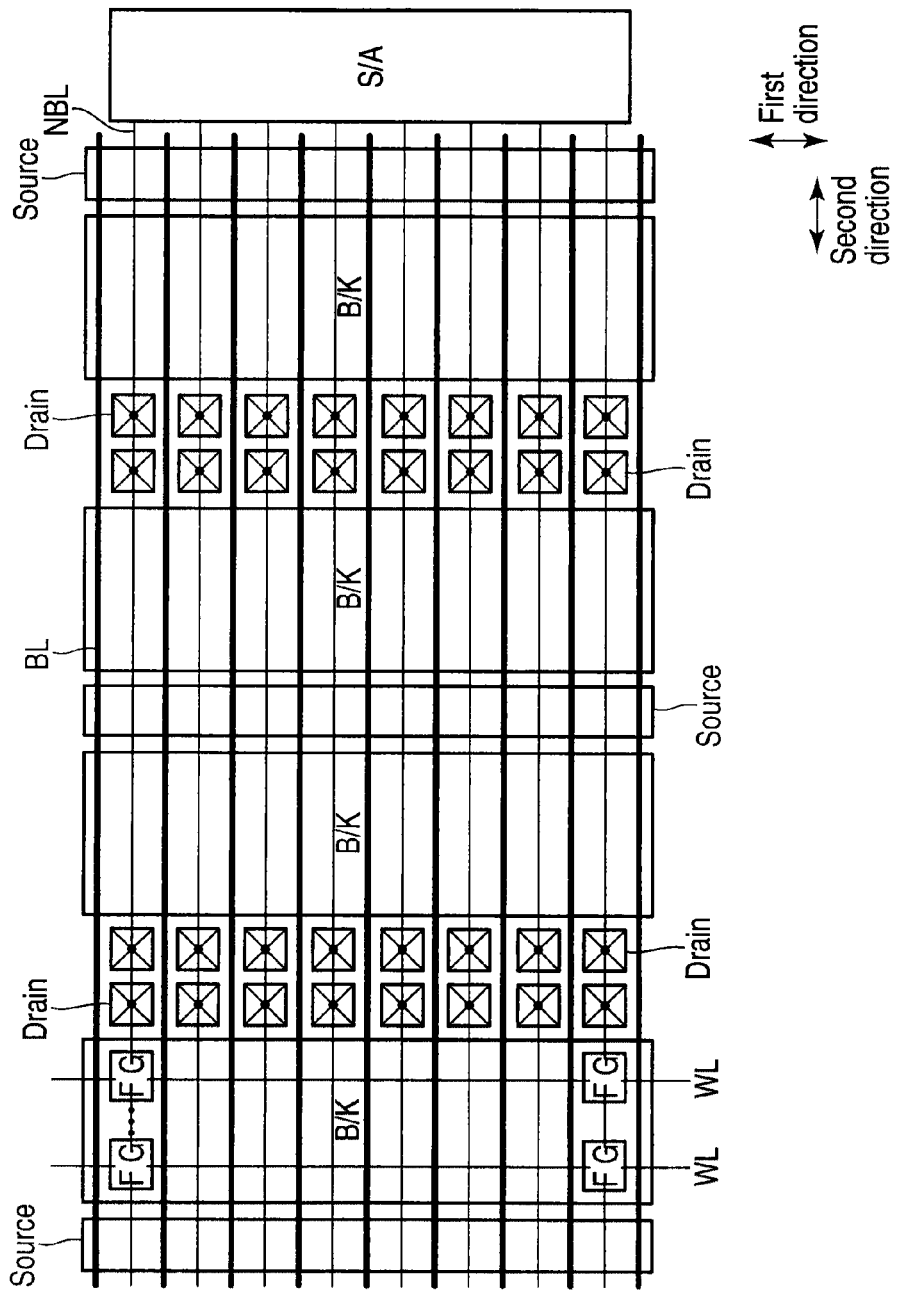

Thus, as shown in FIG. 49, the memory cell array may be divided into blocks. In this case, similar to the NAND type flash memory, new bit lines (conductive line) NBL, . . . extend in a second direction through blocks BK, . . . in the memory cell array. This new bit line NBL connects the drain regions (Drain) in blocks BK, . . . to the sense amplifiers (S/A).

This new bit line NBL is different from bit lines BL existing on the right and left sides of the floating gate.

In addition, when the memory cell array is divided into the blocks as described above, the memory cell array is implemented with the cell structures shown in FIGS. 21C and 22C, for example, because the select gate transistor is needed in the memory cell array.

FIGS. 50A, 50B, 51A and 51B show two different NAND strings taken out of the memory cell array shown in FIG. 47.

Figure 51A:
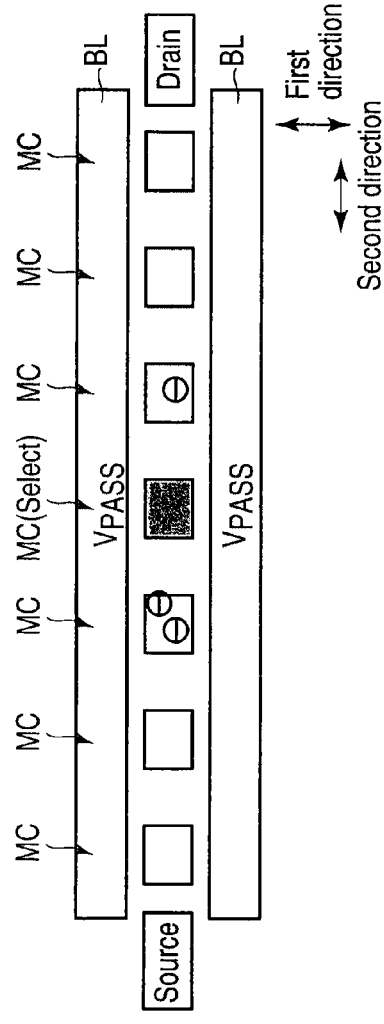
Figure 51B:
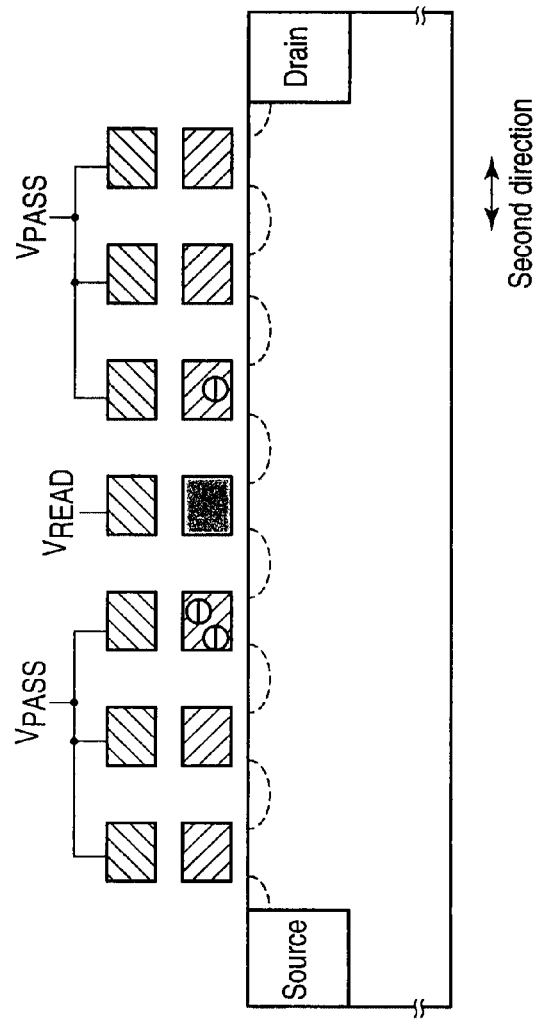

FIGS. 50A and 51A are plan views showing the NAND string, and FIGS. 50B and 51B are cross-sectional views showing the NAND string taken along a second direction.

Memory cells MC, . . . are connected in series between the source region (Source) and the drain region (Drain). Although diffusion layers of memory cell MC, . . . are not provided in a semiconductor substrate in this example, diffusion layers (dotted line) of the memory cells MC, . . . may be formed in the semiconductor substrate.

When memory cell MC (Select) in the center of the NAND string is selected, VREAD is applied to word line WL (Select) above selected memory cell MC (Select) and VPASS is applied to other word lines WL.

Memory cell MC (Select) existing in the center of the NAND string in FIGS. 50A and 50B and memory cell MC (Select) existing in the center in FIGS. 51A and 51B are commonly connected to word line WL (Select) as is clear from FIG. 47. That is, in the multi-dot flash memory according to the present invention, the data of the memory cells (for one or more pages, for example) can be read at the same time similar to the NAND flash memory.

FIGS. 52A and 52B are a modification of the reading operation.

This modification has characteristics in value of VPASS and VREAD. VPASS is a power supply potential VDD and VREAD is set to −VDD/2. Others are the same as those in FIGS. 47 to 51.

FIG. 53 is a modification of the NAND string.

This modification has characteristics in the number of memory cells composing the NAND string. The number of cells in the NAND string is not necessarily five, as a matter of course. This is only one example. Others are the same as those in FIGS. 47 to 51.

In this example, when it is assumed that the width of word line WL is constant, the interference among the word lines can be reduced by increasing the pitch between word lines WL, so that read disturb can be prevented.

5. Initial Setting

As described above, the even-odd variation of the floating gate of the multi-dot flash memory depends on the symmetry of the shape of the side-wall insulating film in the side-wall spacer lithography process, and wafer in-plane variation in the etching process and the like.

Although the even-odd variation can be anticipated, in order to improve the reliability of the product, it is preferable that the even-odd variation is previously tested in a test step, and it is determined which bit line is used as the charge serving-only line and which bit line is used as the charge receiving-only line.

A description will be made of a constitution and a test method therefore hereinafter.

(1) Constitution

First, the cell structure according to the present invention will be illustrated in order to make the following description clearly understandable.

FIGS. 54A and 54B show the illustration of the cell structure according to the present invention.

FIG. 54A is a cross-sectional view taken along a first direction in which the word line extends, and FIG. 54B is a cross-sectional view taken along a second direction in which the bit line extends. An equivalent circuit of the memory cell of the multi-dot flash memory according to the present invention is created from this illustration as shown in FIG. 55.

FIG. 56 is a circuit diagram of the memory cell array of the multi-dot flash memory according to the present invention drawn using the equivalent circuit shown in FIG. 55.

In this example, (N+1) word lines WL0, WL1, . . . WLN, and (N+1) bit lines BL0, BL1, . . . BLN are arranged in the memory cell array. N data lines DL1, DL2, . . . DLN electrically connect drain regions at one ends of the N NAND strings to a sense amplifier (S/A).

As described above, the writing/erasing in the multi-dot flash memory according to the present invention are performed by random access. In addition, it is characterized in that the reading is performed for the memory cells connected to one word line WLi at the same time, and the memory cells in the NAND string are sequentially accessed one by one.

FIG. 57 shows a system configuration for an initial setting.

Memory cell array MA has the configuration shown in FIG. 56.

(N+1) word lines WL0, WL1, . . . WLN are connected to word line decoder 21, and (N+1) bit lines BL0, BL1, . . . BLN are connected to bit line decoder 22. N data lines DL1, DL2, . . . DLN are connected to sense amplifier S/A.

Flag F shows a test result of the even-odd variation and is composed of a non-volatile memory (E-fuse, for example). At the time of normal operation, flag F is latched to latch circuit L.

Control circuit C executes the writing/erasing operations by setting one of even-numbered bit lines BL0, BL2, . . . and odd-numbered bit lines BL1, BL3, . . . as the charge serving-only line, and the other thereof as the charge receiving-only line, based on the flag data latched to latch circuit L.

For example, control circuit C is provided with first and second writing/erasing algorithms, and selects one of those based on the flag data. Thus, control circuit C controls the movement of the charge from the charge serving-only line to the floating gate and the movement of the charge from the floating gate to the charge receiving-only line using one of the first and second writing/erasing algorithms.

Here, it is to be noted that the odd-numbered bit lines are used as the charge serving-only lines and the even-numbered bit lines are used as the charge receiving-only lines in the first writing/erasing algorithm, and the odd-numbered bit lines are used as the charge receiving-only lines and the even-numbered bit lines are used as the charge serving-only lines in the second writing/erasing algorithm, for example.

(2) Test Method

First, the even-odd variation and the even-odd difference are tested in a test step before product shipment.

A test method is performed by measuring signal delay times of the bit lines in the test block. Here, the test block means an entire or a part of the memory cell array. In addition, the test is performed with respect to each chip.

Figure 58:
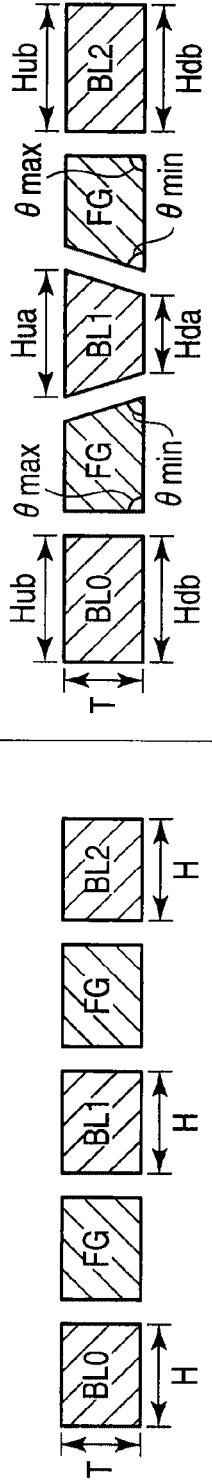
FIG. 58 is a relationship between an even-odd variation and a delay time.

FIG. 58 is a view to explain the reason why the even-odd variation and the even-odd difference are measured by use of the signal delay time of the bit line.

It is assumed that the widths of bit lines BL0, BL1, and BL2 are all H, and their heights are all T when there is no even-odd variation (even-odd difference). In this case, since they have the same cross-sectional shape (resistance value), their signal delay times tBL0, tBL1, and tBL2 are all the same.

When there is an even-odd variation (even-odd difference), the widths of bit lines BL0, BL1, and BL2 vary periodically. That is, the width of bit lines BL0 and BL2 (=(Hub+Hdb)/2) are larger than the width of bit line BL1 (=(Hua+Hda)/2).

This means that the cross-sectional areas of bit lines BL0 and BL2 are larger than the cross-sectional area of bit line BL1, so that the resistance values of bit lines BL0 and BL2 are smaller than the resistance value of bit line BL1.

Consequently, since (Hub+Hdb)/2>(Hua+Hda)/2, signal delay time tBL1 of bit line BL1 is longer than signal delay times tBL0 and tBL2 of bit lines BL0 and BL2.

Therefore, the even-odd variation is verified by measuring the signal delay times of the bit lines.

Figure 59:
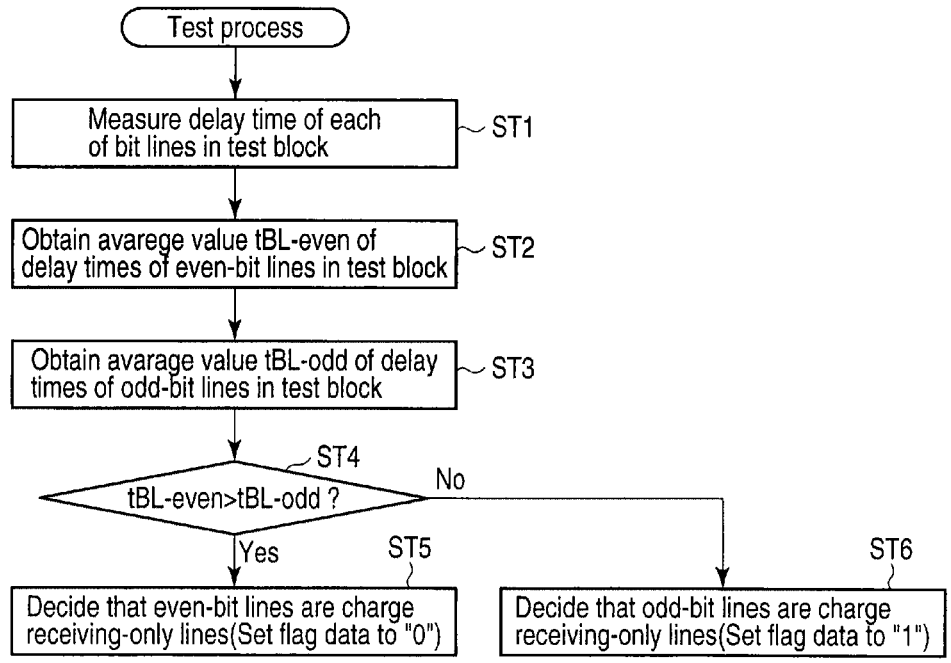
FIG. 59 is a flow chart showing a test process.

FIG. 59 is a flow chart showing steps of testing the even-odd variation.

First, each of the signal delay times of the bit lines in the test block is measured (step ST1).

Then, average value tBL-even of the signal delay times of the even-numbered bit lines in the test block is obtained (step ST2). Then, an average value tBL-odd of the signal delay times of the odd-numbered bit lines in the test block is obtained (step ST3).

The order of step ST2 and step ST3 may be reversed or these steps may be performed at the same time.

Then, average value tBL-even of the signal delay times of the even-numbered bit lines is compared with average value tBL-odd of the signal delay times of the odd-numbered bit lines (step ST4).

When average value tBL-even of the signal delay times of the even-numbered bit lines is greater than the average value tBL-odd of the signal delay times of the odd-numbered bit lines, the even-numbered bit lines are set to the charge receiving-only lines. At this time, the value of the flag is set to "0", for example (step ST5).

When average value tBL-odd of the signal delay times of the odd-numbered bit lines is greater than the average value tBL-even of the signal delay times of the even-numbered bit lines, the odd-numbered bit lines are set to the charge receiving-only lines. At this time, the value of the flag is set to "1", for example (step ST6).

Thus, the step of testing the even-odd variation is completed.

Figure 60:
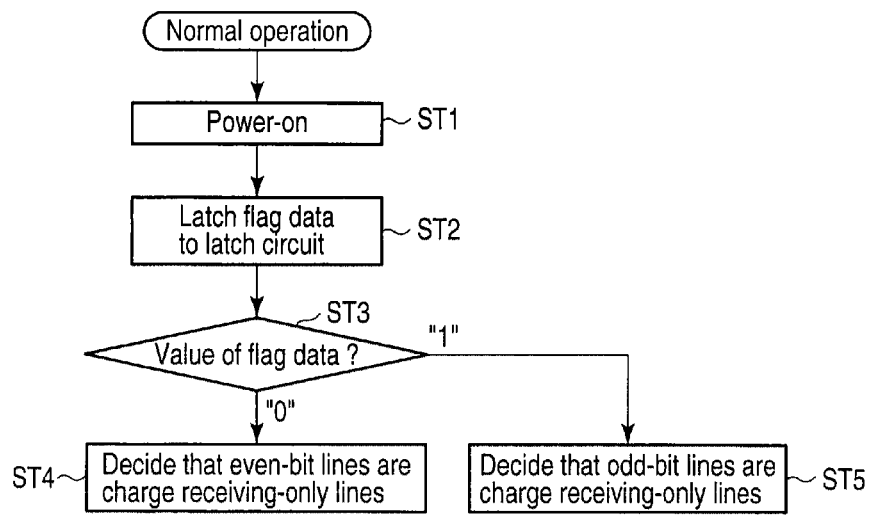
FIG. 60 is a flow chart showing a normal operation.

FIG. 60 shows an operation at the time of normal operation to trim the even-odd variation.

First, when the power supply potential is supplied to the chip by turning on the power, the flag data is latched to the latch circuit (steps ST1, ST2).

When the value of the flag is "0", the writing/erasing operations are performed using the writing/erasing algorithm in which the even-numbered bit lines are set to the charge receiving-only lines and the odd-numbered bit lines are set to charge serving-only lines (steps ST3, ST4).

When the value of the flag is "1", the writing/erasing operations are performed using the writing/erasing algorithm in which the odd-numbered bit lines are set to the charge receiving-only lines and the even-numbered bit lines are set to charge serving-only lines (steps ST3, ST5).

Thus, by storing the test result in the flag, the writing/erasing operations can be performed using the writing/erasing algorithms in which the even-odd variation is taken into consideration, based on the flag data, at the time of normal operation.

(3) Others

In the test step, bit line (charge serving-only line) BLs and bit line (charge receiving-only line) BLr are determined based on the difference in the signal delay time.

Here, it is to be noted that the signal delay time of bit line BLs is different from that of bit line BLr.

Therefore, it is necessary to set an operation timing based on the longer signal delay time of bit line BLr in order to prevent an erroneous operation at the time of normal operation.

Figure 61:
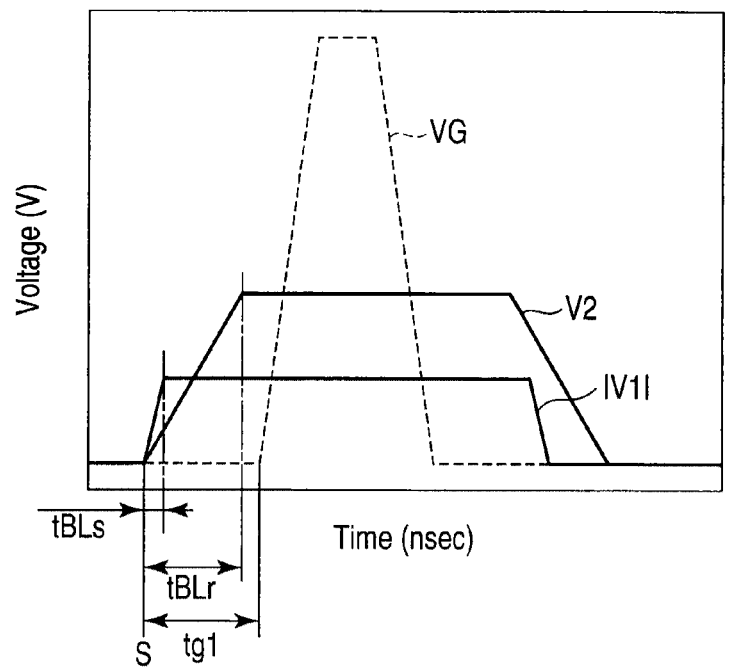
FIGS. 61 and 62 are diagrams, each showing a timing that a gate potential is supplied.

FIG. 61 shows an example of the bias conditions at the time of writing/erasing.

In this drawing, VG designates a gate potential, V1 designates a potential of bit line (charge serving-only line) BLs, and V2 designates a potential of bit line (charge receiving-only line) BLr.

The resistance value of bit line BLr is greater than that of bit line BLs. In addition, signal delay time tBLr of bit line BLr is longer than signal delay time tBLs of bit line BLs.

Therefore, gate potential VG is raised to VG after time tg1 has passed from point S, that is, after tBLs of bit line BLs has become stable at V1 and after tBLr of bit line BLr has become stable at V2.

In addition, since signal delay time tBLr of bit line BLr is longer, the timing is preferably set such that the potential of bit line BLr is not changed at the time of writing/erasing.

Figure 62:
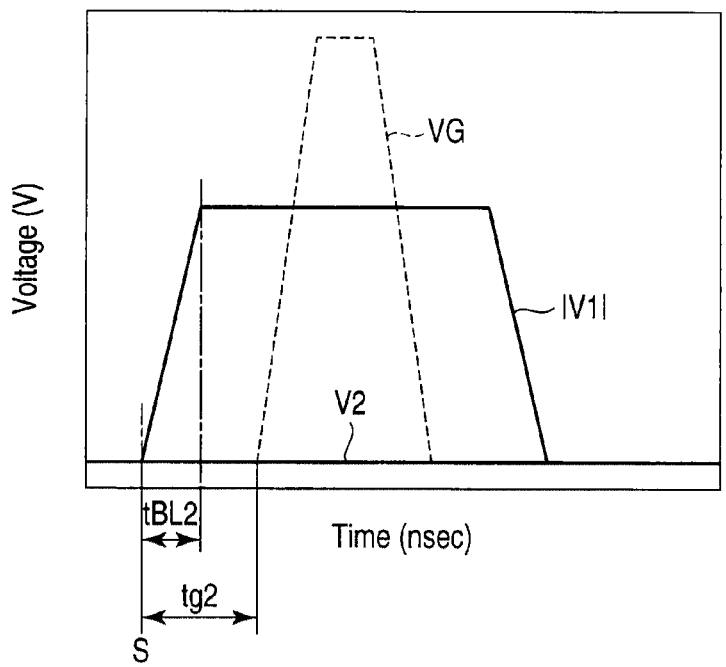

FIG. 62 shows an example of the bias conditions at the time of writing/erasing.

In this drawing, VG designates a gate potential, V1 designates a potential of bit line (charge serving-only line) BLs, V2 designates a potential of bit line (charge receiving-only line) BLr.

In this example, since the writing/erasing are performed without changing the potential of bit line BLr at the time of writing/erasing, the problem that the writing/erasing times are increased due to the long signal delay time of bit line BLr is solved.

In this case, gate potential VG is raised to VG after time tg2 has passed from point S, that is, after tBLs of bit line BLs has become stable at V1.

Time tg2 in this drawing can be shorter than time tg1 in FIG. 61.

As described above, the algorithm to shorten the writing/erasing time can be stored and selected. Although the bit line having the greater average value of the signal delay time is set to the charge receiving-only line, and the bit line having the smaller average value of the signal delay time is set to the charge serving-only line in the above example, they may be reversed depending on the writing/erasing control algorithm. The point is to prevent the signal delay time from increasing by keeping the potential of the bit line having the narrow width unchanged, for example.

6. Three-Dimensional Multi-Dot Flash Memory

The multi-dot flash memory according to the example of the present invention can be three-dimensional.

Figure 63:
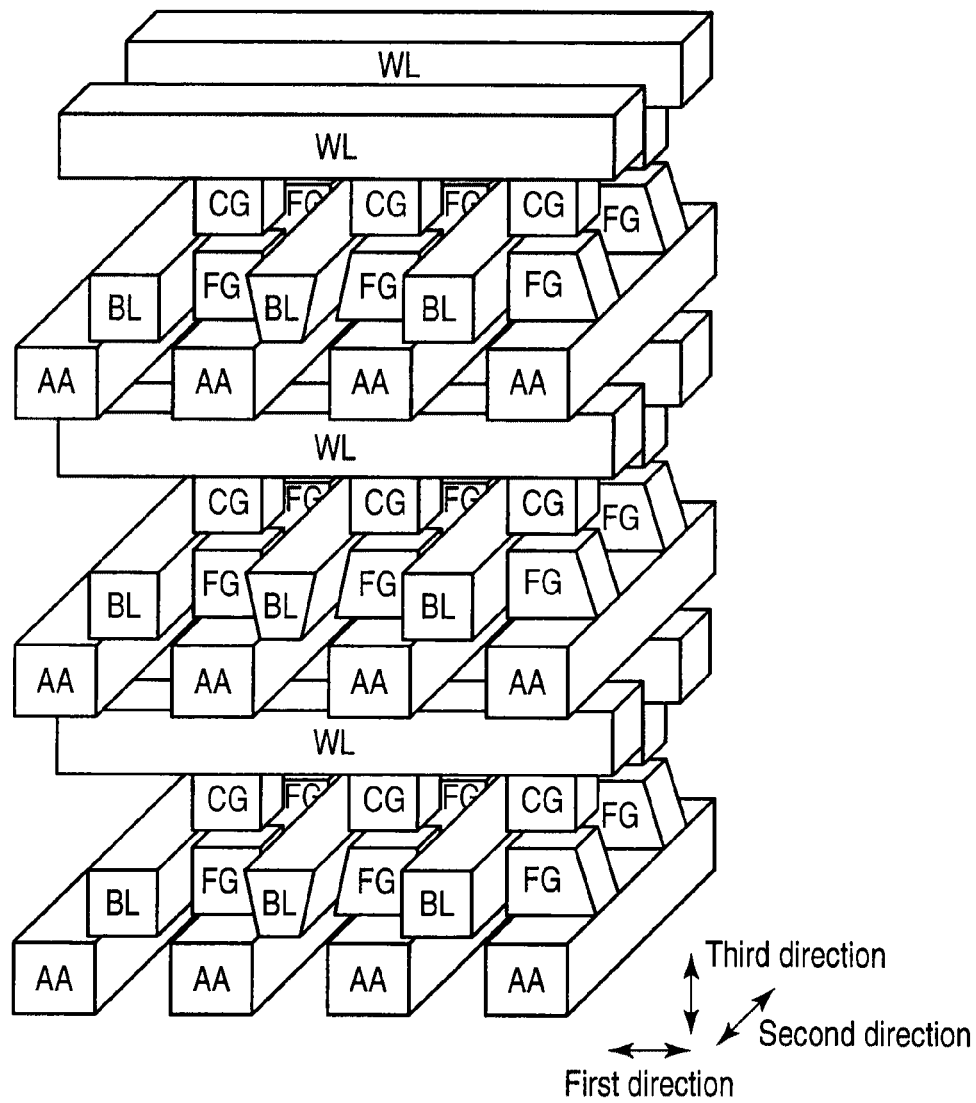
FIGS. 63 and 64 are diagrams, each showing a three-dimensional multi-dot flash memory.

FIG. 63 shows a three-dimensional multi-dot flash memory.

In this drawing, the memory cell arrays shown in FIG. 13 are stacked in a third direction vertical to the surface of a semiconductor substrate.

In order to implement such structure, an active area has to be composed of a semiconductor layer of an SOI substrate. The semiconductor layer is a polycrystalline silicon layer or a monocrystalline silicon layer produced by recrystallizing a polycrystalline silicon layer.

More specifically, the first lowest memory cell array is formed on the SOI substrate, a first insulating film is formed thereon, and a semiconductor layer serving as an active area of a second memory cell array is formed on the first insulating layer.

In addition, third and following memory cell arrays may be formed in the same way as the second memory cell array.

Thus, the multi-dot flash memory can be three-dimensional, and the memory capacity can be further increased.

Figure 64:
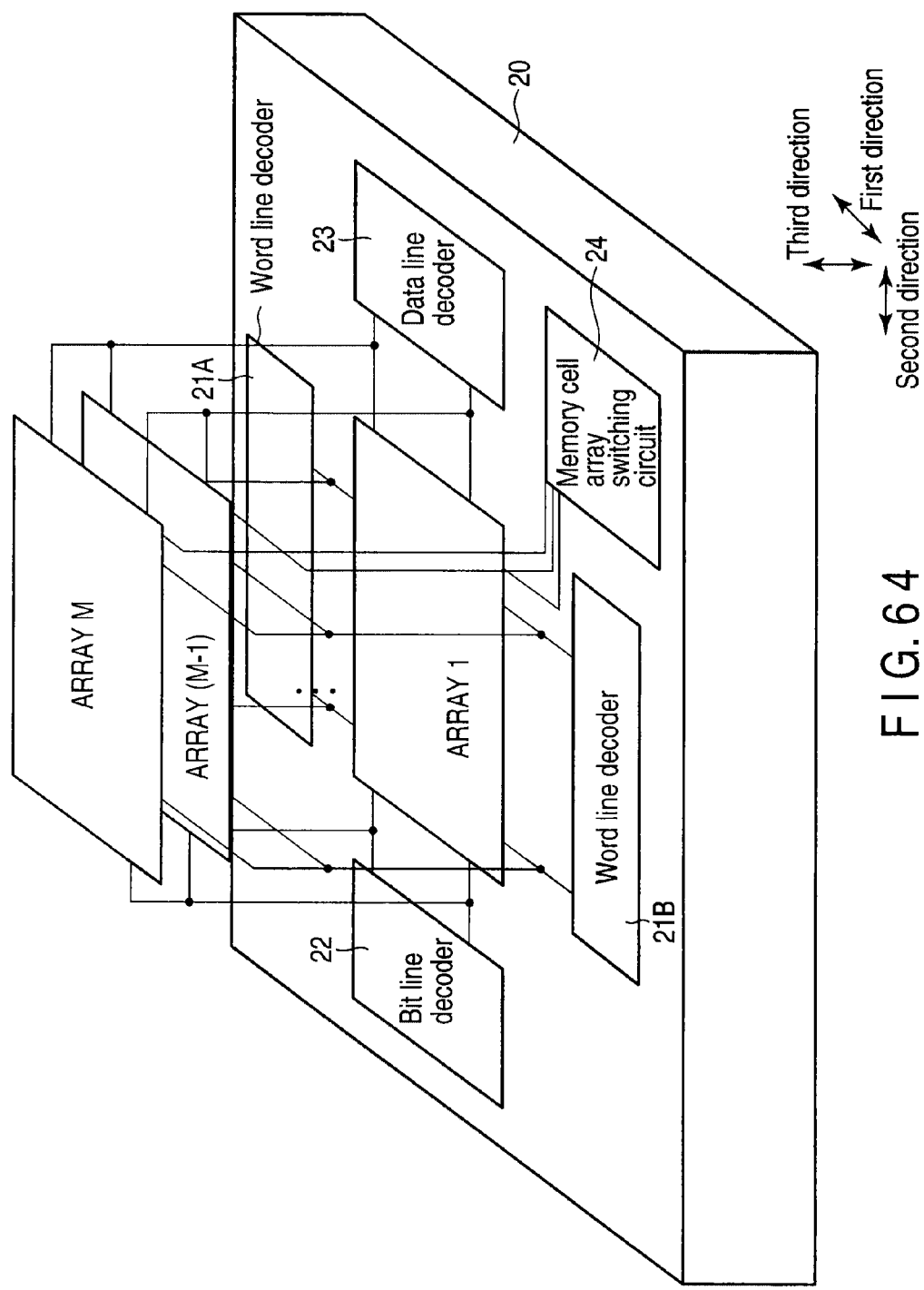

FIG. 64 shows an example of peripheral circuits which drive the memory shown in FIG. 63.

Stacked memory cell arrays ARRAY 1, . . . ARRAY M−1, and ARRAY M are arranged on semiconductor substrate (SOI substrate, for example) 20. The structure of memory cell arrays ARRAY 1, . . . ARRAY M−1, and ARRAY M is the same as that shown in FIG. 63.

In addition, as peripheral circuits, word line decoders 21A and 21B, bit line decoder 22, data line decoder 23, and memory cell array switching circuit (Layer Exchanger) 24 are arranged on semiconductor substrate 20.

Word line decoder 21A is arranged at one end of memory cell arrays ARRAY 1, . . . ARRAY M−1, and ARRAY M in a first direction, and word line decoder 21B is arranged on the other end of memory cell arrays ARRAY 1, . . . ARRAY M−1, and ARRAY M in the first direction. Word line decoders 21A and 21B drive the word line at the time of writing, erasing, and reading.

Bit line decoder 22 is arranged at one end of memory cell arrays ARRAY 1, . . . ARRAY M−1, and ARRAY M in a second direction, and data line decoder 23 is arranged on the other end of memory cell arrays ARRAY 1, . . . ARRAY M−1, and ARRAY M in the second direction.

Bit line decoder 22 drives the bit line at the time of writing/erasing. Data line decoder 23 drives the data line at the time of reading.

Memory cell array switching circuit 24 is connected to each of memory cell arrays ARRAY 1, . . . ARRAY M−1, and ARRAY M.

FIG. 65 shows one memory cell array shown in FIG. 64.

Layer select gate transistors LSG (Layer SG) to select memory cell array ARRAY j are connected between word lines WL in memory cell array ARRAY j and word line decoders 21A and 21B, between bit lines BL in memory cell array ARRAY j and bit line decoder 22, and between drain regions of a NAND string in memory cell array ARRAY j and data line decoder 23.

Layer select gate transistor LSG is turned on and off by memory cell array switching circuit 24.

When memory cell array ARRAY j is selected, layer select gate transistor LSG is turned on, and when memory cell array ARRAY j is not selected, layer select gate transistor LSG is turned off.

For example, one or more memory cell arrays of memory cell arrays ARRAY 1, . . . ARRAY M−1, and ARRAY M stacked on semiconductor substrate 20 shown in FIG. 64 are selected based on each mode of the writing, erasing, and reading.

Figure 66:
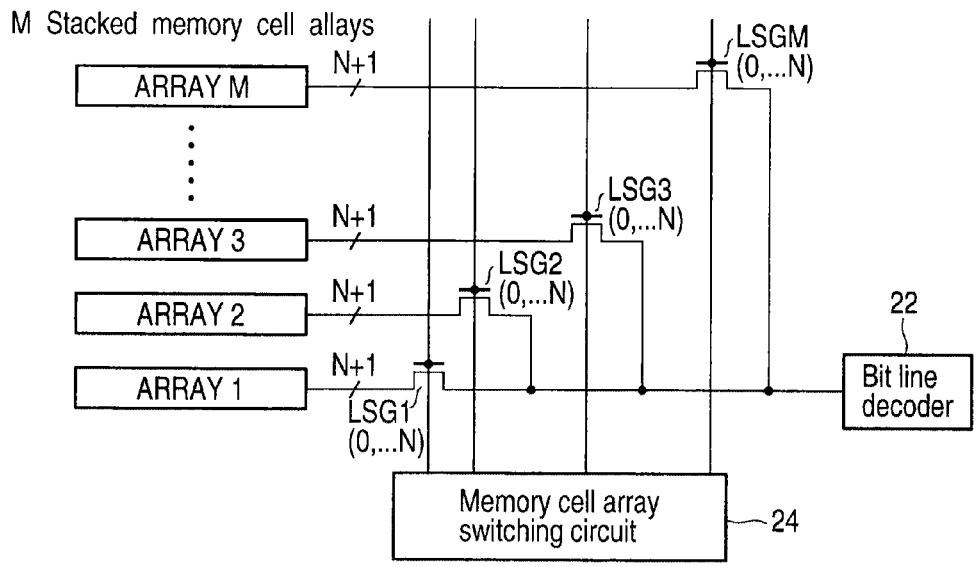
FIGS. 66 to 69 are diagrams, each showing a method of switching memory cell arrays.

FIG. 66 shows the layer select gate transistor between the bit line decoder and the memory cell arrays.

Each of the memory cell arrays ARRAY 1, . . . ARRAY M−1, and ARRAY M has (N+1) bit line as shown in FIGS. 56 and 65. LSG M (0, . . . N) means (N+1) layer select gate transistors in Mth memory cell array ARRAY M.

In addition, it is assumed that M is a natural number of 2 or more, and N is a natural number.

Figure 67:
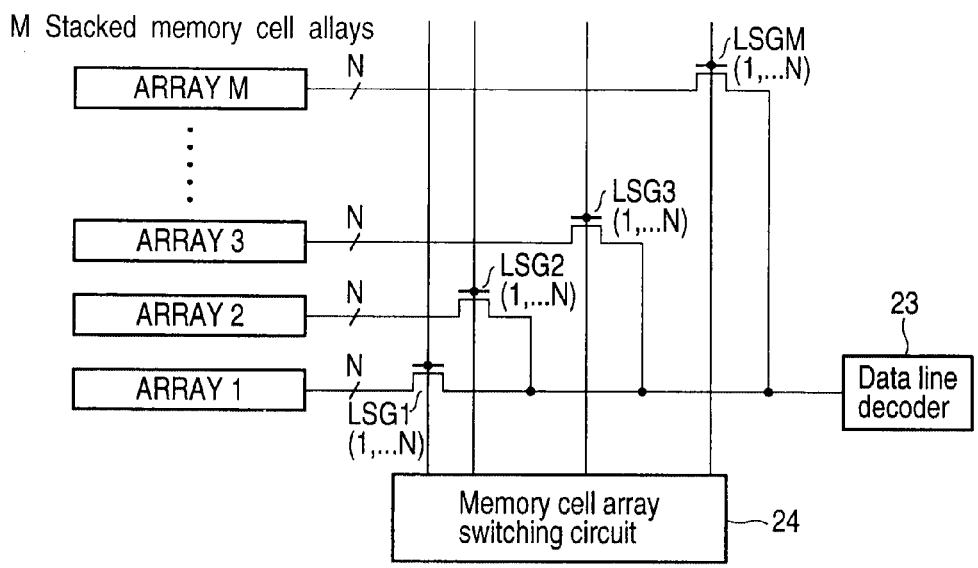

FIG. 67 shows the layer select gate transistors between the data line decoder and the memory cell arrays.

Each of memory cell arrays ARRAY 1, . . . ARRAY M−1, and ARRAY M has N data lines as shown in FIGS. 56 and 65.

LSG M (1, . . . N) means N layer select gate transistors in Mth memory cell array ARRAY M.

In addition, it is assumed that M is a natural number of 2 or more, and N is a natural number.

Figure 68:
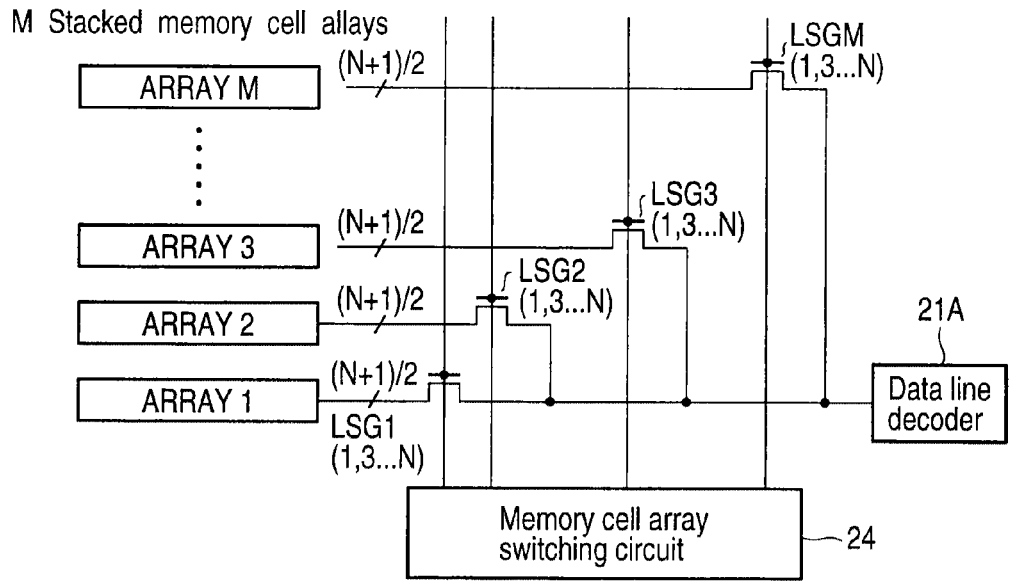
Figure 69:
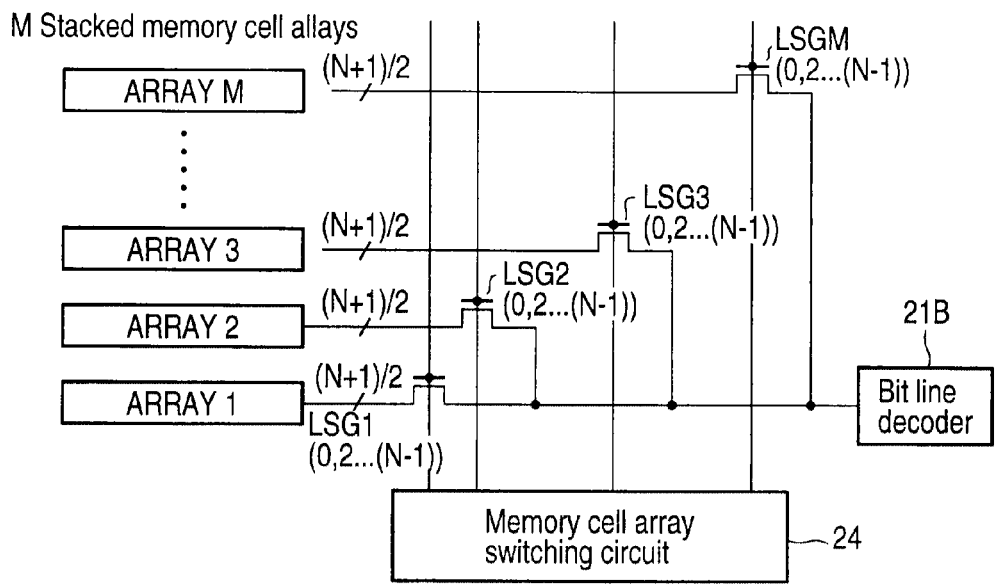

FIGS. 68 and 69 show the layer select gate transistors between the word line decoder and the memory cell arrays.

Each of memory cell arrays ARRAY 1, . . . ARRAY M−1, and ARRAY M has (N+1) word lines as shown in FIGS. 56 and 65. In addition, the (N+1) word lines are divided into two as shown in FIG. 65, and one is connected to word line decoder 21A and the other is connected to word line decoder 21B. LSG M (1, 3, . . . N) in FIG. 68 means [(N+1)/2] layer select gate transistors connected to word line decoder 21A, in Mth memory cell array ARRAY M. In addition, LSG M (0, 2, . . . N−1) in FIG. 69 means [(N+1)/2] layer select gate transistors connected to word line decoder 21B, in Mth memory cell array ARRAY M.

In addition, it is assumed that M is a natural number of 2 or more, and N is a natural number.

7. Method of Manufacturing

A method of manufacturing the multi-dot flash memory according to the example of the present invention will be described.

The method of manufacturing that will be described here implements the layout shown in FIG. 49, that is, the structure in which the memory cell array is divided into the blocks and the select gate transistor is connected to the NAND string.

FIGS. 70A to 70I show a method of manufacturing the multi-dot flash memory.

Figure 70:
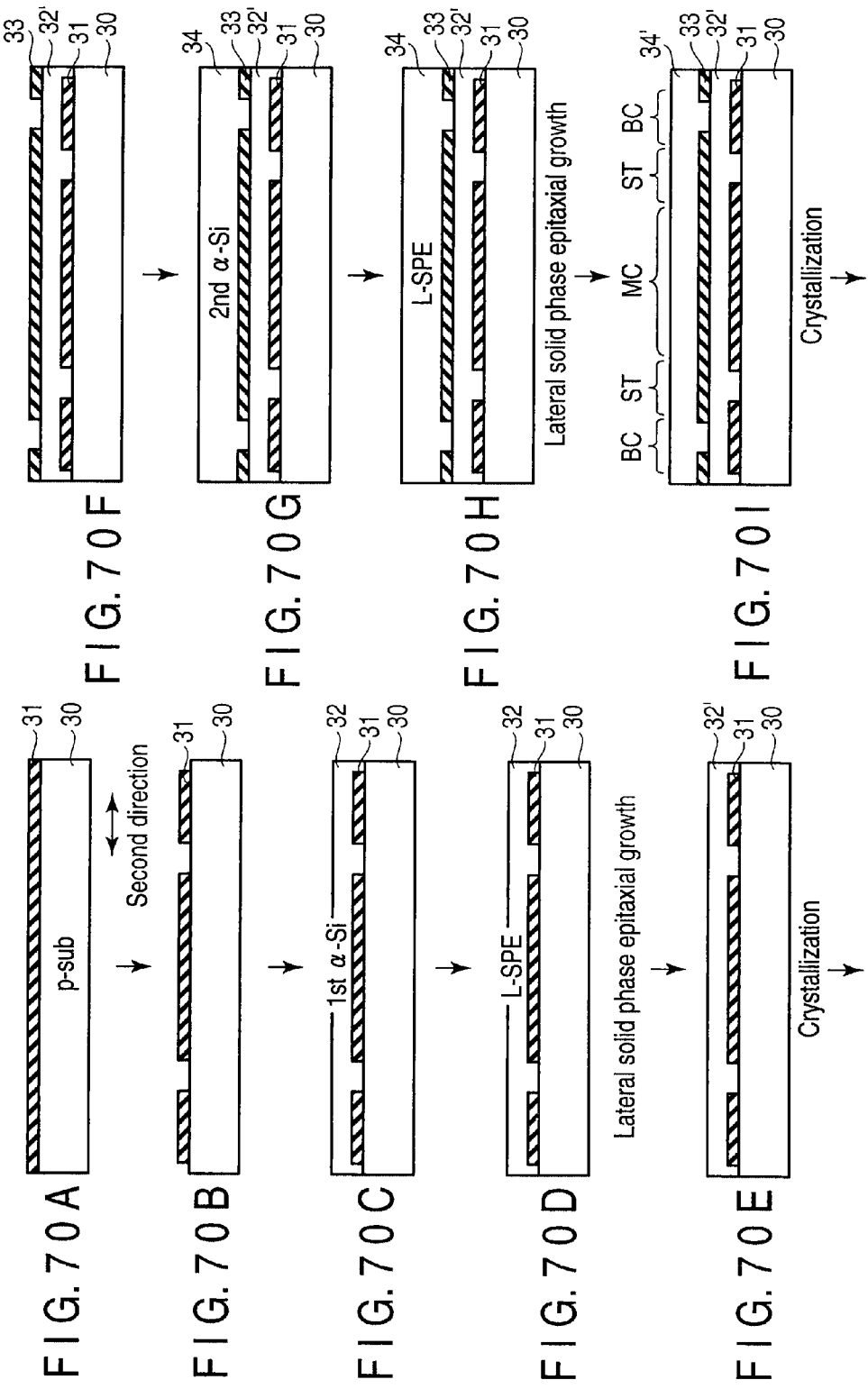
FIGS. 70A to 70I are diagrams, each showing a method of manufacturing a double SOI substrate.

First, as shown in FIG. 70A, first oxide film 31 is formed on P-type silicon substrate (P-sub) 30. In addition, as shown in FIG. 70B, an opening is formed in first oxide film 31 at a region in which a select gate transistor is formed.

Then, as shown in FIG. 70C, first amorphous silicon (1st a-Si) 32 is deposited on P-type silicon substrate 30 and first oxide film 31, and as shown in FIG. 70D, first amorphous silicon 32 is grown laterally by solid-phase epitaxy (L-SPE).

In addition, as shown in FIG. 70E, first amorphous silicon 32 is crystallized and silicon film 32' is formed. As shown in FIG. 70F, second oxide film 33 is formed on silicon film 32' and an opening is formed in second oxide film 33 at a region in which a bit line contact is formed.

Then, as shown in FIG. 70G, second amorphous silicon (2nd a-Si) 34 is deposited on silicon film 32' and second oxide film 33, and as shown in FIG. 70H, second amorphous silicon 34 is grown laterally by solid-phase epitaxy (L-SPE). In addition, as shown in FIG. 70I, the second amorphous silicon is crystallized and silicon film 34' is formed.

Here, in FIG. 70I, "BC" designates a region in which a bit line contact is formed, "ST" designates a region in which a select gate transistor is formed, and "MC" designates a region in which a memory cell is formed.

The structure (double SOI structure) in which two silicon films 32' and 34' are stacked with the insulating film interposed therebetween is completed through the above steps.

The multi-dot flash memory according to the present invention is formed using this double SOI structure.

Figure 71:
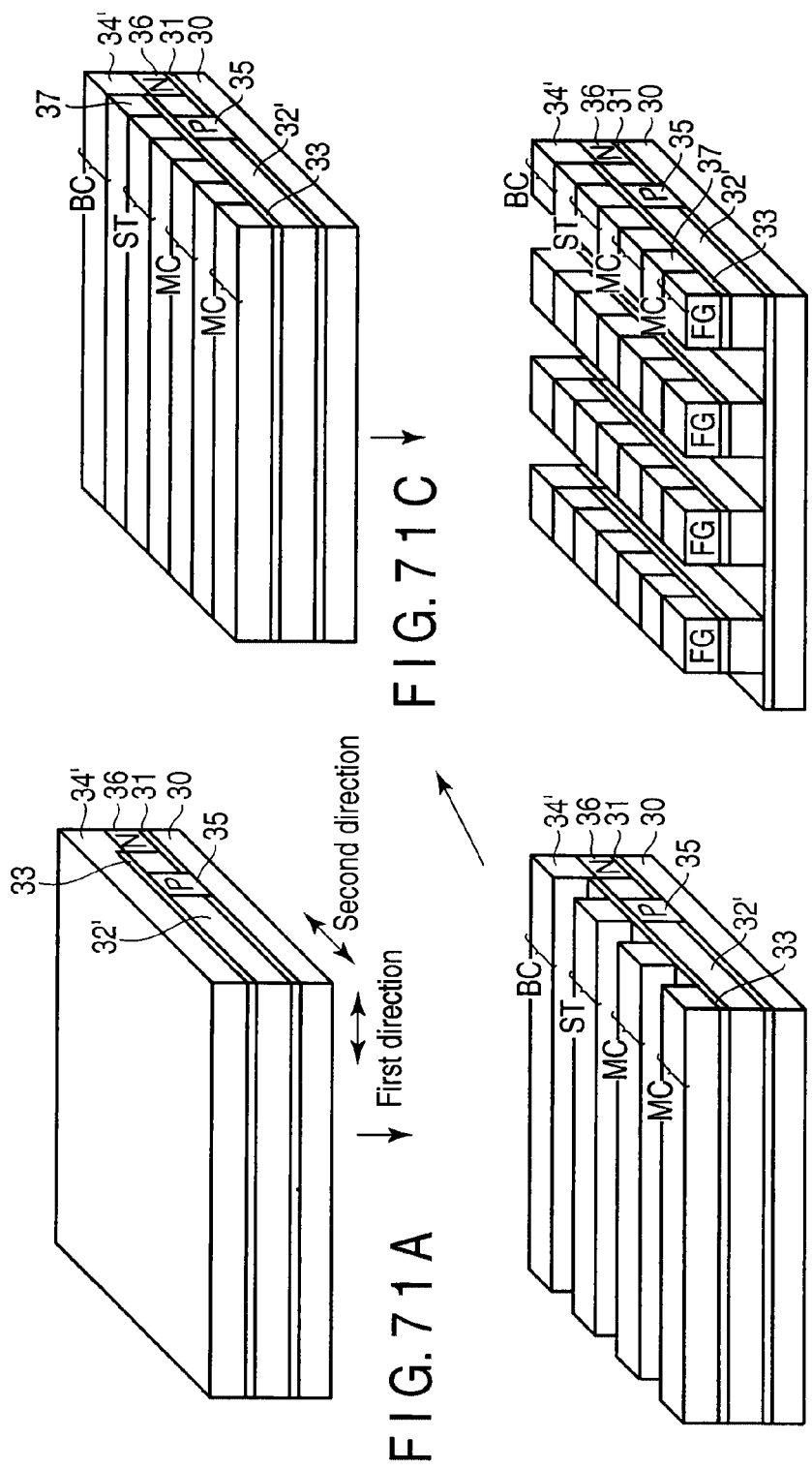
FIGS. 71A to 71D and 72A to 72F are diagrams, each showing a method of manufacturing a device of a present invention.

FIG. 71A is a birds-eye view showing a peripheral part of the bit line contact in the double SOI structure shown in FIG. 70I.

FIG. 71A is different from FIG. 70I in that P-type diffusion layer 35 is provided in silicon film 32' at a region in which the select gate transistor is formed, and N-type diffusion layer 36 is provided in silicon film 32' at a region in which the bit line contact is formed.

P-type diffusion layer 35 becomes a channel region of the select gate transistor, and N-type diffusion layer 36 becomes a drain diffusion layer in a NAND string. P-type diffusion layer 35 and N-type diffusion layer 36 are formed by ion implantation after forming silicon film 32'.

Then, as shown in FIG. 71B, a line-and-space patterned photoresist is formed and silicon film 34' is etched using the photoresist as a mask and line-and-space patterned silicon film 34' extending in a first direction is formed. Then, the photoresist is removed.

Then, as shown in FIG. 71C, the space between line-and-space patterned silicon film 34' is filled with insulating film 37 by CVD method, and insulating film 37 is polished until the upper surface of insulating film 37 becomes the same level as the upper surface of silicon film 34' by CMP method.

In addition, as shown in FIG. 71D, a fine line-and-space hard mask pattern is formed by the side-wall spacer lithography process, and insulating film 37, silicon film 34', second oxide film 33, and silicon film 32' are sequentially etched using the hard mask pattern as a mask.

As a result, line-and-space patterned active areas AA, ... are composed of silicon film 32' and extend in a second direction. In addition, floating gates FG, ... are formed above active areas AA, ... with second oxide film (gate insulating film) 33 interposed therebetween.

N-type diffusion layer 36 in silicon film 32' is in contact with silicon film 34' in bit line contact region BC.

After the process in FIG. 71D, an even-odd variation is generated in the shape of floating gate FG through the side-wall spacer lithography process.

However, the even-odd variation is not shown in the drawing to describe the method of manufacturing mainly and eliminate the complication in the drawing.

The actual shape of floating gate FG is as shown in FIG. 13.

Figure 72:
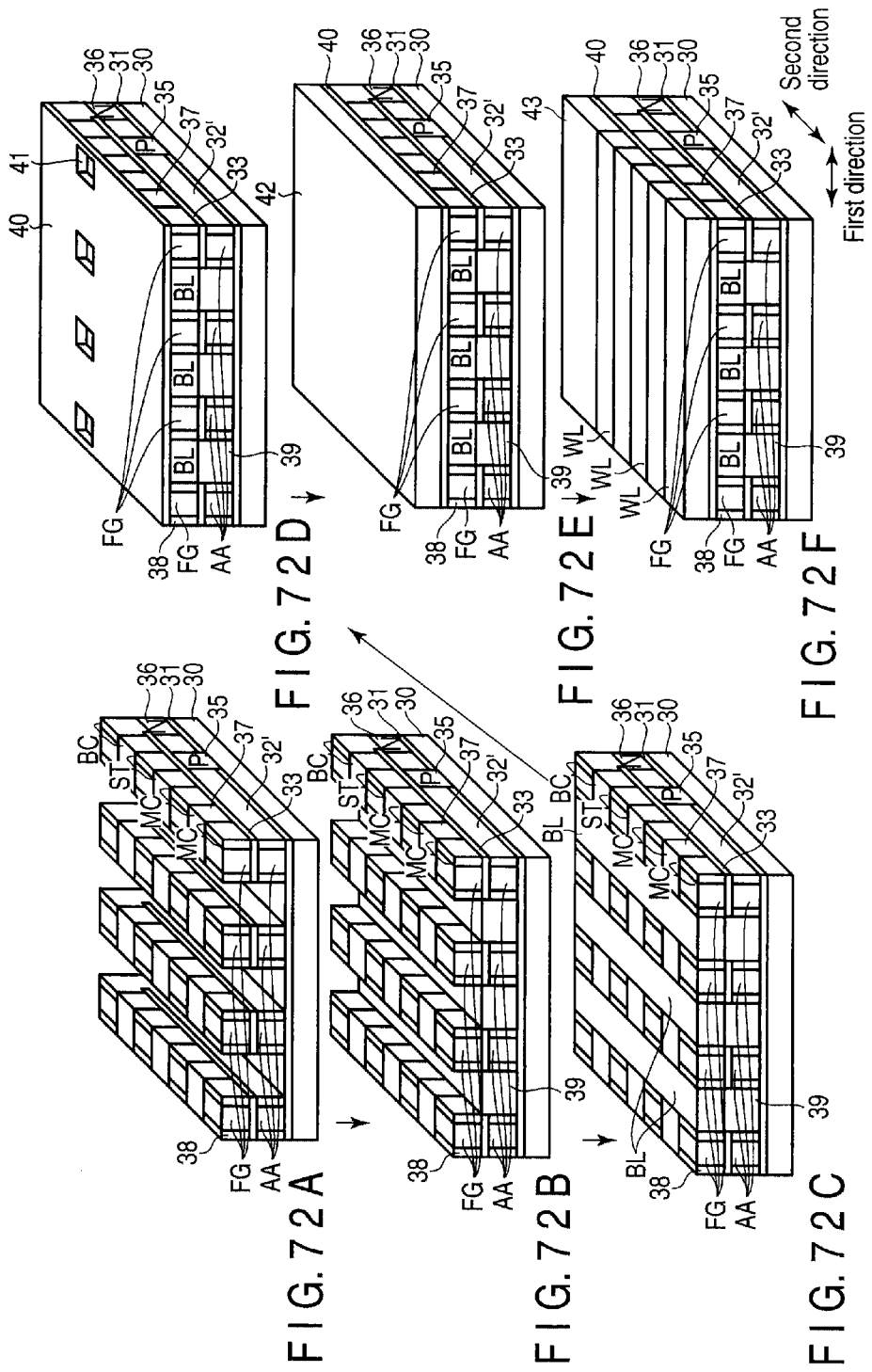

Then, as shown in FIG. 72A, side-wall thermally-oxidized film 38 is formed on the side surfaces of active areas AA, ... and floating gates FG, ... by a thermal oxidization method. Side-wall oxide film 38 becomes a tunnel insulating film that is used at the time of writing or erasing.

In addition, as shown in FIG. 72B, the spaces between active areas AA, ... are filled with insulating film 39.

Then, as shown in FIG. 72C, the spaces between floating gates FG, ... are filled with a conductive material by CVD method, and the conductive material is polished until the upper surface of the conductive material becomes the same level as the upper surface of floating gates FG, ... by CMP method.

As a result, bit lines BL extending in a second direction is formed between floating gates FG, .....

Then, as shown in FIG. 72D, interelectrode insulating film 40 is formed on floating gates FG, ... and bit lines BL, ..... In addition, a part of interelectrode insulating film 40 is removed at a region in which a select gate transistor is formed and opening 41 is formed.

Then, as shown in FIG. 72E, conductive material 42 is formed on interelectrode insulating film 40 by CVD method.

In addition, as shown in FIG. 72F, a line-and-space patterned photoresist is formed and conductive material 42 shown in FIG. 72E is etched using the photoresist as a mask, and line-and-space patterned word lines WL, ... extending in a first direction is formed. Then, the photoresist is removed.

In addition, the spaces between word lines WL, ... are filled with insulating film 43 by CVD method, and insulating film 43 is polished until the upper surface of insulating film 43 becomes the same level as the upper surface of word lines WL, ... by CMP method.

Figure 73:
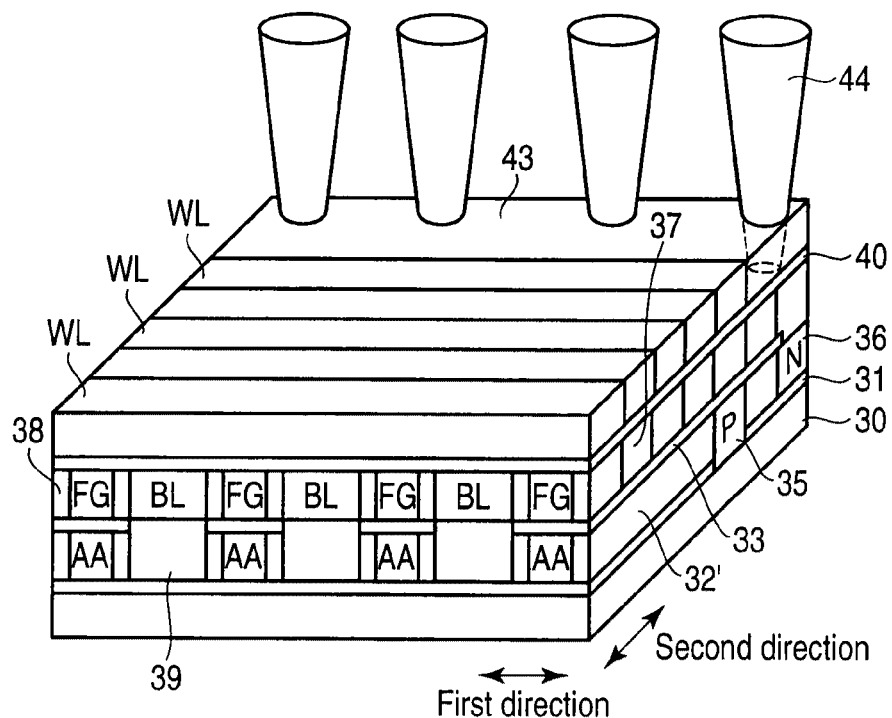
FIGS. 73 and 74 are diagrams, each showing a device structure by a method of a present invention.

Finally, as shown in FIG. 73, an interlayer insulating film (not shown) is formed on word lines WL, ... and insulating film 43, and bit line contact 44 that is electrically connected to N-type diffusion layer (drain diffusion layer) 36 through silicon film 34' is formed.

Here, bit line contact 44 is electrically connected to conductive line CL shown in FIG. 49, for example. The term "bit line contact" is for the NAND flash memory, and not for the bit line of the multi-dot flash memory according to the present invention.

Figure 74:
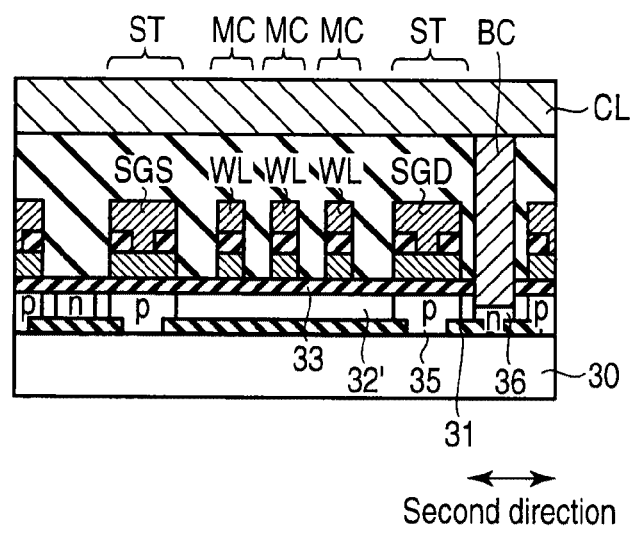

FIG. 74 shows a cross-sectional view of a device structure completed by the above-described method of manufacturing.

As is clear from this drawing, the cross section along a second direction (direction of the bit line) of the multi-dot flash memory in the present invention is almost the same as that of the NAND flash memory. That is, development cost can be lowered by applying the technology of manufacturing the NAND flash memory thereto.

In addition, the materials of the insulating film and conductive film can be appropriately selected in the above-described method of manufacturing based on a device specification. In addition, a nitride film and an oxynitride film may be used instead of the oxide film.

In addition, the structure can be modified such that a polysilicon layer serving as the control gate is formed just under the word line, or the word lines are formed into a three-dimensional houndstooth check.

In addition, the floating gate may not be the silicon dot. The floating gate may be formed into a dot shape with silicide, metal, and nonmetal. As for the size of the dot, as long as it is 30 nm×30 nm×30 nm or less, the multi-dot flash memory according to the principle of the present invention can be implemented.

Furthermore, the size of the floating gate is preferably 20 nm×20 nm×20 nm or less when the monoelectron effect is used. With the monoelectron effect, the multi-dot flash memory can have high variation resistance.

However, even when the size is larger than 20 nm×20 nm×20 nm and the monoelectron effect cannot be used, the new architecture (FIGS. 56 and 65) proposed by the present invention can be implemented.

The select gate transistor can be omitted, in which case it is preferable that the SOI structure is employed and the thickness of the semiconductor layer on the insulating film is thinner than the depth of the source/drain diffusion layer.

8. Others

The memory cell array architecture according to the present invention is characterized in that one of the two surfaces of the floating gate in the first direction is set to the charge serving-only line and the other thereof is set to the charge receiving-only line, based on the even-odd variation generated in the floating gate.

Although the even-odd variation is representatively generated due to the side-wall spacer lithography, the present invention can be applied to a case where the even-odd variation is generated in the floating gate for some reasons.

9. Conclusion

According to the present invention, the multi-dot flash memory can be implemented as a next-generation file memory with the new memory cell array architecture.

The present invention has excellent merits in industries such as a high-speed random writable file memory, a digital video camera recorder requiring high-speed random writing, a high-speed downloadable mobile terminal, a high-speed downloadable mobile player, a semiconductor memory for a broadcasting device, a drive recorder, a home video, a large-capacity communicating buffer memory, a semiconductor memory for a security camera and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-dot flash memory comprising:
   active areas arranged in a first direction, which extend to a second direction crossed to the first direction, the first and second direction being parallel to a surface of a semiconductor substrate;
   floating gates arranged in the first direction, which are provided above the active areas;
   a word line provided above the floating gates, which extends to the first direction; and
   bit lines provided between the floating gates, which extend to the second direction,
   wherein each of the floating gates has two side surfaces in the first direction, shapes of the two side surfaces are different from each other, and shapes of the facing surfaces of the floating gates which are adjacent to each other in the first direction are symmetrical,
   wherein the bit lines are comprised of charge serving-only lines and charge receiving-only lines which are alternately arranged in the first direction, the charge serving-only lines serve charges to the floating gates, and the charge receiving-only lines receive the charges from the floating gates.

2. The memory according to claim 1,
   wherein taper angles of the two side surfaces is different from each other, the charge serving-only lines are provided at the side surface having the large taper angle, and the charge receiving-only lines are provided at the side surface having the small taper angle.

3. The memory according to claim 2, further comprising:
   a flag which selects one of first and second writing/erasing algorithms; and
   a control circuit which controls a movement of the charges from the charge serving-only lines to the floating gates and a movement of the charges from the floating gates to the charge receiving-only lines by using one of the first and second writing/erasing algorithms,
   wherein the odd-numbered bit line is set to the charge serving-only line and the even-numbered bit line is set to the charge receiving-only line in the first writing/erasing algorithm, and
   the odd-numbered bit line is set to the charge receiving-only line and the even-numbered bit line is set to the charge serving-only line in the second writing/erasing algorithm.

4. The memory according to claim 2,
   wherein a width in the first direction of an upper surface of the charge receiving-only line is larger than a width in the first direction of a lower surface of the charge receiving-only line.

5. The memory according to claim 2,
   wherein a resistance value of the charge receiving-only line is larger than that of the charge serving-only line.

6. The memory according to claim 1,
   wherein widths of the bit lines periodically and alternately change.

7. The memory according to claim 6,
   wherein an injection and an emission of the charges of the floating gate are executed by changing a potential of the bit line having the large width and not changing a potential of the bit line having the small width.

8. The memory according to claim 1, further comprising control gates provided between the floating gates and the world line.

9. The memory according to claim 1, further comprising source/drain diffusion layers provided at ends in the second direction of the active areas.

10. The memory according to claim 9, further comprising data lines above the word line, which are connected to the source/drain diffusion layers and which extend to the second direction.

11. The memory according to claim 1, further comprising an insulating layer which is filled in a trench of the semiconductor substrate,
    wherein the active areas are comprised of areas which are isolated by the insulating layers.

12. The memory according to claim 1, further comprising:
    semiconductor layers which are provided on insulating layer on the semiconductor substrate; and
    insulating layer which is filled between the semiconductor layers,
    wherein the active area are comprised of the semiconductor layers.

13. The memory according to claim 1,
    wherein a movement of the charges from the charge serving-only lines to the floating gates is executed by setting potentials of the charge serving-only lines to potentials which are lower than potentials of the word line and the charge receiving-only lines, and
    a movement of the charges from the floating gates to the charge receiving-only lines is executed by setting potentials of the charge receiving-only lines to potentials which are higher than potentials of the word line and the charge serving-only lines.

14. The memory according to claim 13,
    wherein a potential is supplied to the word line after potentials are supplied to the charge serving-only lines and the charge receiving-only lines.

15. The memory according to claim 1,
    wherein an injection and an emission of the charges of the floating gates are executed in unit of one or more charges.

16. The memory according to claim 15,
    wherein reading is executed by detecting a current flowing the active areas while a read potential is supplied to the word line, and the current is changed by the number of the charges in the floating gate.

17. The memory according to claim 1, further comprising:
    a NAND string provided in each of the active areas, which are comprised of memory cells connected in series; and
    two select gate transistors in each of the active areas, which are connected to ends of the NAND string respectively,
    wherein each of the floating gates comprises one of the memory cells.

18. A method of manufacturing the multi-dot flash memory according to claim 1, wherein the floating gate is formed by:
    forming a conductive layer;
    forming a trench in the conductive layer, which extend to the first direction;
    filling the trench with insulating layer;
    forming a hard mask layer on the conductive layer and the insulating layer;
    forming core layers on the hard mask layer, which extend to the second direction and which are adjacent in the first direction each other;

forming a side wall layers on side walls in the first direction of the core layers;

removing the core layers;

etching the hard mask layer by using the side wall layers as a mask to from hard mask patterns; and etching the conductive layer by using the hard mask patterns to form the floating gates.

* * * * *